United States Patent [19]

Kinugasa et al.

[11] Patent Number: 5,389,834
[45] Date of Patent: Feb. 14, 1995

[54] OUTPUT BUFFER CIRCUIT HAVING A DC DRIVER AND AN AC DRIVER

[75] Inventors: Masanori Kinugasa; Satoshi Nonaka, both of Yokohama; Hiroshi Shigehara, Tokyo, all of Japan

[73] Assignee: Kabushiki Kaisha Toshiba, Kawasaki, Japan

[21] Appl. No.: 975,482

[22] Filed: Nov. 12, 1992

[30] Foreign Application Priority Data

Nov. 15, 1991 [JP] Japan .................. 3-300702

[51] Int. Cl.6 ........................................ H03K 19/0948
[52] U.S. Cl. ...................... 326/21; 326/121; 326/58; 326/110; 327/333
[58] Field of Search ............... 307/443, 451, 475, 446, 307/473

[56] References Cited

U.S. PATENT DOCUMENTS

| | | | |
|---|---|---|---|
| 4,612,466 | 9/1986 | Stewart | 307/451 |
| 4,678,943 | 7/1987 | Uragami | 307/443 |
| 4,731,553 | 3/1988 | Van Lehn et al. | 307/443 |
| 4,829,199 | 5/1989 | Prater | 307/443 |
| 4,928,023 | 5/1990 | Marshall | 307/443 |
| 5,047,669 | 9/1991 | Iwamura et al. | 307/443 |
| 5,059,821 | 10/1991 | Murabayashi et al. | 307/443 |
| 5,107,142 | 4/1992 | Bhamidipaty | 307/451 |
| 5,132,568 | 7/1992 | Kim et al. | 307/473 |
| 5,212,801 | 5/1993 | Farmer | 307/443 |
| 5,220,205 | 6/1993 | Shigehara et al. | 307/443 |

FOREIGN PATENT DOCUMENTS 0511643  4/1992  European Pat. Off. .

OTHER PUBLICATIONS

"High Speed CMOS Off-Chip Driver Designs For Improved Performance", IBM Technical Disclosure Bulletin, vol. 31, No. 5, Oct., 1988, New York, US, pp. 331–332.

Primary Examiner—Edward P. Westin
Assistant Examiner—Benjamin D. Driscoll
Attorney, Agent, or Firm—Banner, Birch, McKie & Beckett

[57] ABSTRACT

This invention discloses a signal output circuit including DC and AC buffers having output nodes commonly connected to a signal output terminal, and an AC buffer control circuit for driving the AC buffer when an output from the DC buffer is changed and for controlling an output from the AC buffer in a high-impedance state when the output from the DC buffer is stationary.

35 Claims, 42 Drawing Sheets

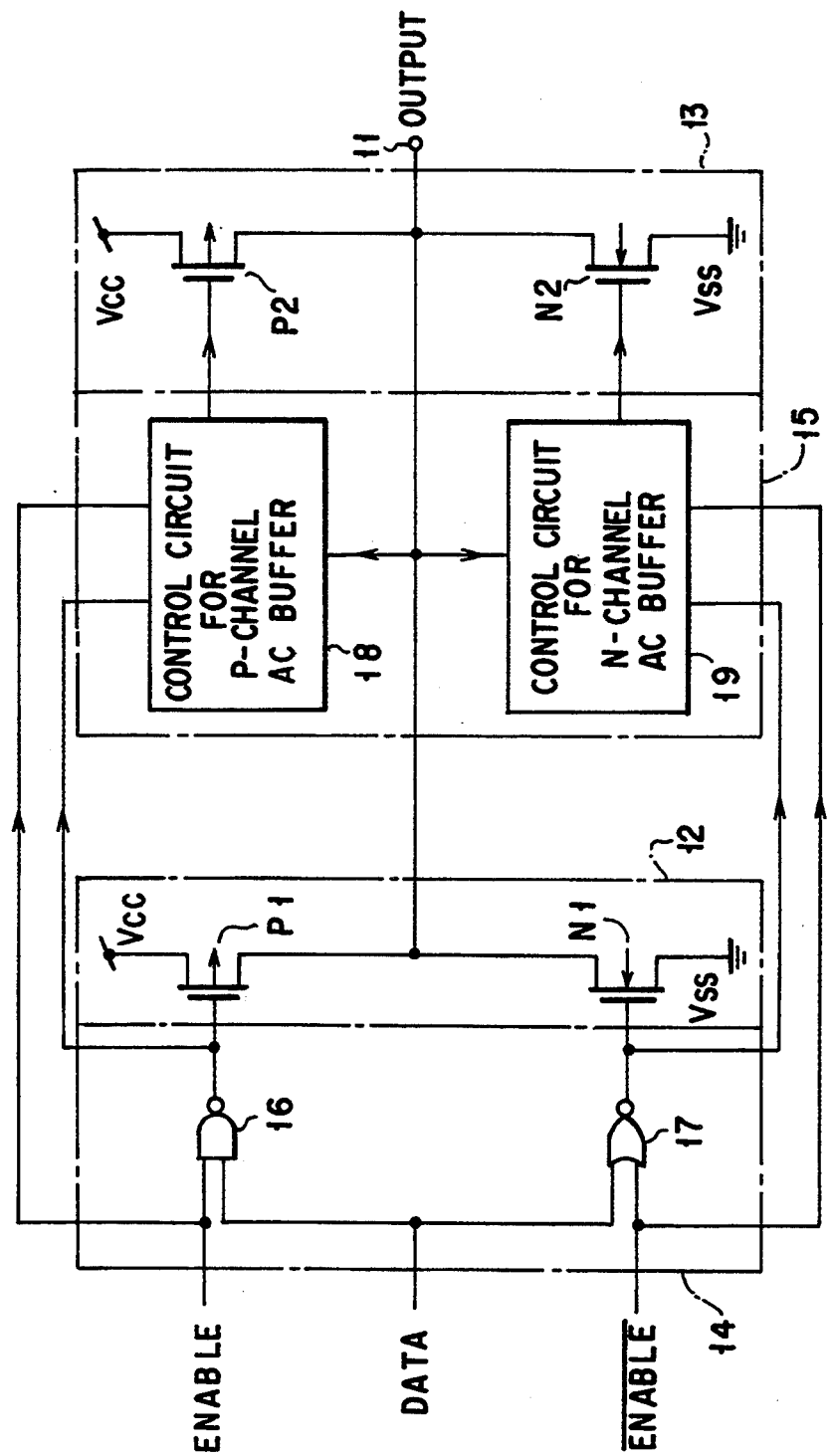
F I G. 1

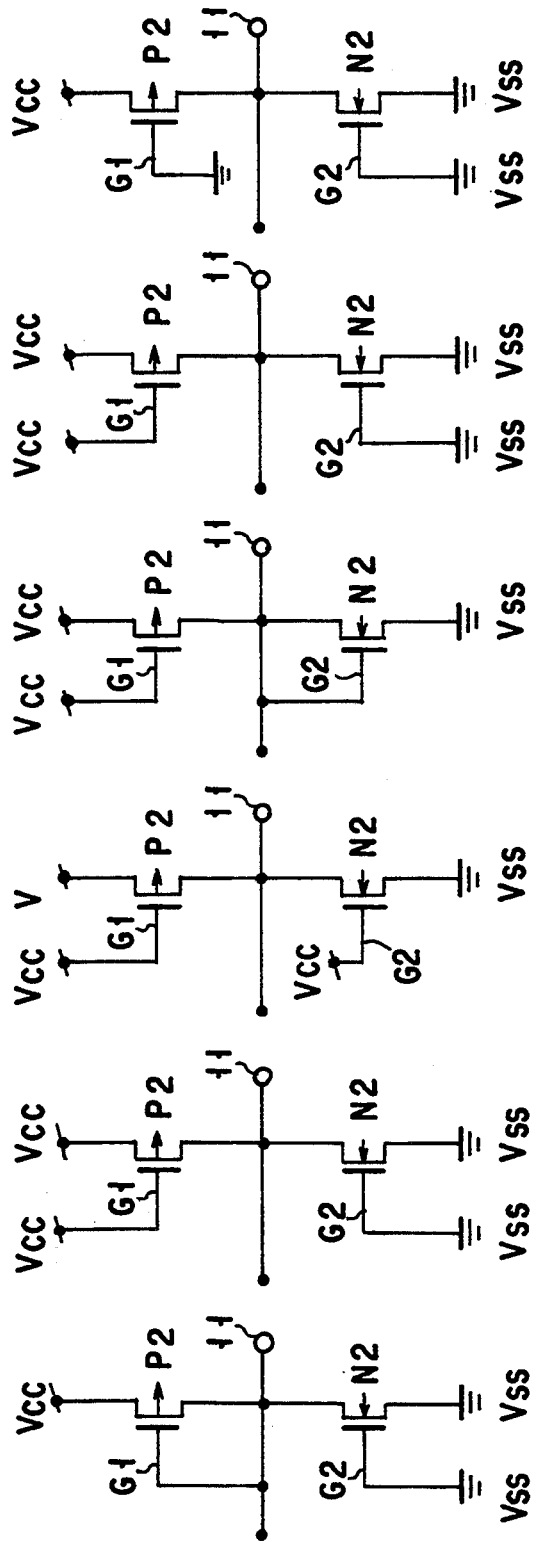

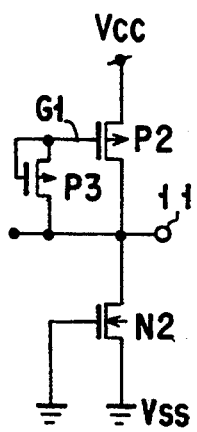
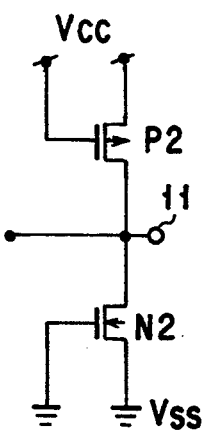
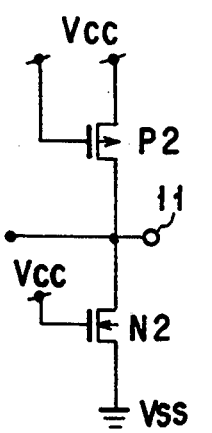
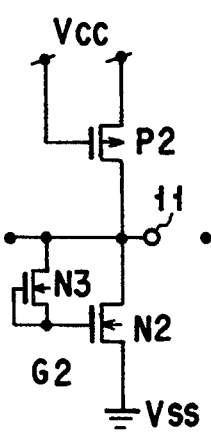
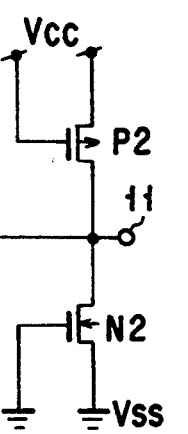
FIG. 3A  FIG. 3B  FIG. 3C  FIG. 3D  FIG. 3E
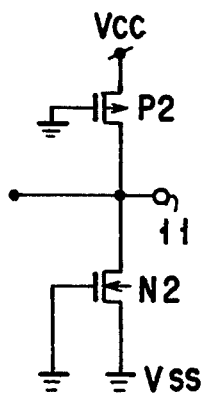
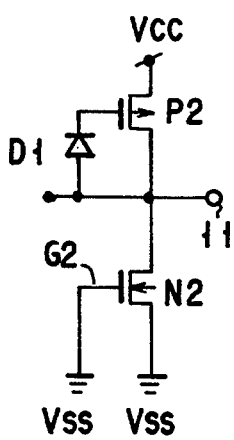
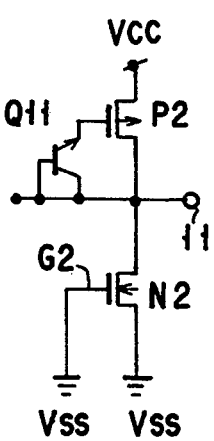
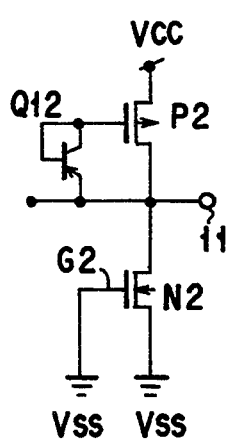
FIG. 3F  FIG. 3G  FIG. 3H  FIG. 3I
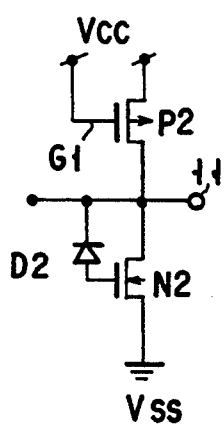
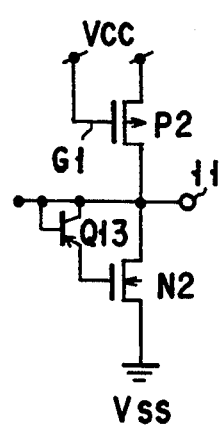
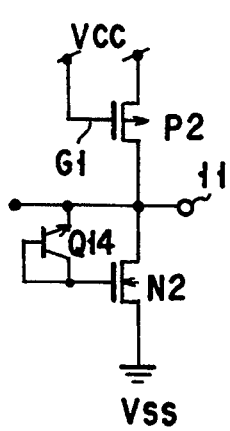
FIG. 3J  FIG. 3K  FIG. 3L

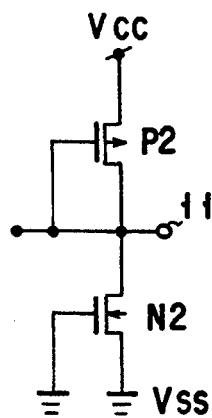 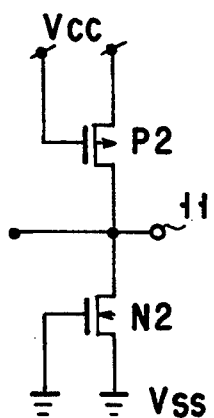 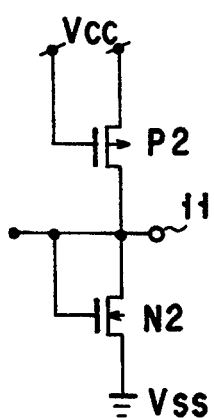 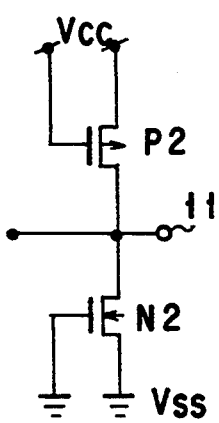
FIG. 4A    FIG. 4B    FIG. 4C    FIG. 4D
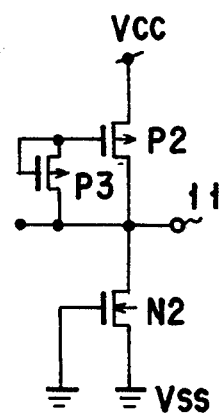 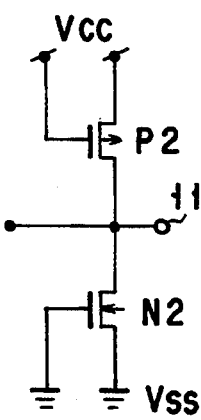 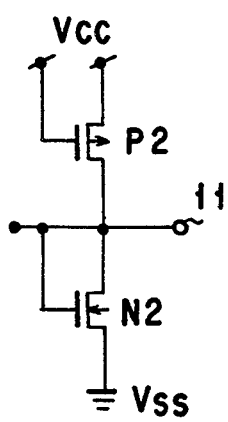
FIG. 5A    FIG. 5B    FIG. 5C
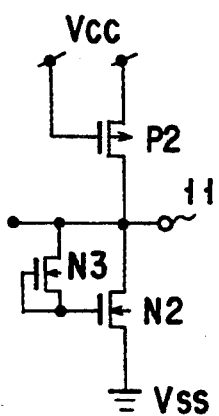 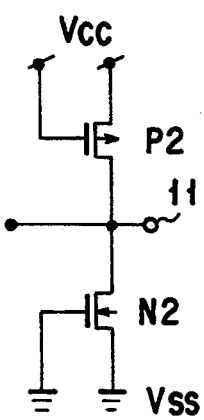 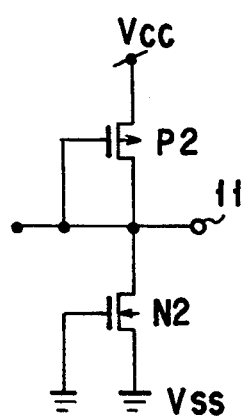
FIG. 5D    FIG. 5E    FIG. 5F

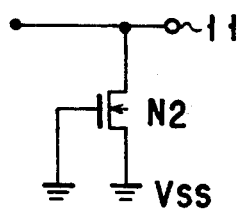 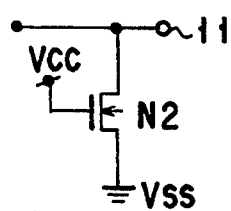 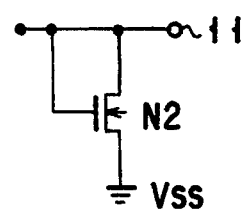
FIG. 6A  FIG. 6B  FIG. 6C
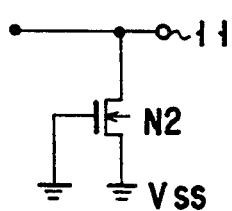 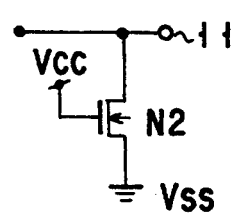 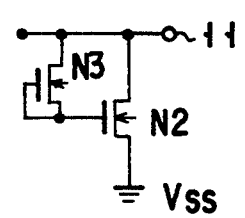
FIG. 7A  FIG. 7B  FIG. 7C
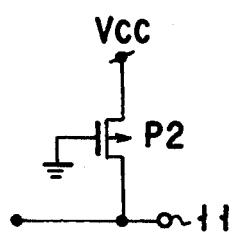 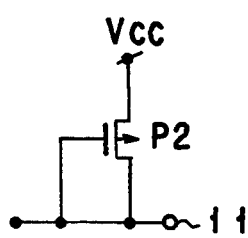 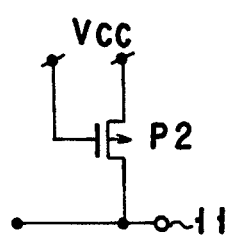
FIG. 8A  FIG. 8B  FIG. 8C
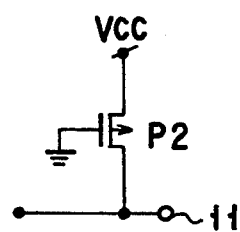 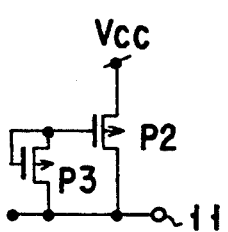 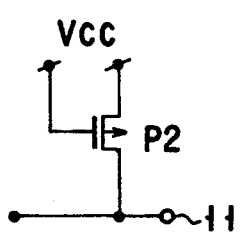
FIG. 9A  FIG. 9B  FIG. 9C

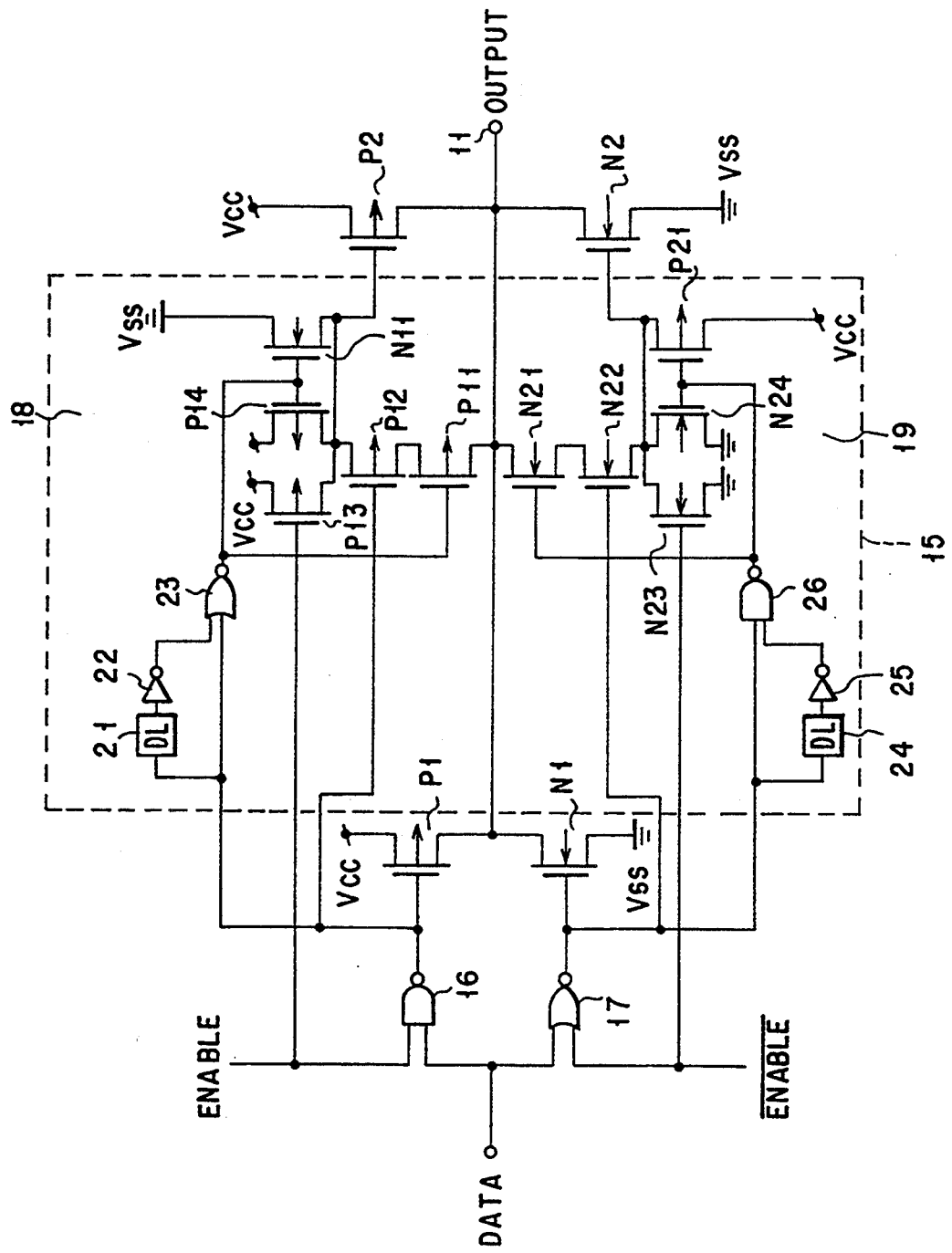
F I G. 10

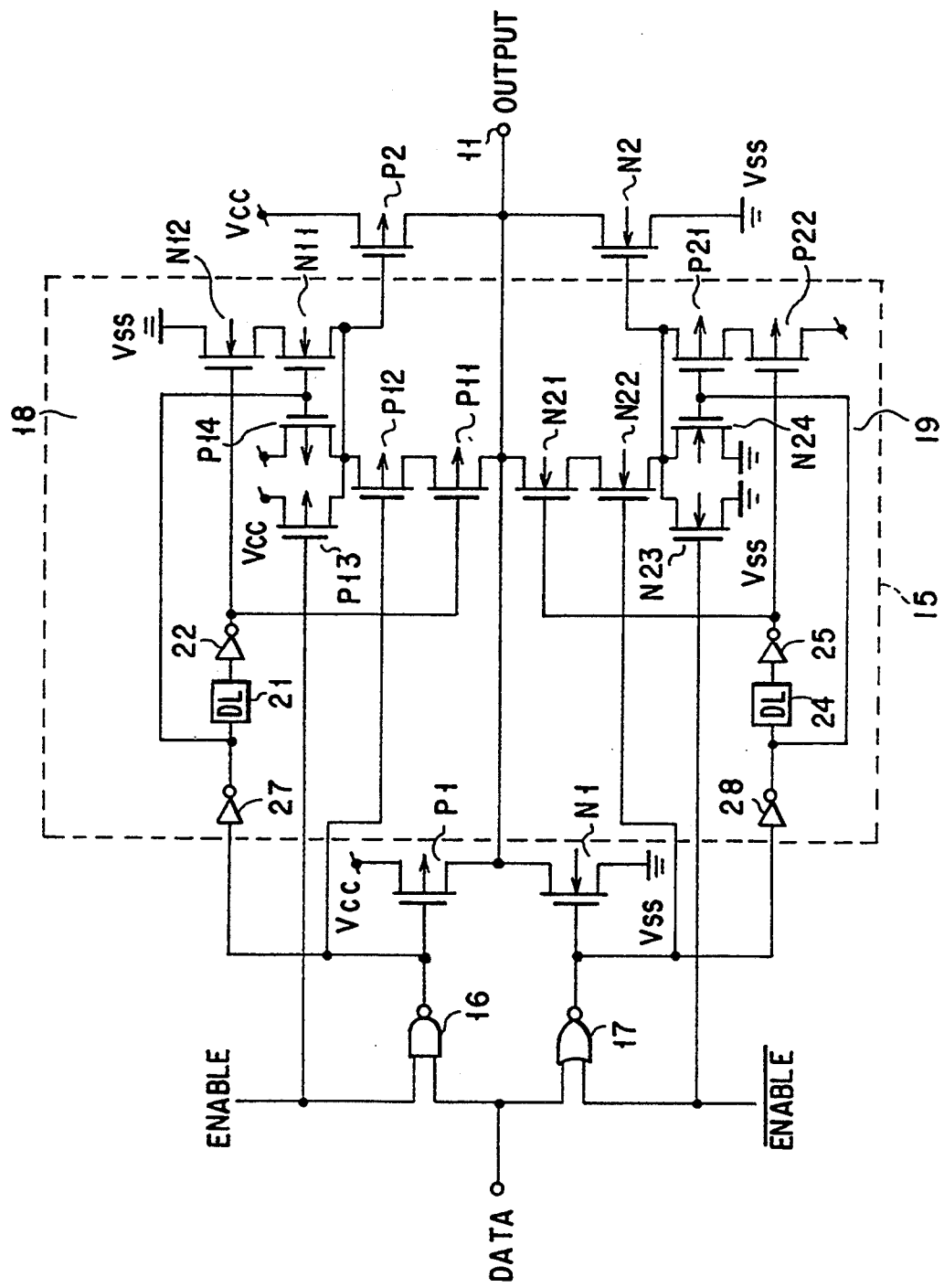
F I G. 12

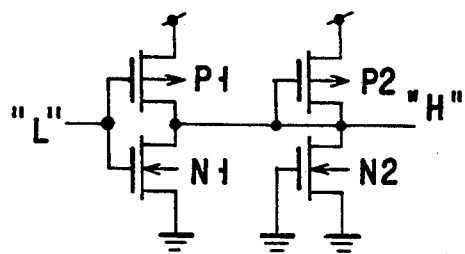
F I G. 13A
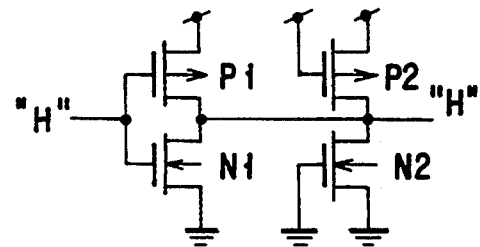
F I G. 13B
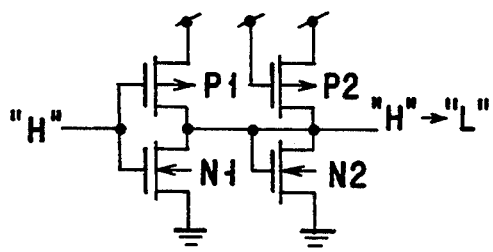
F I G. 13C
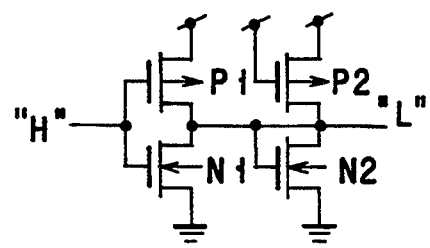
F I G. 13D
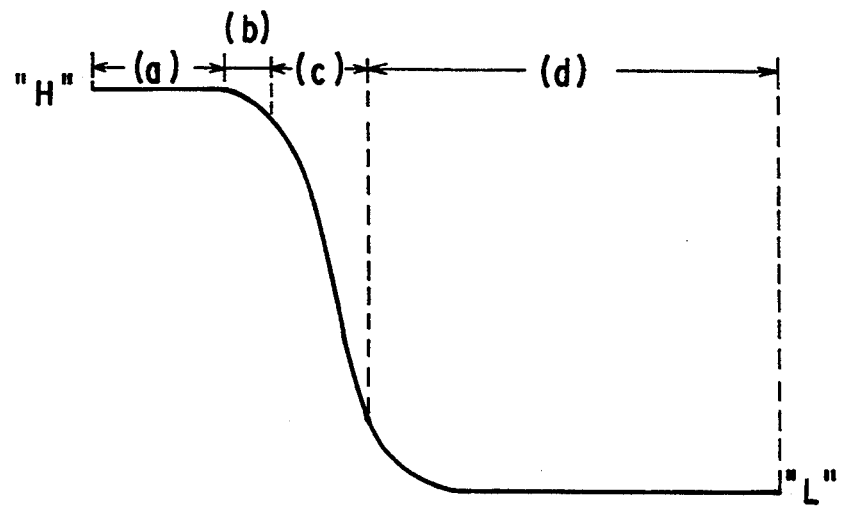
F I G. 14

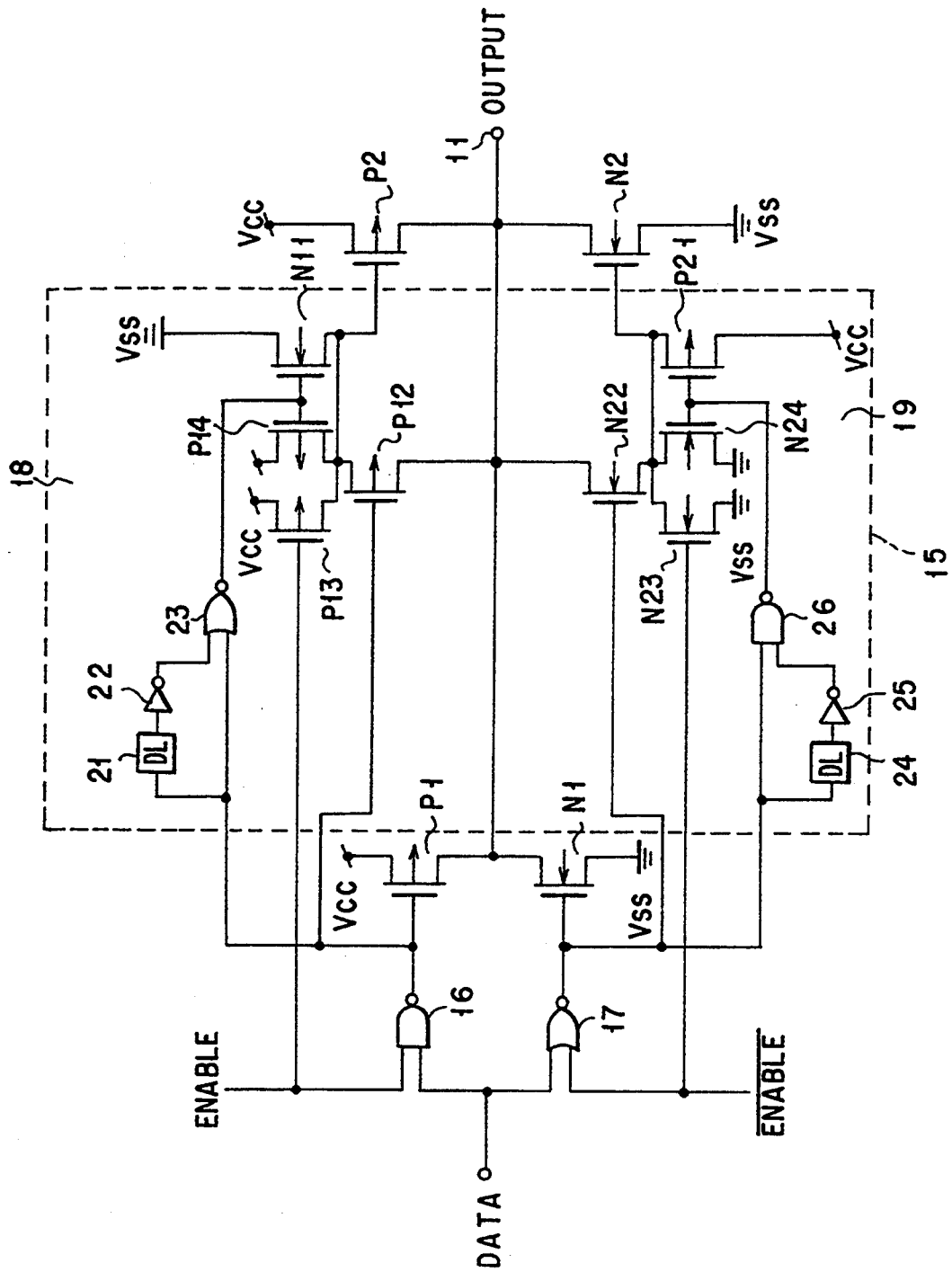
F I G. 15

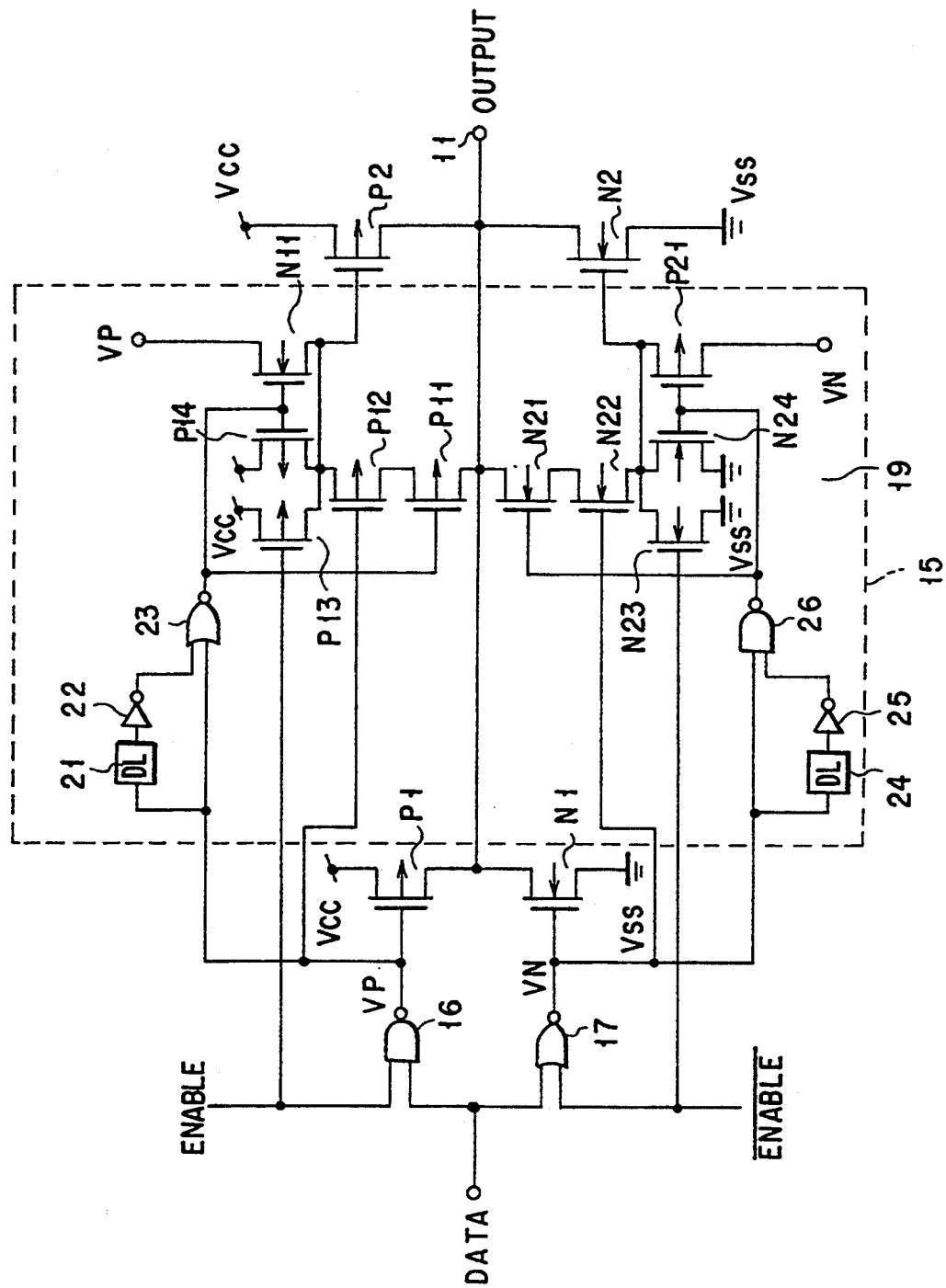
F I G. 16

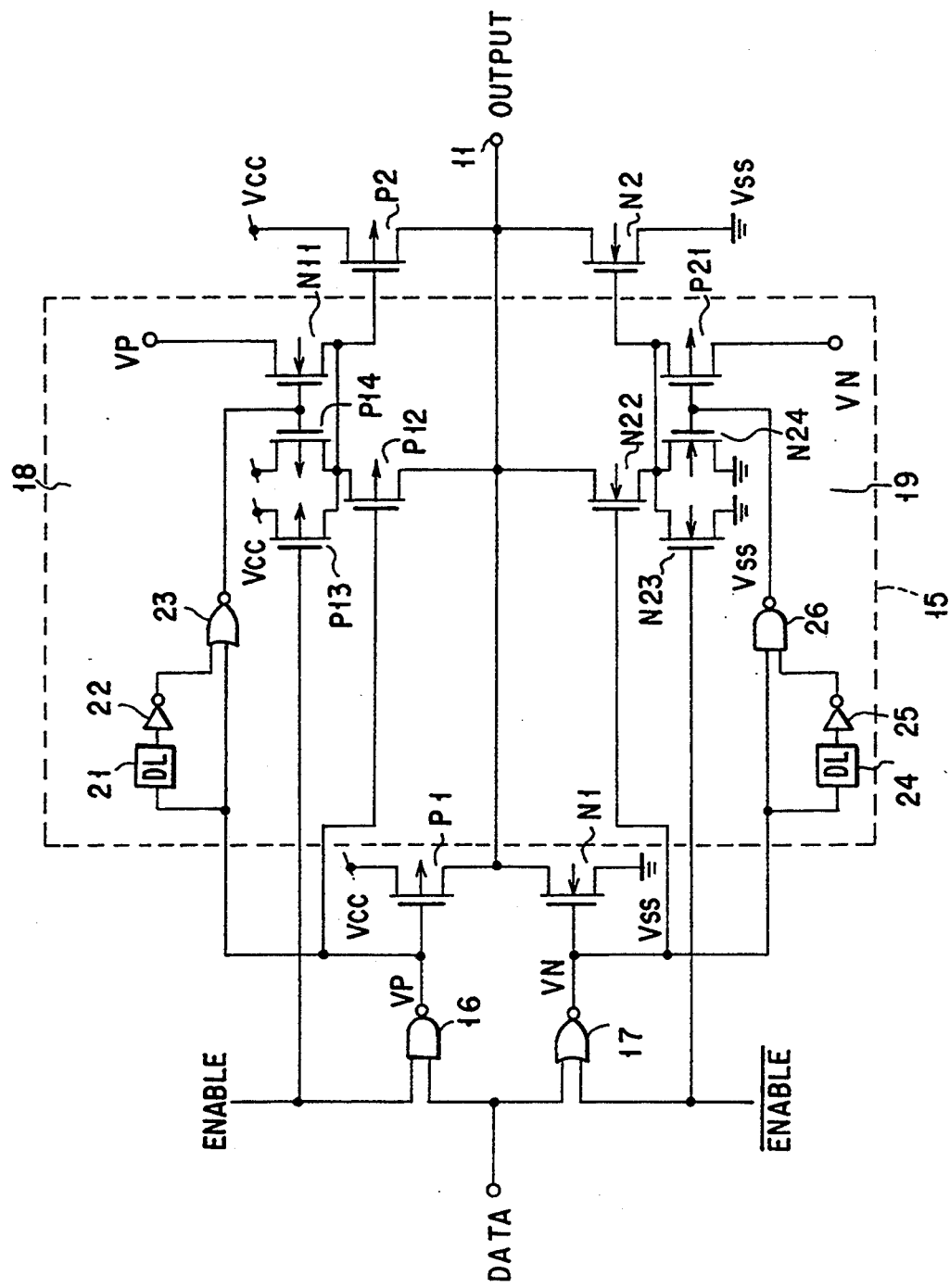
F I G. 17

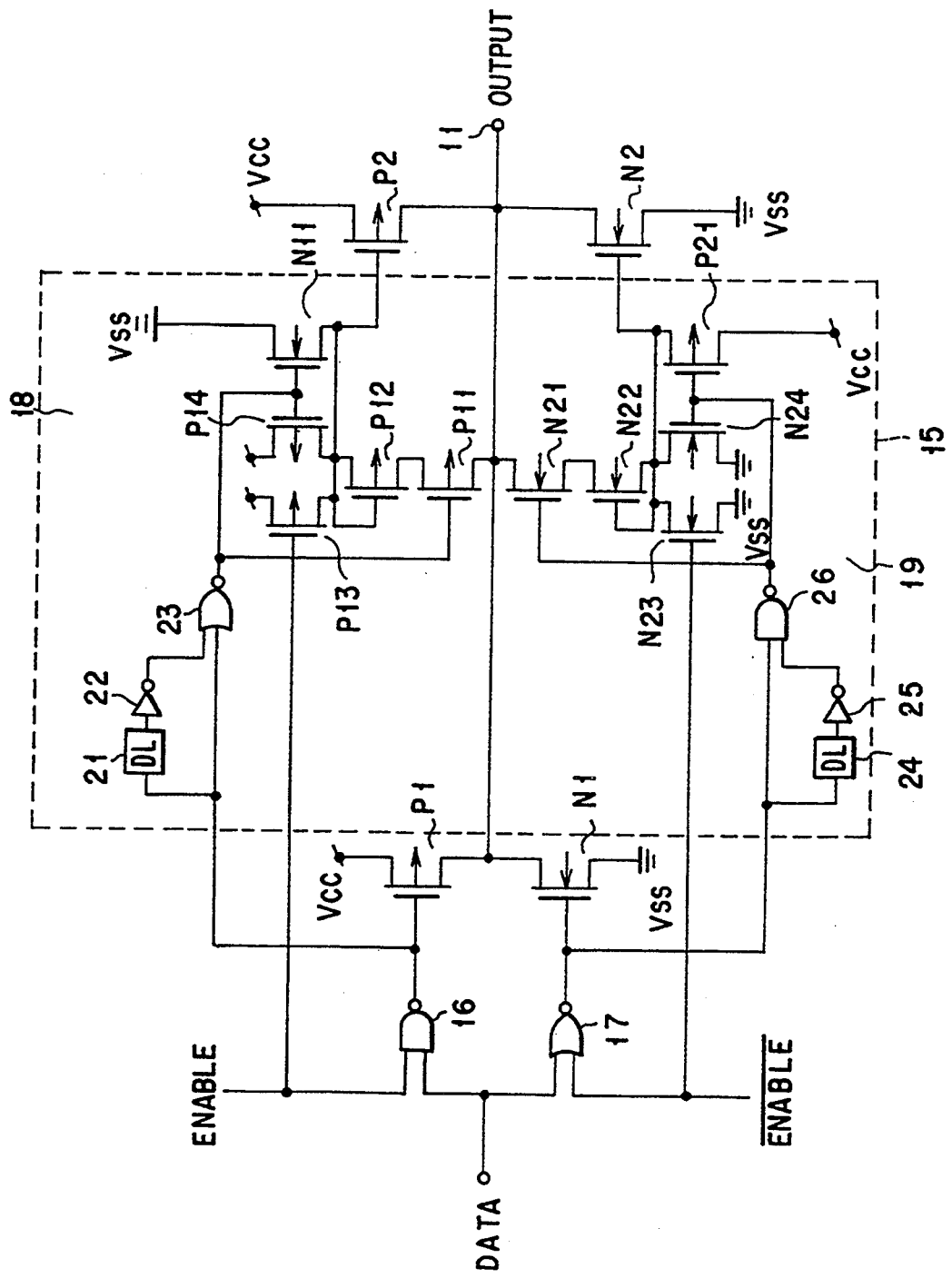
F I G. 18

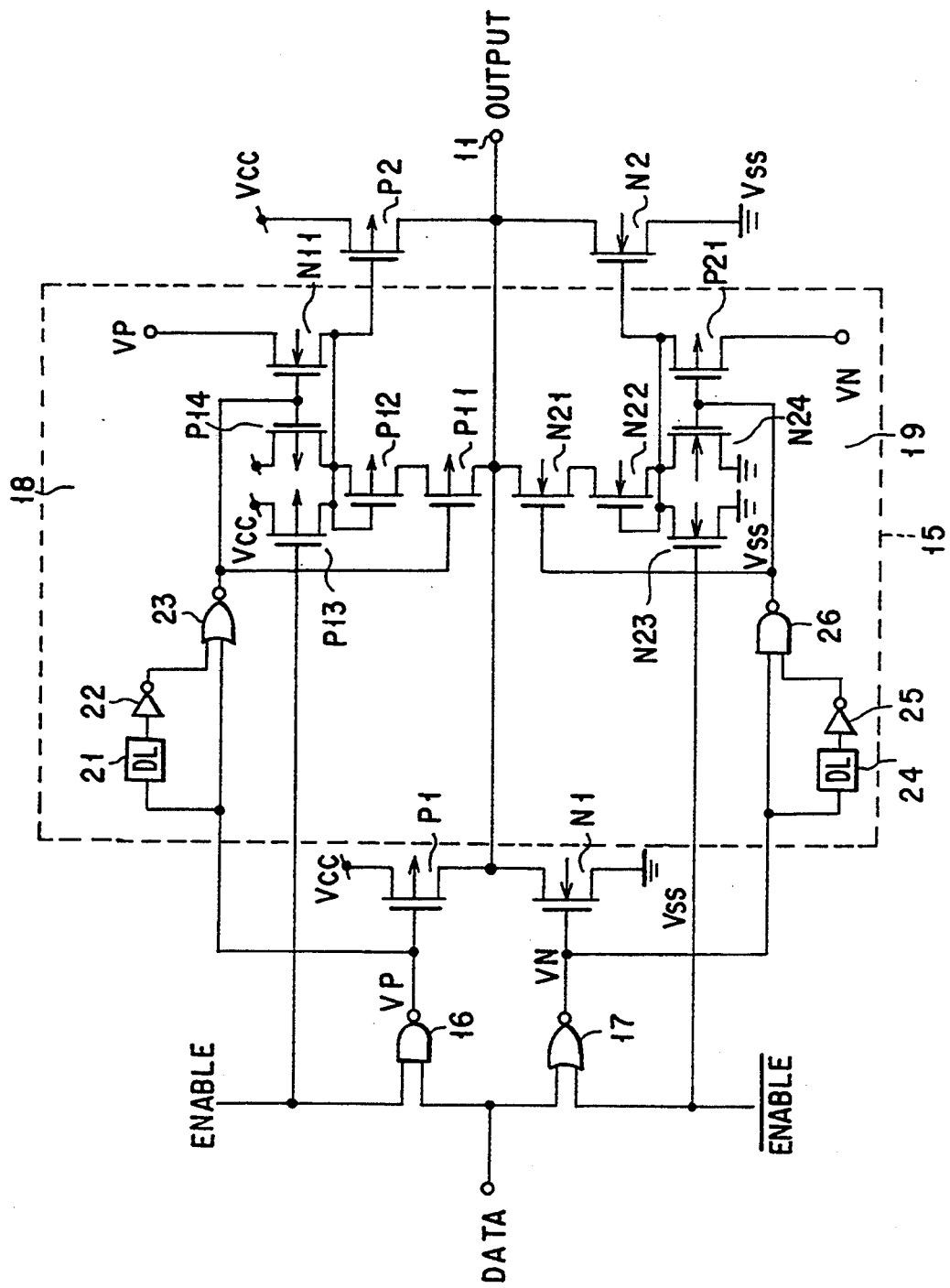
F I G. 20

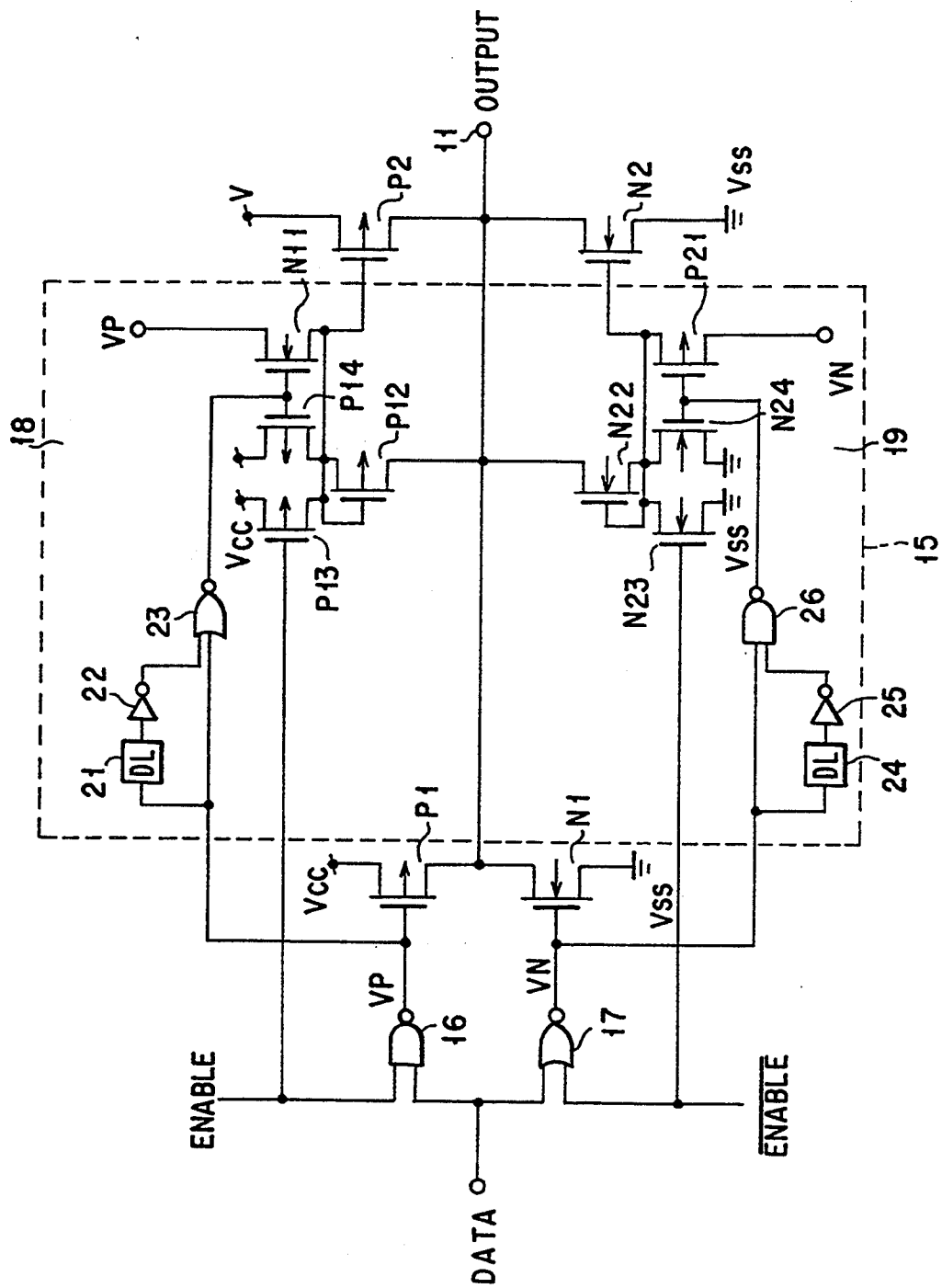
F I G. 21

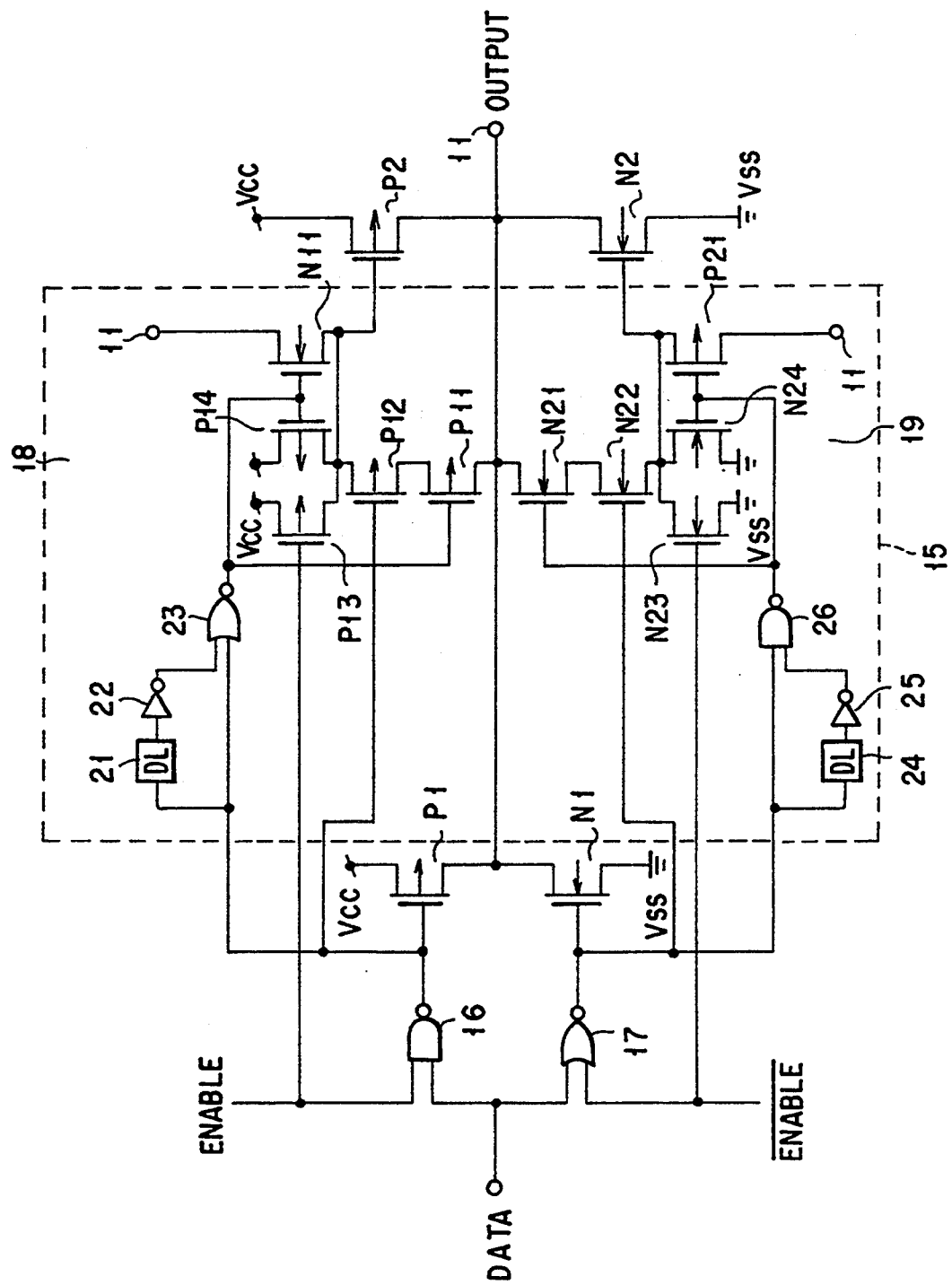
F I G. 22

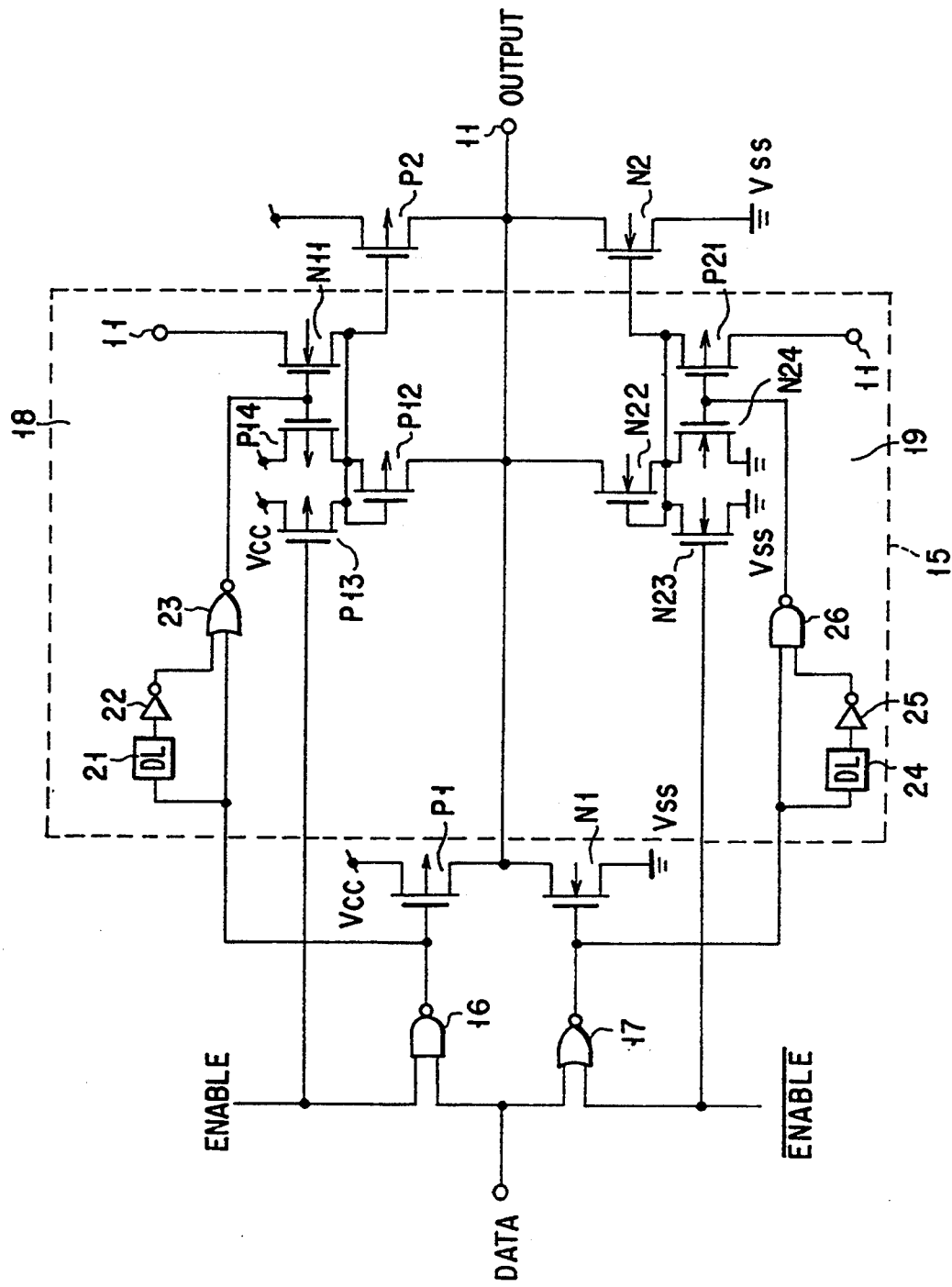
F I G. 25

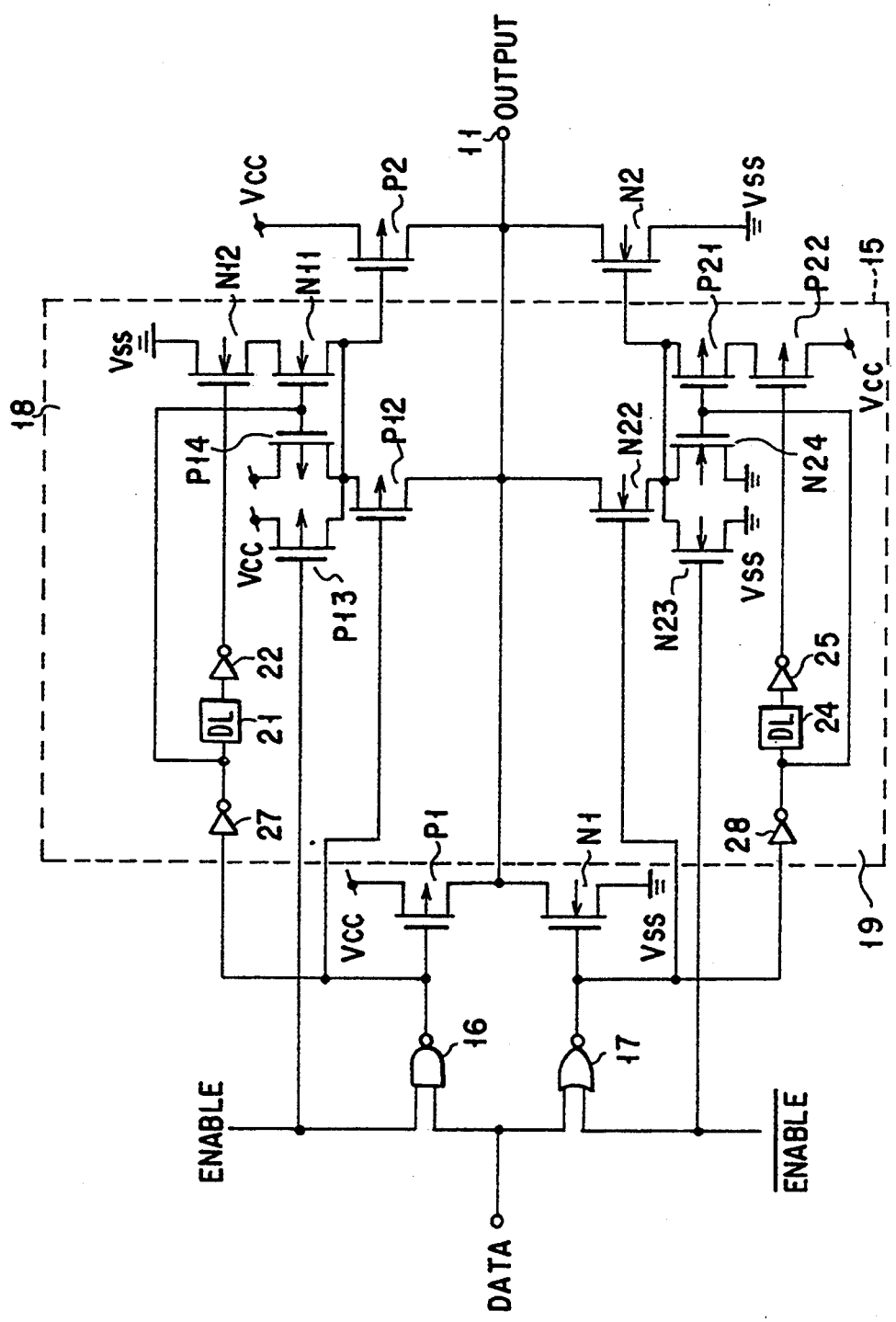
F I G. 26

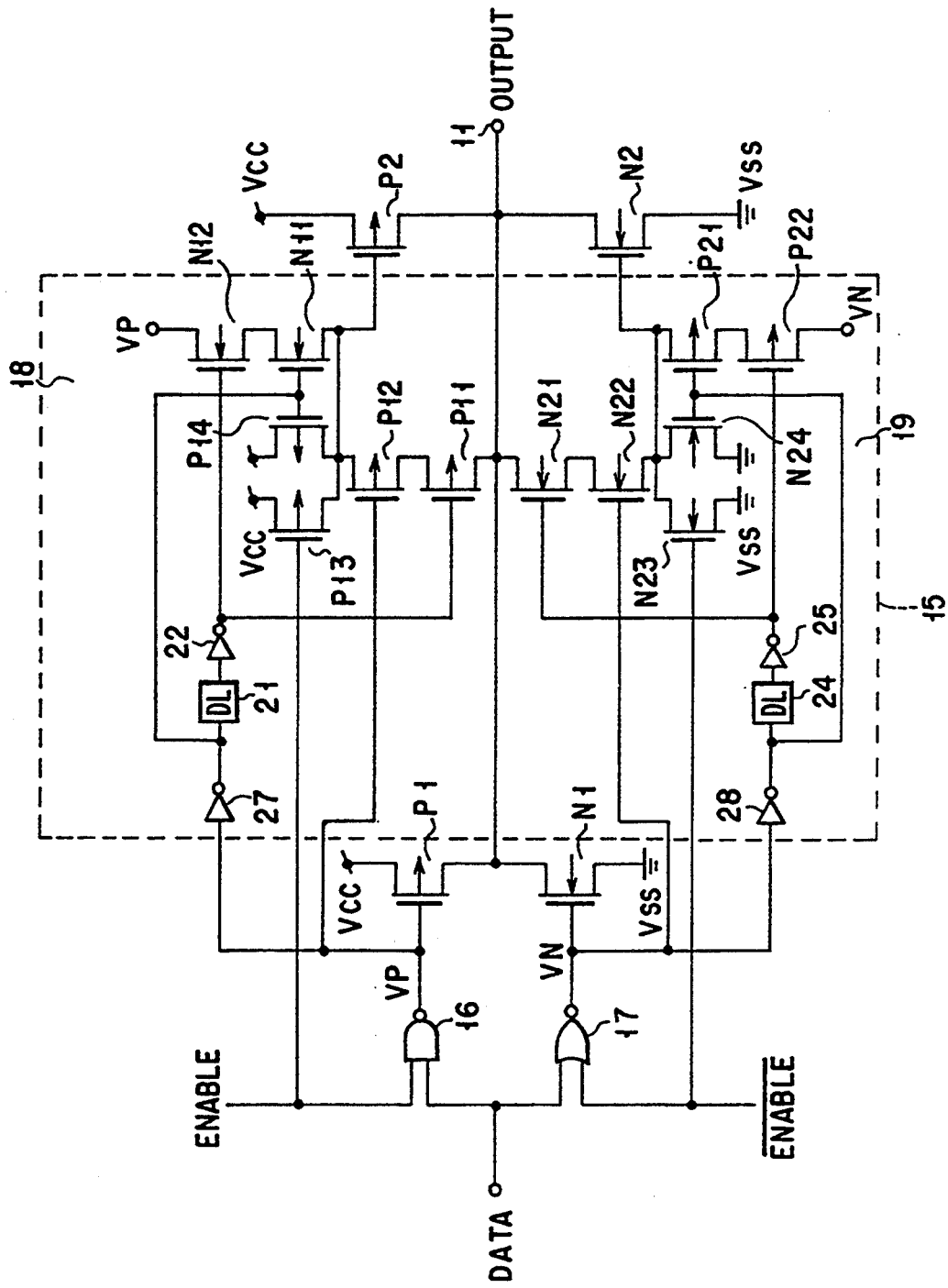
F I G. 27

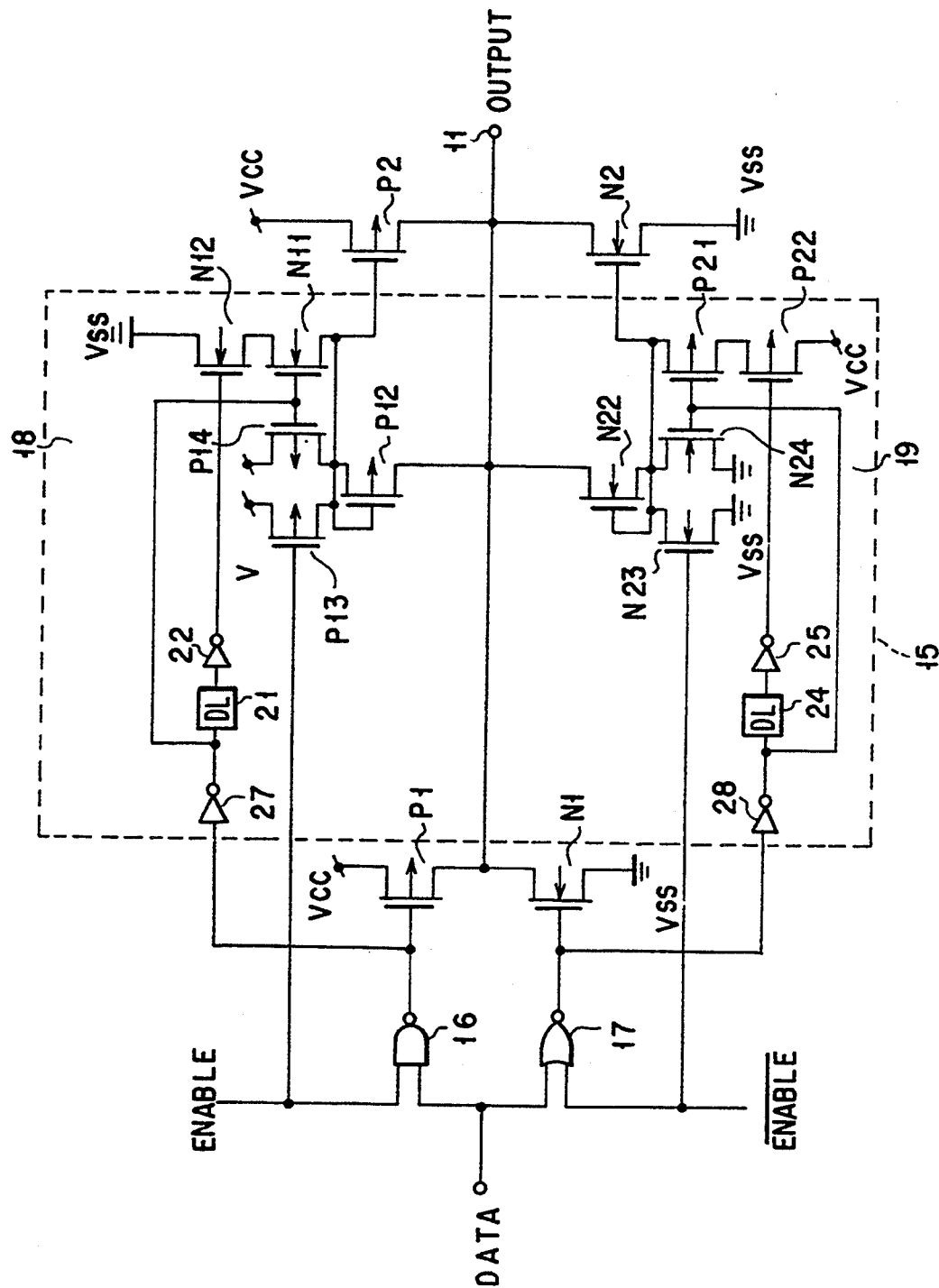
F I G. 30

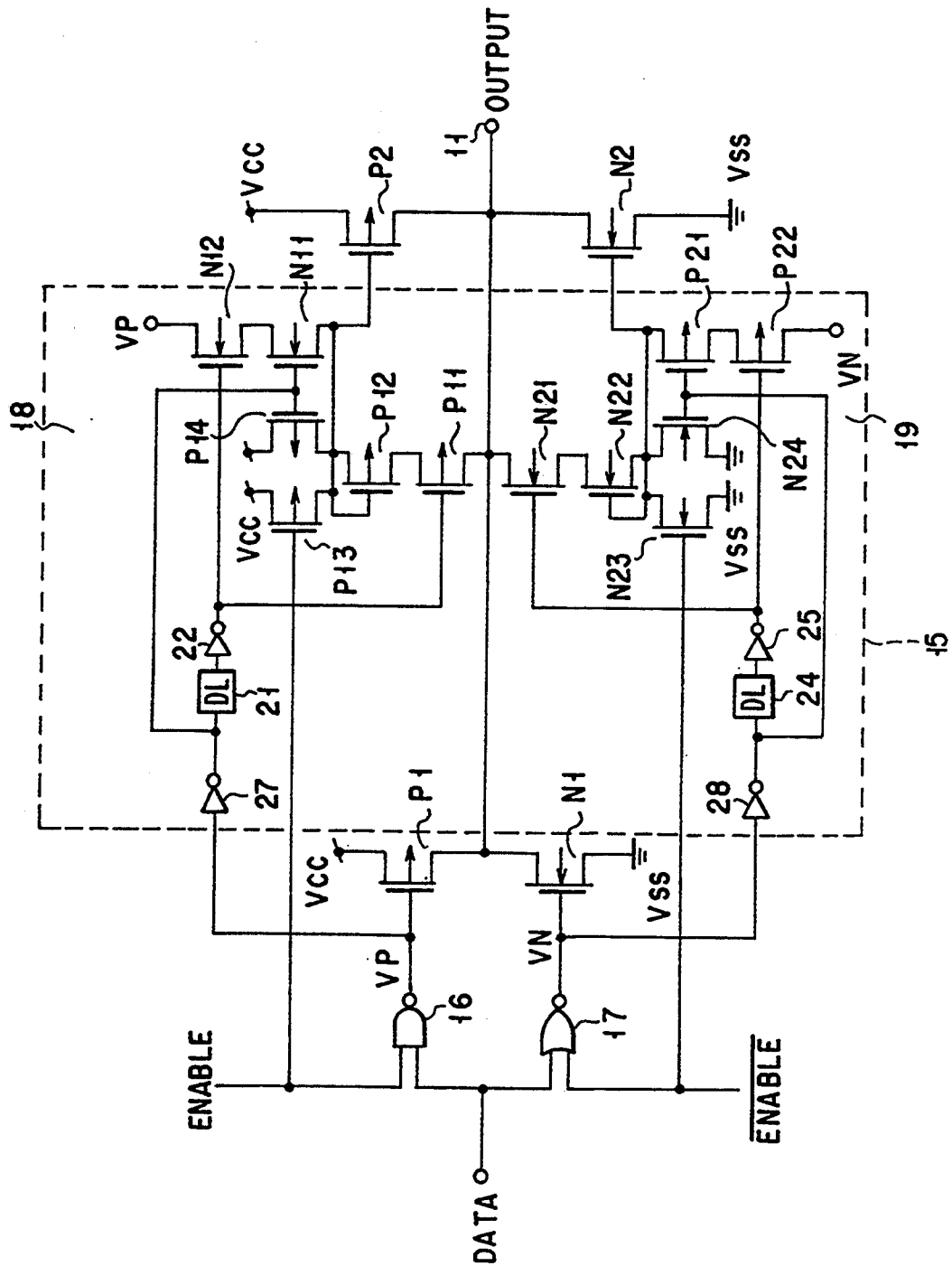
F I G. 31

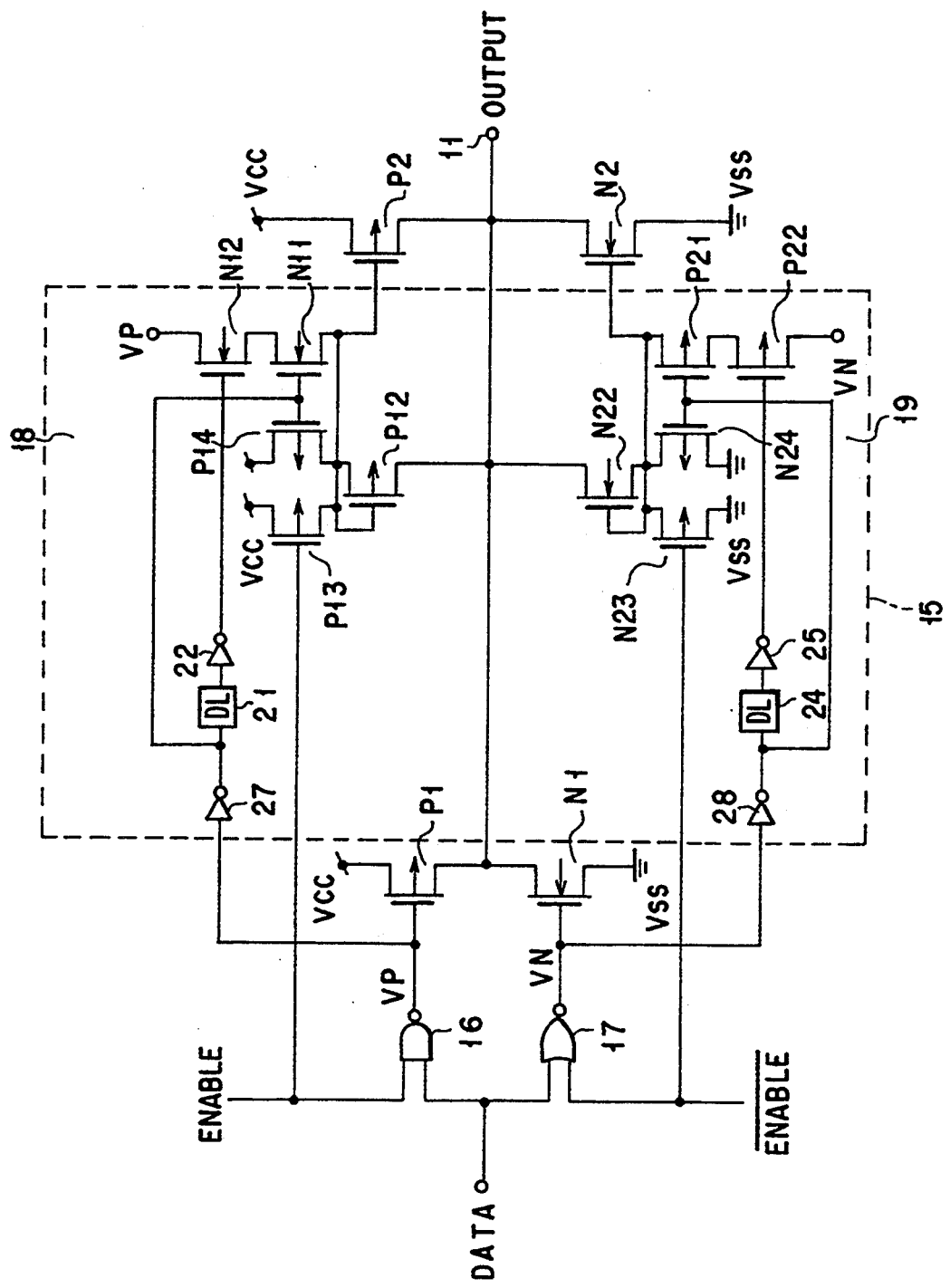
F I G. 32

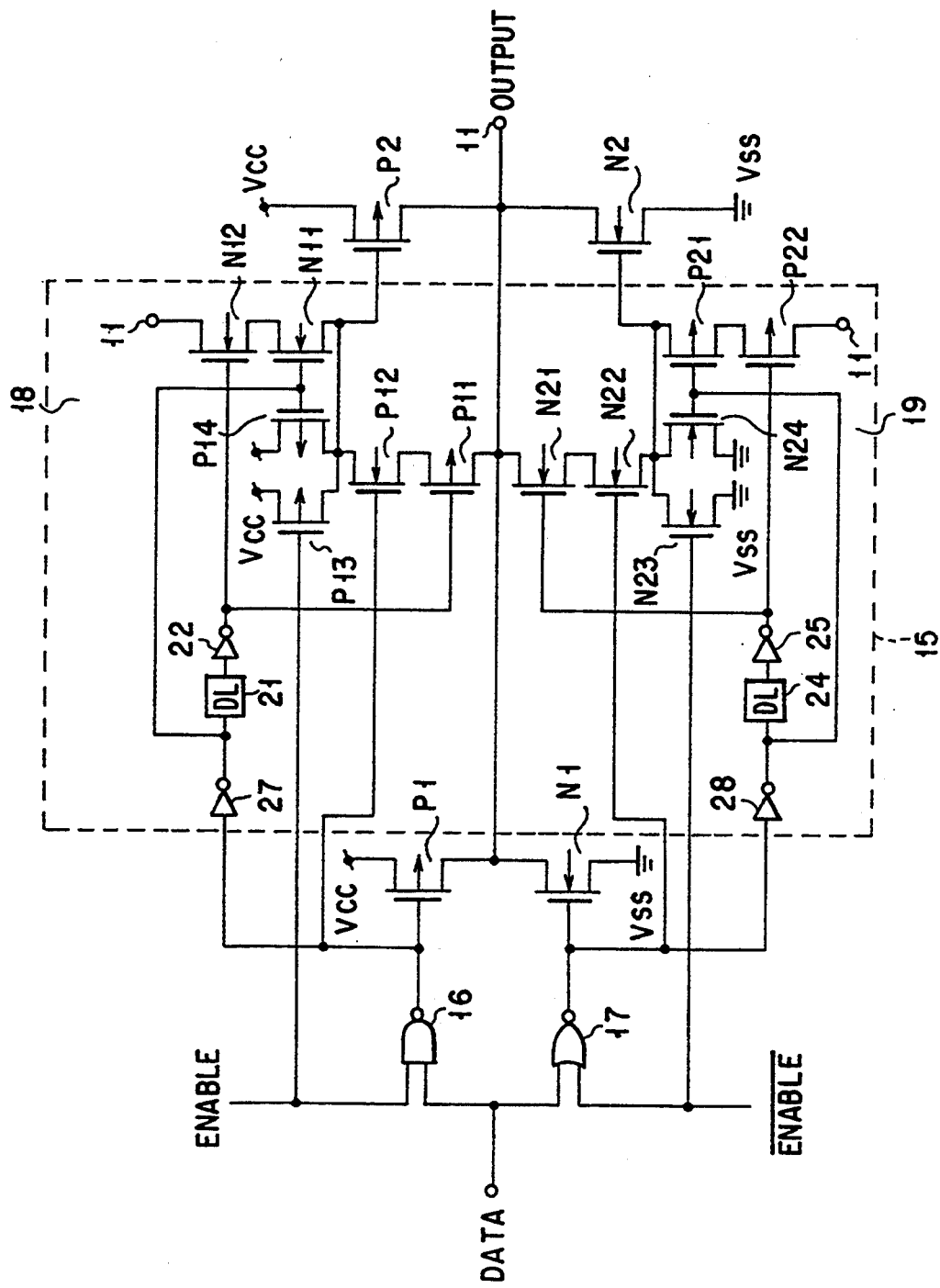
F I G. 33

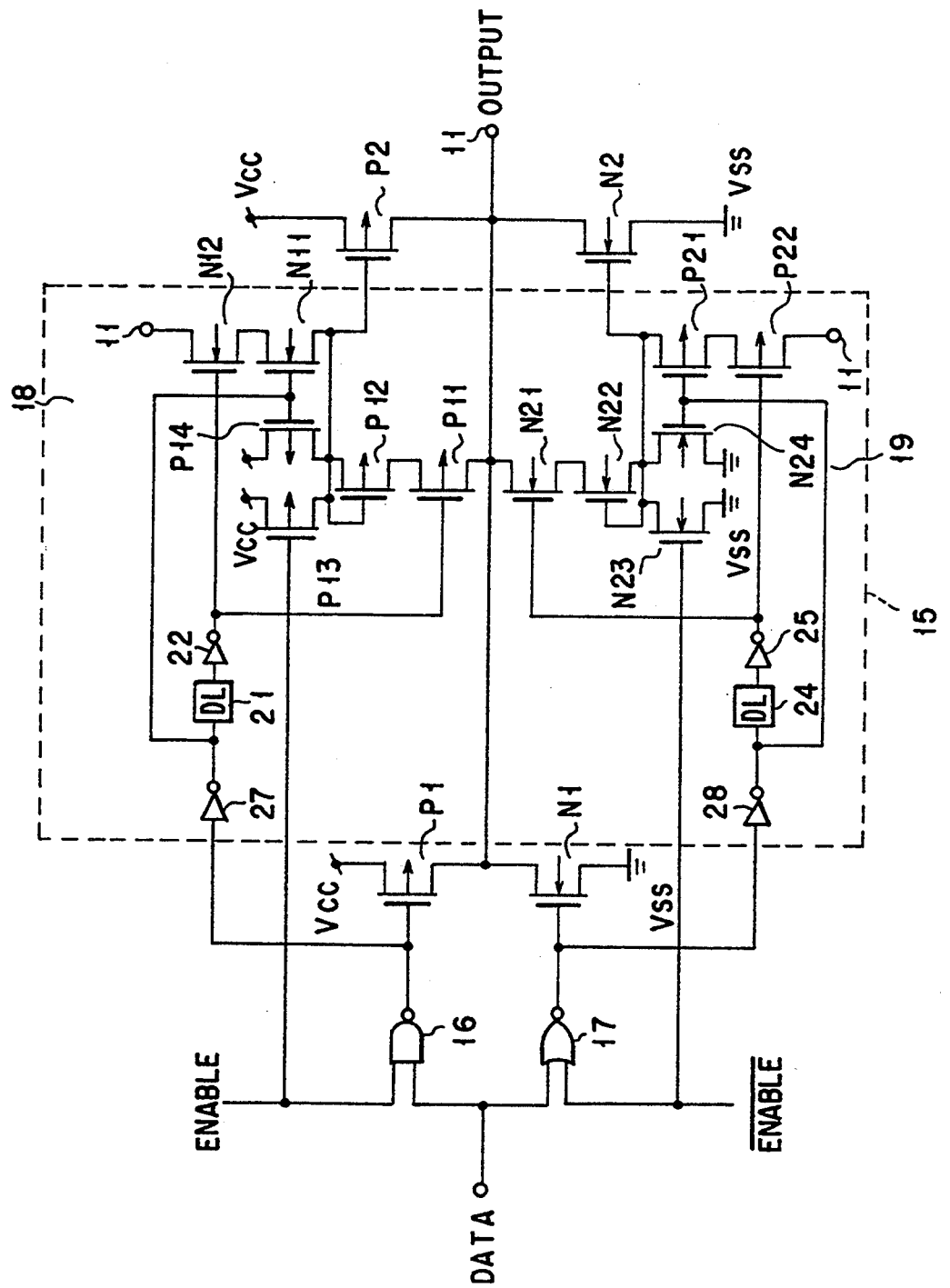
F I G. 35

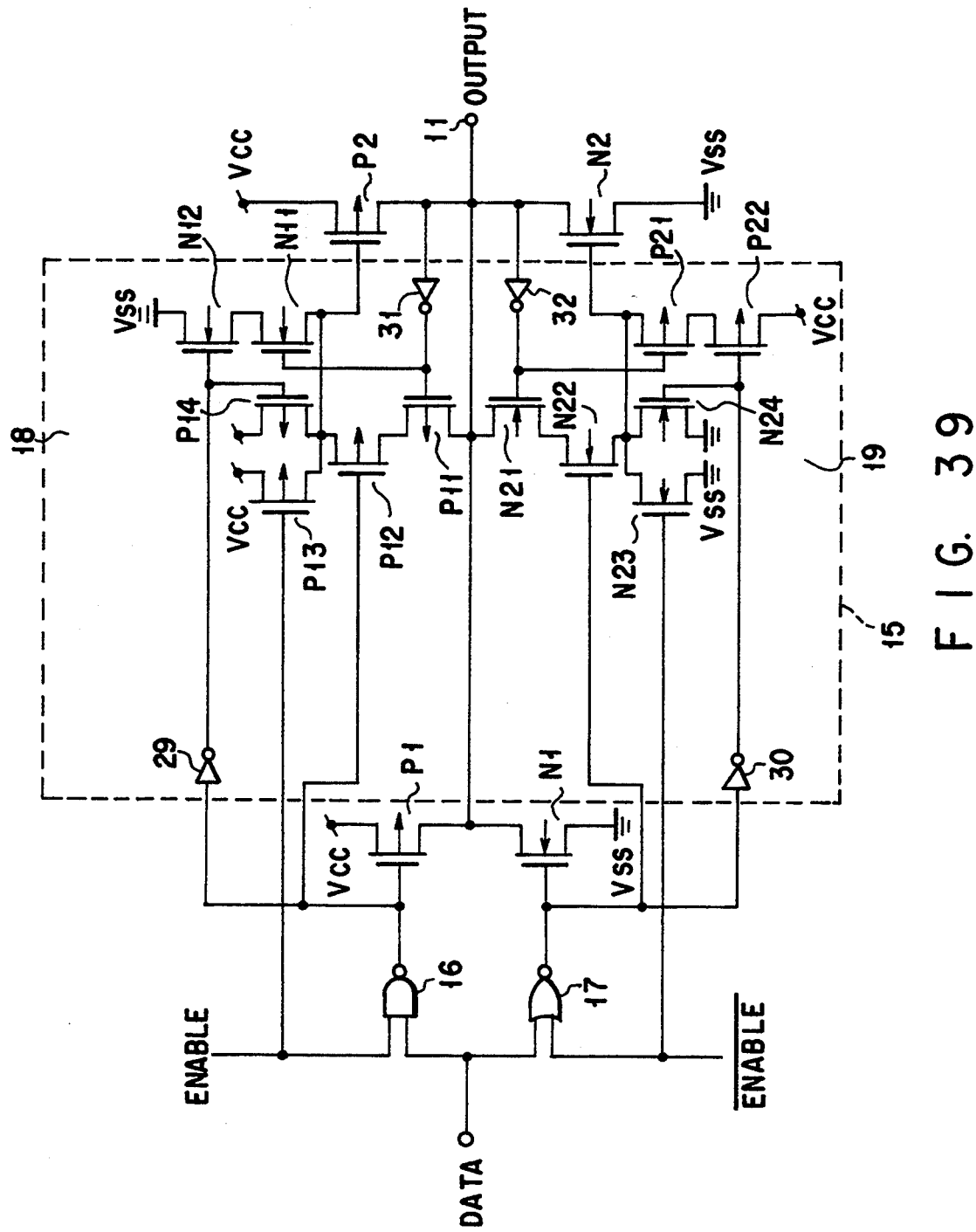
F I G. 39

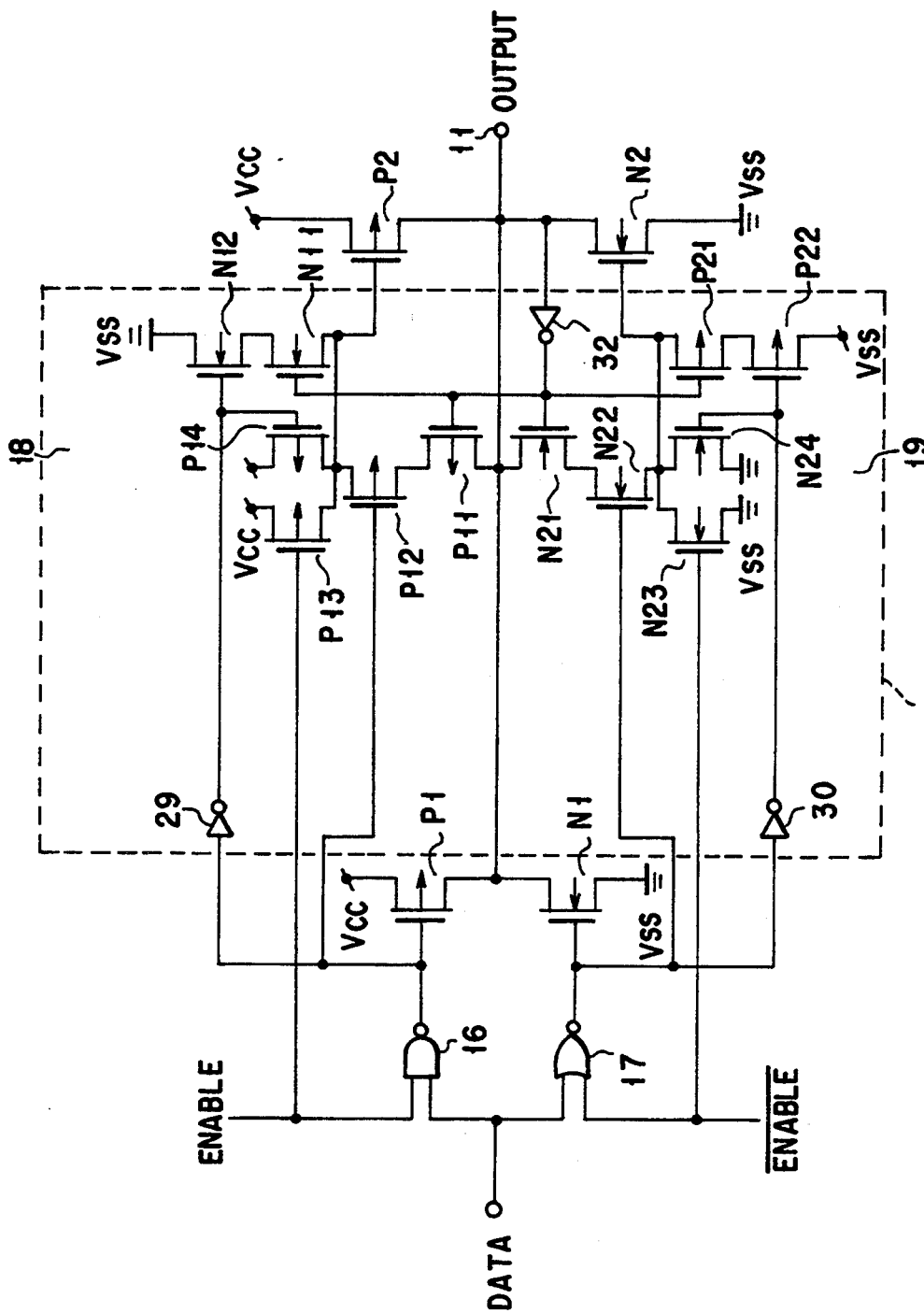
F I G. 40

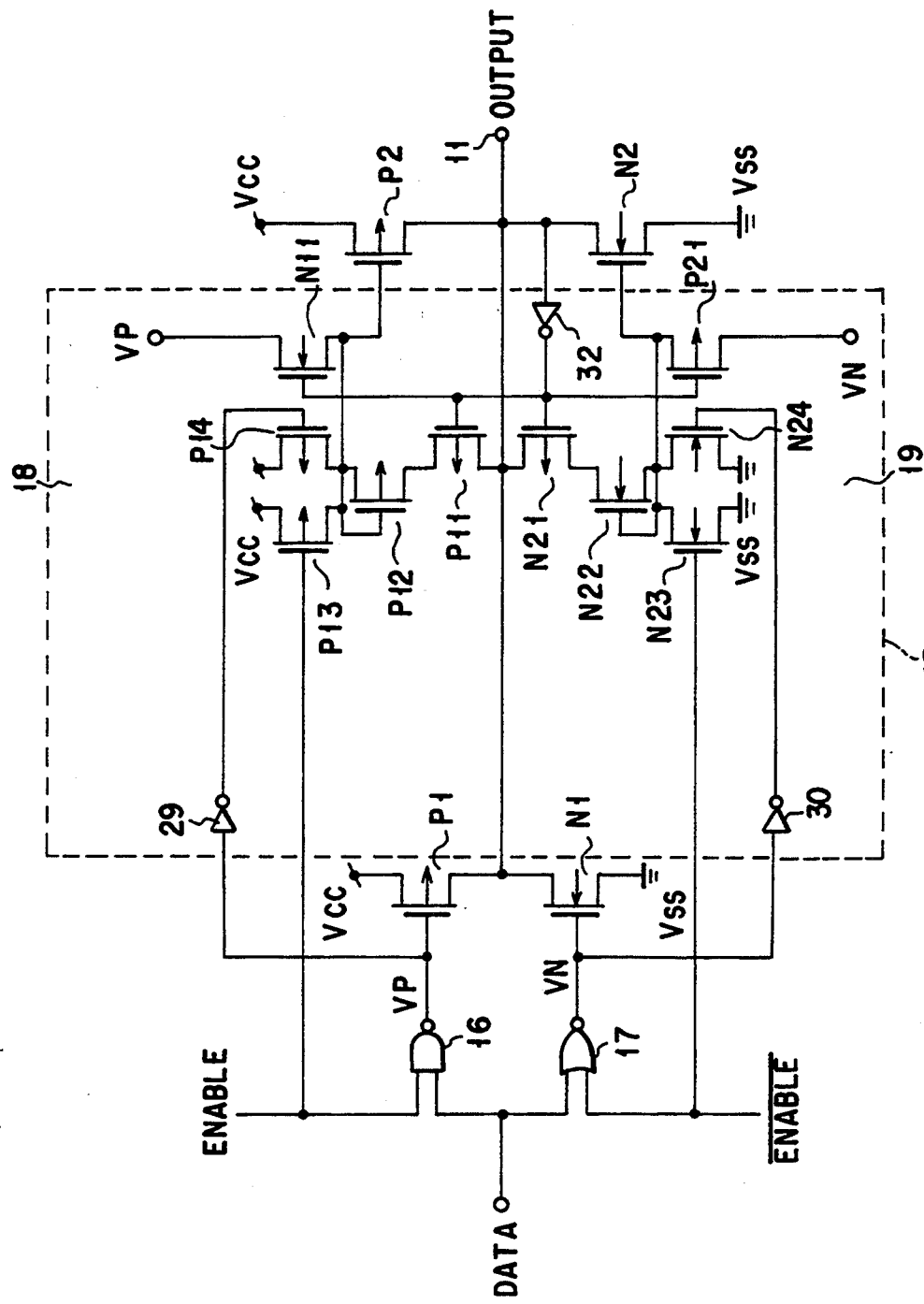
F I G. 42

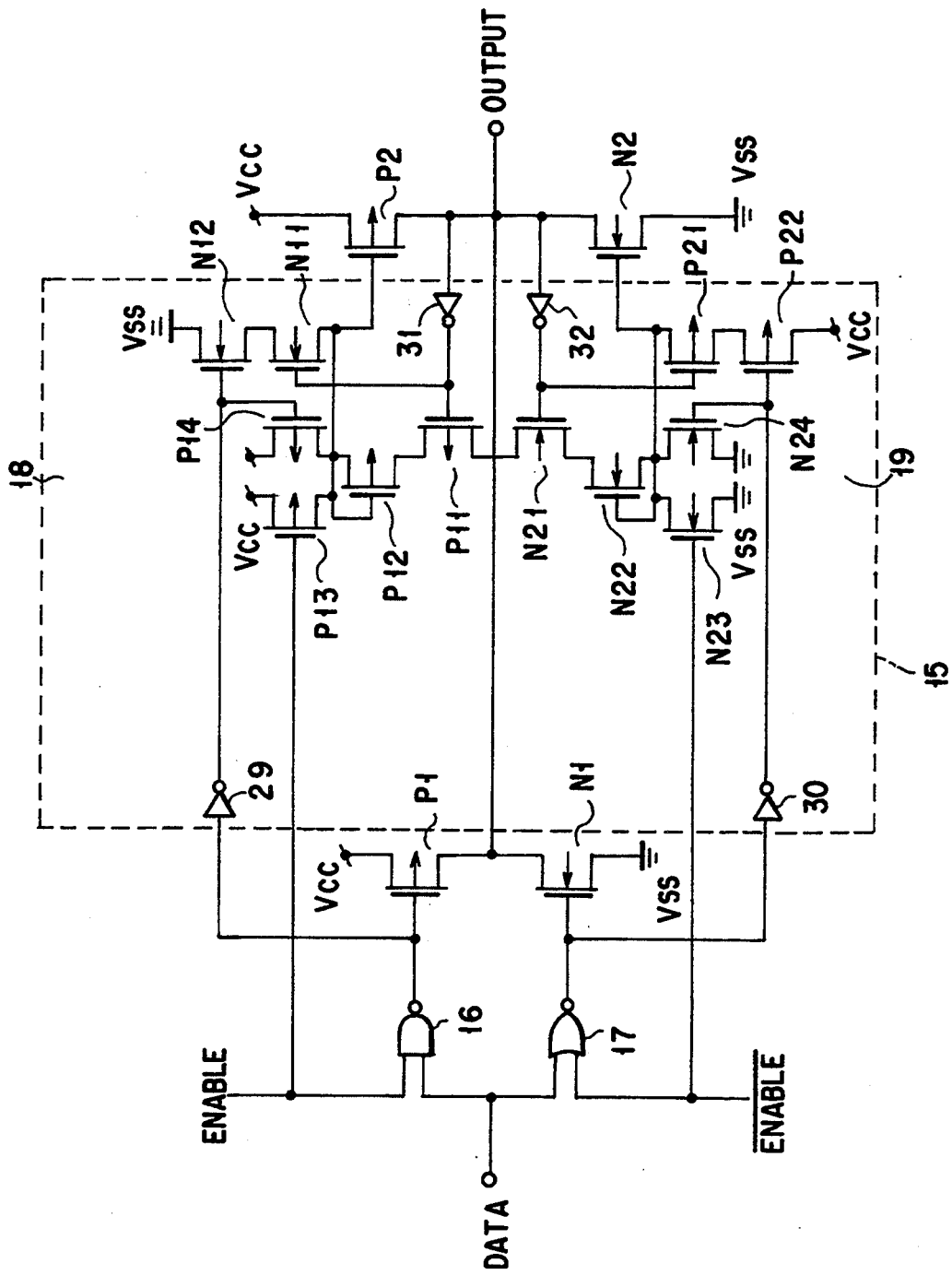
F I G. 43

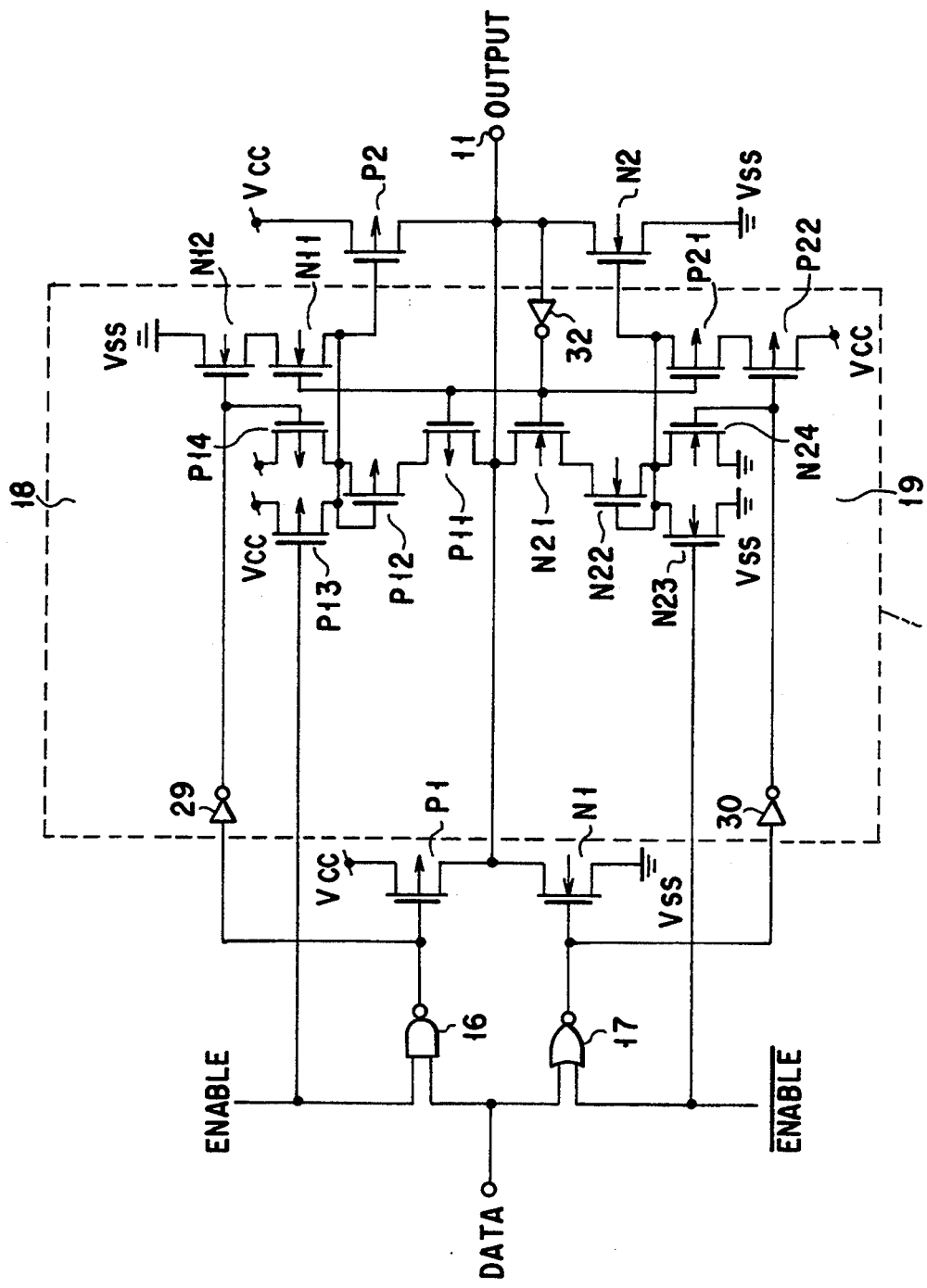
F I G. 44

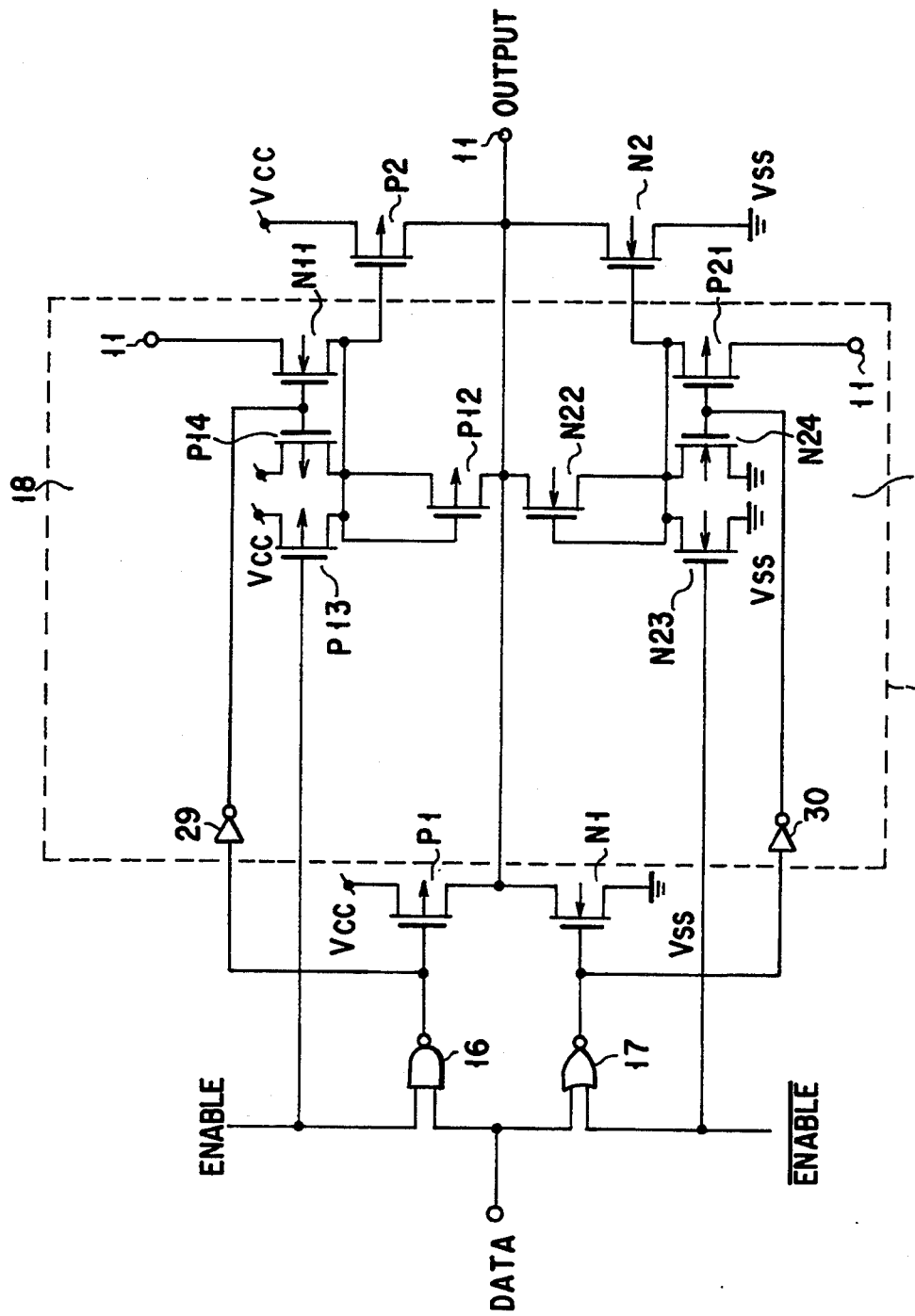
F I G. 46

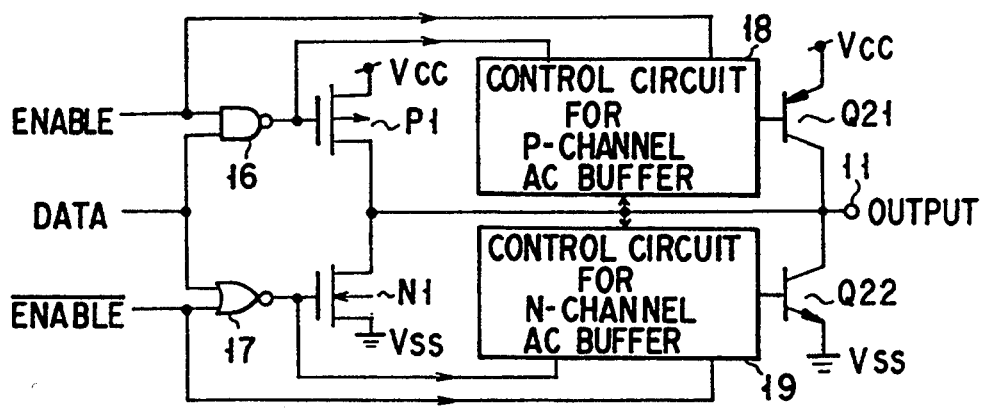
F I G. 47
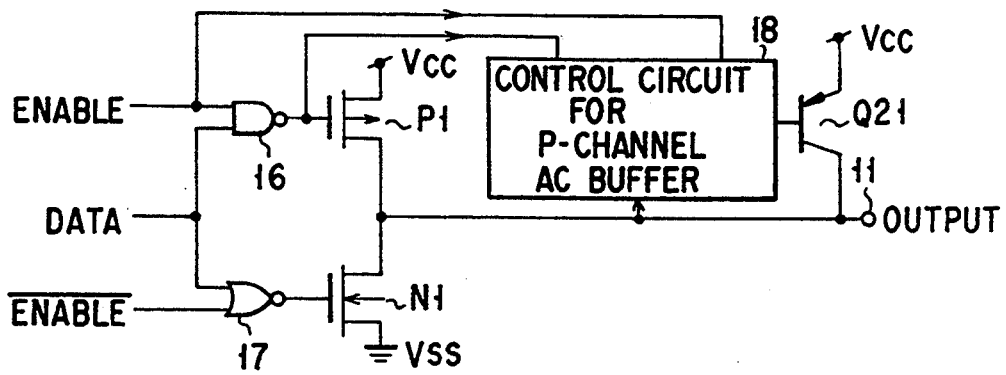
F I G. 48
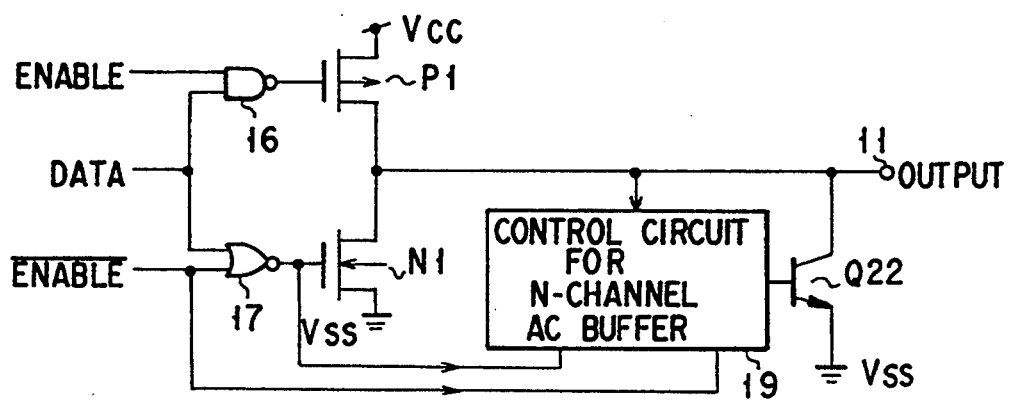
F I G. 49

OUTPUT BUFFER CIRCUIT HAVING A DC DRIVER AND AN AC DRIVER

BACKGROUND OF THE INVENTION

1. Field of the Invention

The present invention relates to a signal output circuit formed in a semiconductor integrated circuit and, more particularly, to a signal output circuit capable of suppressing power supply noise generated when an output signal is changed and suppressing leakage of the power supply noise to an output node.

2. Description of the Related Art

In a semiconductor integrated circuit, when the output from an output buffer circuit is to be changed, an increase or decrease in power supply potential or ground potential is caused by an induced electromotive voltage determined by a product "L×di/dt" where L is an inductance of a power supply line or a ground line and di/dt is a rate of change in output current. These potential variations become power noise to be transmitted to an output node through a transistor constituting part of the output buffer circuit to cause output noise. Especially, when a plurality of output buffers perform switching operations simultaneously, the output noise is increased to cause problems. Such noise is called simultaneous switching noise (SSN).

Recently, as the micropatterning size of a semiconductor element is decreased to increase the operation speed, the potential variations are increased. Then, the SSN causes an erroneous operation of a circuit in the same integrated circuit or of an input circuit of other integrated circuit to which the output from the output buffer circuit is input. Especially, when outputs from a plurality of output buffer circuits of the same integrated circuit vary simultaneously, the potential variations become very large, posing a very serious problem.

Conventionally, in order to minimize the potential variation in the power supply or the output as described above, efforts have been made to decrease the inductance L of the power supply line or the ground line, or to decrease the rate of change di/dt in output current. The inductance L, however, is determined by the length of the lead frame of the package of the integrated circuit or the bonding wire, and it is not easy to shorten the lead frame or the bonding wire. Also, the speed of an output signal (a rise time tr or a fall time tv) and a propagation delay time tpd of a signal propagation line are normally defined as the design specifications. When di/dt is decreased, tr and tv, and thus tpd are increased, and the specified values cannot be satisfied. In other words, in order to increase the speed of the output signal, the output current of the output buffer circuit must be increased. When the speed of the output signal is determined, the lower limit of the di/dt is determined. Hence, the di/dt cannot be simply decreased, and it is difficult to minimize the potential variation.

Generally, the specifications of the output current of a signal output circuit include AC specifications (determined in accordance with the speed of the output signal) and DC specifications (a source current $I_{OH}$ and a sink current $I_{OL}$ when the output is stationary). In an integrated circuit having high-speed specifications, when the output current is determined in accordance with the AC specifications, the DC specifications are often automatically satisfied. When the output currents ($I_{OH}$, $I_{OL}$) of the DC specifications of the output buffer circuit are automatically determined from the AC specifications, the output resistance (an ON resistance $R_{ON}$) when the output is stationary is also automatically determined. Assume that the output buffer circuit is a CMOS inverter comprising a p-channel MOS transistor and an n-channel MOS transistor. When the input signal is at Vcc level (potential of the high potential-side power supply), the p-channel MOS transistor is turned off, and the n-channel MS transistor is turned on. The ON resistance $R_{ON}(=V_{OL}/I_{OL})$ of the n-channel MOS transistor is determined by an output potential $V_{OL}$ at "L" level and the sink current $I_{OL}$ at this time. When the input signal is at Vss level (potential of the low potential-side power supply; ground potential), the n-channel MOS transistor is turned off, and the p-channel MOS transistor is turned on. The ON resistance $R_{ON}$ $(=\{(Vcc-V_{OH})/I_{OH})$ of the p-channel MOS transistor is determined by an output potential $V_{OH}$ at "H" level and the source current $I_{OH}$ at this time.

When the output from the signal output circuit is changed, the level of the output noise appears as a bounce quantity $\Delta E_B$ of the power supply potential or the ground potential divided by a rate of the ON resistance $R_{ON}$ of the signal output circuit to a load impedance Z of the output node. When the load impedance Z is a capacitive load (i.e., a capacitance $C_L$), output noise $V_{OLP}$ when the output is at "L" level becomes substantially $\Delta E_B/(1+S \cdot /C_L \cdot R_{ON})$, and the higher the $R_{ON}$, the lower the $V_{OLP}$. The fact that the ON resistance $R_{ON}$ is automatically determined by the AC specifications of the output buffer circuit, as described above, means that when the speed of the output signal is determined, the lower limit of the output noise $V_{OLP}$ is determined. This applies to output noise $V_{OHV}$ when the output is at "H" level.

As described above, in the conventional output buffer circuit, since the ON resistance $R_{ON}$, which is automatically determined from the AC specifications of the output buffer circuit, is low when compared to that determined only from the DC specifications, a variation in the power supply potential or the ground potential when the output is changed can easily adversely affect the output node, and the output noise $V_{OLP}$ or $V_{OHV}$ tends to be unpreferably increased.

SUMMARY OF THE INVENTION

It is, therefore, an object of the present invention to provide an output buffer circuit which has an output resistance automatically determined from AC specifications when an output is changed and a relatively large output resistance determined only from DC specifications when the output is stationary, in which a variation in a power supply potential or a ground potential when the output is changed does not easily adversely affect an output node, and which can suppress output noise.

According to the characteristic feature of the present invention, an output buffer circuit of the present invention includes first and second output buffers respectively having output nodes that are wired-OR-connected to each other, and a control circuit for controlling the output nodes of the first and second output buffers at the high-impedance state on the basis of a control signal, driving the second output buffer when the output from the first output buffer is changed, and controlling the output from the second output buffer at the high impedance state when the output from the first output buffer is stationary.

The first output buffer is set to have an output resistance which is determined only from the DC specifications, and the characteristics of the second output buffer are designed to satisfy the AC specifications when the two output buffers are driven simultaneously. Then, when the output is changed, the two output buffers are simultaneously driven to satisfy the AC specifications, and when the output from the first output buffer is stationary, only the first output buffer is driven to satisfy the DC specifications. As a result, although the variation in power supply potential or the ground potential upon a change in output level is the same as in the conventional output buffer circuit, since the output resistance obtained when the output is stationary is higher than that in the conventional output buffer circuit, the variation in the power supply potential or the ground potential does not easily adversely affect the output node, and the output noise is suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of an output buffer circuit according to the present invention;

FIGS. 2A to 2F are circuit diagrams showing a control sequence for an AC buffer circuit by a control circuit shown in FIG. 1;

FIGS. 3A to 3L are circuit diagrams showing another control sequence for the AC buffer circuit by the control circuit shown in FIG. 1;

FIGS. 4A to 4D are circuit diagrams showing a control sequence for an AC buffer circuit by a modification of the control circuit shown in FIG. 1;

FIGS. 5A to 5F are circuit diagrams showing another control sequence for the AC buffer circuit by a modification of the control circuit of FIG. 1;

FIGS. 6A to 6C are circuit diagrams showing a control sequence for the AC buffer circuit by the control circuit of the output buffer circuit of the present invention;

FIGS. 7A to 7C are circuit diagrams showing another control sequence for the AC buffer circuit by the control circuit of the output buffer circuit of the present invention;

FIGS. 8A to 8C are circuit diagrams showing still another control sequence for the AC buffer circuit by the control circuit of the output buffer circuit of the present invention;

FIGS. 9A to 9C are circuit diagrams showing still another control sequence for the AC buffer circuit by the control circuit of the output buffer circuit of the present invention;

FIG. 10 is a circuit diagram showing an arrangement of an output buffer circuit according to the first embodiment of the present invention which has a control circuit which performs control in accordance with the sequence of FIGS. 2A to 2F;

FIG. 12 is a circuit diagram of an output buffer circuit according to the second embodiment of the present invention;

FIGS. 13A to 13D are circuit diagrams showing a control sequence for the AC buffer circuit by the control circuit of the circuit shown in FIG. 12;

FIG. 14 is a waveform chart of the circuit shown in FIG. 12;

FIG. 15 is a circuit diagram showing a modification of FIG. 10;

FIG. 16 is a circuit diagram showing another modification of FIG. 10;

FIG. 17 is a circuit diagram showing still another modification of FIG. 10;

FIG. 18 is a circuit diagram showing still another modification of FIG. 10;

FIG. 20 is a circuit diagram showing still another modification of FIG. 10;

FIG. 21 is a circuit diagram showing still another modification of FIG. 10;

FIG. 22 is a circuit diagram showing still another modification of FIG. 10;

FIG. 25 is a circuit diagram showing still another modification of FIG. 10;

FIG. 26 is a circuit diagram showing a modification of FIG. 12;

FIG. 27 is a circuit diagram showing another modification of FIG. 12;

FIG. 30 is a circuit diagram showing still another modification of FIG. 12;

FIG. 31 is a circuit diagram showing still another modification of FIG. 12;

FIG. 32 is a circuit diagram showing still another modification of FIG. 12;

FIG. 33 is a circuit diagram showing still another modification of FIG. 12;

FIG. 35 is a circuit diagram showing still another modification of FIG. 12;

FIG. 39 is a circuit diagram showing another modification of FIG. 37;

FIG. 40 is a circuit diagram showing still another modification of FIG. 37;

FIG. 42 is a circuit diagram showing still another modification of FIG. 37;

FIG. 43 is a circuit diagram showing still another modification of FIG. 37;

FIG. 44 is a circuit diagram showing still another modification of FIG. 37;

FIG. 46 is a circuit diagram showing still another modification of FIG. 37;

FIG. 47 is a circuit diagram of an output buffer circuit according to the fourth embodiment of the present invention;

FIG. 48 is a circuit diagram of an output buffer circuit according to the fifth embodiment of the present invention; and FIG. 49 is a circuit diagram of an output buffer circuit according to the fifth embodiment of the present invention.

DETAILED DESCRIPTION OF THE PREFERRED EMBODIMENTS

Figure 11:
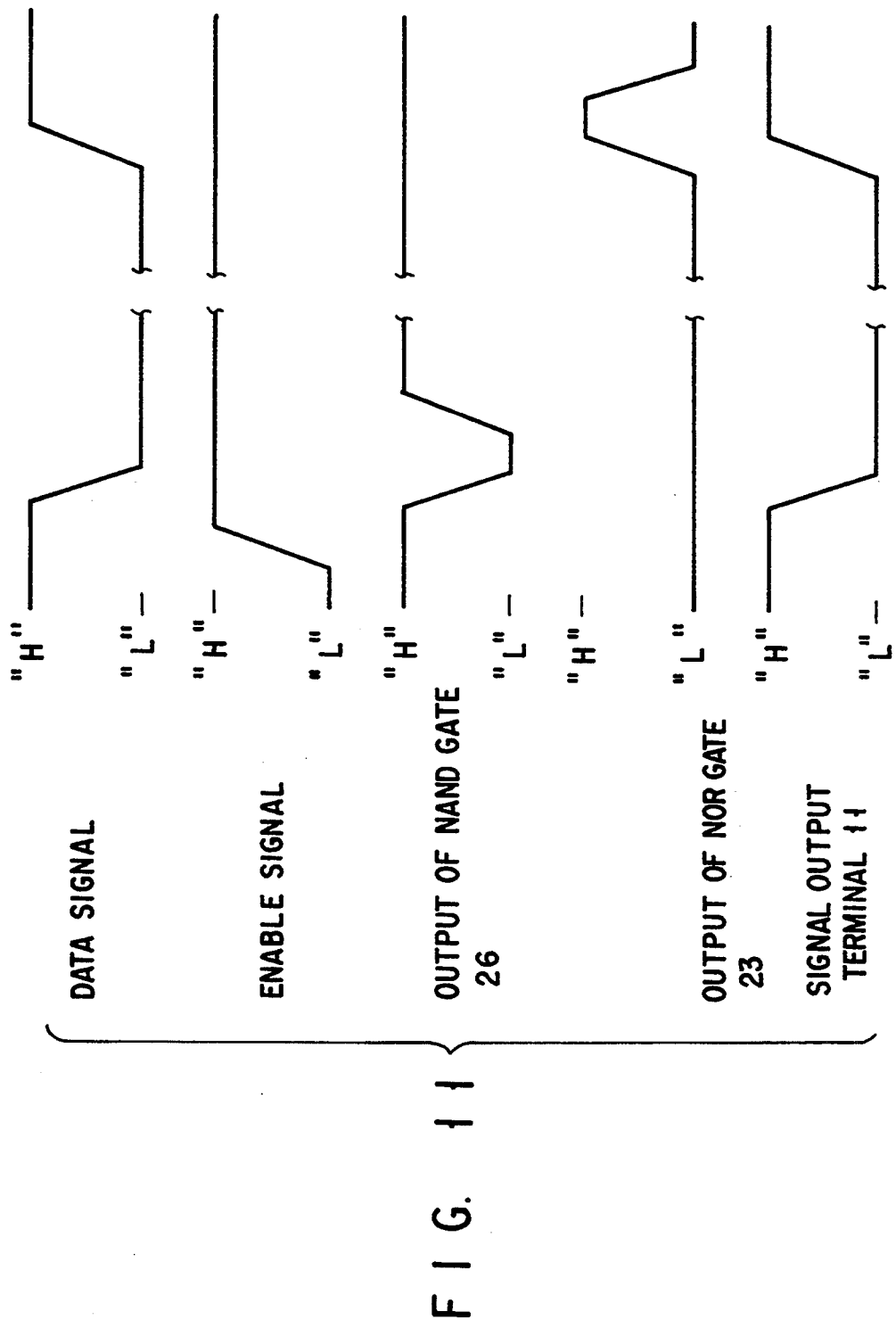
FIG. 11 is a timing chart showing an operation of the circuit shown in FIG. 10.

The preferred embodiments of the present invention will be described with reference to the accompanying drawings.

FIG. 1 is a block diagram of an output buffer circuit according to the present invention.

The output buffer circuit of FIG. 1 has a signal output terminal 11, a first output buffer (to be referred to as a DC buffer hereinafter) 12 having an output node connected to the signal output terminal 11, a second output buffer (to be referred to as an AC buffer hereinafter) 13 having an output node connected to the signal output terminal 11, a first control circuit (to be referred to as a tristate control circuit hereinafter) 14 for controlling the DC buffer 12, and a second control circuit (to be referred to as an AC buffer control circuit hereinafter) 15 for controlling the AC buffer 13.

The DC buffer 12 has a p-channel MOS transistor P1 and an n-channel MOS transistor N1. The p-channel MOS transistor P1 has a source connected to a power supply node to which a positive power supply potential Vcc is applied, and a drain connected to the signal output terminal 11 serving as the output node. The n-channel MOS transistor N1 has a source connected to the ground node to which a ground potential Vss as the 0V reference potential is applied, and a drain connected to the signal output terminal 11. In this DC buffer 12, the characteristics of the p- and n-channel MOS transistors P1 and N1 are set so that the DC buffer 12 has an output resistance $R_{ON}$ determined from only the DC specifications of the output buffer circuit as a whole.

The AC buffer 13 has a p-channel MOS transistor P2 and an n-channel MOS transistor N2. The p-channel MOS transistor P2 has a source connected to the power supply node, and a drain connected to the signal output terminal 11. The n-channel MOS transistor N2 has a source connected to the ground node, and a drain connected to the signal output terminal 11. In this AC buffer 13, the characteristics of the p- and n-channel MOS transistors P2 and N2 are set to satisfy the AC specifications of the output buffer circuit as a whole when the AC buffer 13 is driven simultaneously with the DC buffer 12.

The tristate control circuit 14 has a two-input NAND gate 16 for receiving a data signal DATA and a control signal ENABLE for controlling the data signal DATA and the output therefrom at the high-impedance state, and a two-input NOR gate 17 for receiving the data signal DATA and an inverted signal $\overline{\text{ENABLE}}$ of the control signal ENABLE. The output signal from the NAND gate 16 is supplied to the gate of the p-channel MOS transistor P1, and the output signal from the NOR gate 17 is supplied to the gate of the n-channel MOS transistor N1.

The AC buffer control circuit 15 has a control circuit 18 for the p-channel AC buffer and a control circuit 19 for the n-channel AC buffer. The control circuit 18 for the p-channel AC buffer controls the p-channel MOS transistor P2 in the AC buffer 13. The control circuit 19 for the n-channel AC buffer controls the n-channel MOS transistor N2 in the AC buffer 13. The control circuits 18 and 19 perform control so that the p- or n-channel MOS transistor P2 or N2 in the AC buffer 13 is temporarily turned on only during an output state transition wherein the logic level of the signal from the signal output terminal 11 changes.

The control signal ENABLE, the output signal from the NAND gate 16, and the signal at the signal output terminal 11 are input to the control circuit 18 for the p-channel AC buffer, and the output signal from the control circuit 18 for the p-channel AC buffer is supplied to the gate of the p-channel MOS transistor P2. The inverted signal $\overline{\text{ENABLE}}$, the output signal from the NOR gate 17, and the signal at the signal output terminal 11 are input to the n-channel AC buffer control circuit 19, and the output signal from the control circuit 19 for the n-channel AC buffer is supplied to the gate of the n-channel MOS transistor N2.

The operation of the output buffer circuit described above will be described. When the control signal ENABLE is at "H" level and the inverted signal $\overline{\text{ENABLE}}$ is at "L" level, this output buffer circuit is set in the operative enable state. In this enable state, the logic level of the data signal DATA is changed, the p- or n-channel MOS transistor P1 or N1 in the DC buffer 12 is driven by the tristate buffer control circuit 14. When the output signal from the DC buffer 12 is changed, the p- and n-channel MOS transistors P2 and N2 in the AC buffer 13 are driven simultaneously or almost simultaneously by the AC buffer control circuit 15 to satisfy the AC specifications.

When the data signal is stationary, the output signal from the DC buffer 12 is also stationary, the p- and n-channel MOS transistors P2 and N2 in the AC buffer 13 are set in the high-resistance or OFF state, and the output from the AC buffer 13 is set in the hi-impedance state. When the data signal is stationary, in this manner, only the DC buffer 12 is driven to satisfy the DC specifications. As a result, even if the variation in the power supply potential Vcc or ground potential Vss upon a change in output stays at the same level as in the conventional case, since the output resistance $R_{ON}$ obtained when the output is stationary is higher than in the conventional case, the variation in the power supply potential Vcc or ground potential Vss will not easily adversely affect the signal output terminal 11, thereby suppressing the output noise.

Various sequences of controlling the AC buffer 13 by the AC buffer control circuit 15 will be described.

FIGS. 2A to 2F show a change in connection (control) of a gate node G1 and a gate node G2 of the p- and channel MOS transistors P2 and N2, respectively, obtained when the output from the AC buffer 13 is changed from "H" level (potential Vcc) to the "L"

level (ground potential Vss) and then to "H" level again. Note that at this time the output from the DC buffer 12 is also changed from "H" to "L" level and then to the "H" level again.

More specifically, when the signal output terminal 11 is stationary at "H" level, the gate node G1 is connected to the signal output terminal 11 to set the p-channel MOS transistor P2 in the OFF state and the gate node G2 is connected to the potential Vss to set the n-channel MOS transistor N2 in the OFF state, as shown in FIG. 2A, so that the output from the AC buffer 13 is set in the high-impedance state.

when the signal output terminal 11 is to be changed from "H" to "L" level, the data signal DATA is changed from "H" to "L" level. Simultaneously, the gate node G1 is connected to the potential Vcc to set the p-channel MOS transistor P2 in the OFF state, as shown in FIG. 2B, and the gate node G2 is connected to the potential Vcc to set the n-channel MOS transistor N2 in the ON state, as shown in FIG. 2C, so that the current intake capability of the signal output terminal 11 is increased. In this case, if generation of the through current between the potential Vcc and the potential Vss and a decrease in operation speed results, the gate node G1 may be kept in the state of FIG. 2A until an intermediate point while the signal output terminal 11 is changed to "L" level by the output from the DC buffer 12 or until an intermediate point while the signal output terminal 11 is changed to "L" level by the n-channel MOS transistor N2. This is accomplished by temporarily setting the p-channel MOS transistor P2 in an ON state, and then connecting the gate node G1 to the potential $V_{cc}$ to set the p-channel MOS transistor P2 in the OFF state.

During or after this change of the signal output terminal 11 from "H" to "L" level, the gate node G2 is connected to the signal output terminal 11 to set the n-channel MOS transistor N2 in the OFF state, as shown in FIG. 2D. Therefore, when the signal output terminal 11 is stationary at "L" level, the gate node G1 is connected to the potential Vcc to set the p-channel MOS transistor P2 in the OFF state and the gate node G2 is connected to the signal output terminal 11 to set the n-channel MOS transistor N2 in the OFF state, as shown in FIG. 2D, so that the output from the AC buffer 13 is set in the high-impedance state.

When the signal output terminal 11 is to be changed from "L" to "H" level, the data signal DATA is changed from "L" to "H", and simultaneously the gate node G2 is connected to the potential Vss to set the n-channel MOS transistor N2 in the OFF state, as shown in FIG. 2E. Furthermore, the gate node G1 is connected to the potential Vss to set the p-channel MOS transistor P2, as shown in FIG. 2F, so that the current discharge capability of the signal output terminal 11 is increased. In this case, if generation of the through current between the potential Vcc and the potential Vss and a decrease in operation speed results, the gate node G2 may be kept in the state of FIG. 2D until an intermediate point while the signal output terminal 11 is changed to "H" level by the output from the DC buffer 12 or until an intermediate point while the signal output terminal 11 is changed to "H" level by the p-channel MOS transistor P2. This is accomplished by temporarily setting the n-channel MOS transistor N2 in an ON state, and then connecting the gate node G2 to the potential $V_{ss}$ to set the n-channel MOS transistor N2 in the OFF state.

During or after this change of the signal output terminal 11 from "L" to "H" level, the gate node G1 is connected to the signal output terminal 11 to set the p-channel MOS transistor P2 in the OFF state, as shown in FIG. 2A. Therefore, when the signal output terminal 11 is stationary at "H" level, the gate node G1 is connected to the signal output terminal 11 to set the p-channel MOS transistor P2 in the OFF state and the gate node G2 is connected to the potential Vss to set the n-channel MOS transistor N2 in the OFF state, as shown in FIG. 2A, so that the output from the AC buffer 13 is set in the high-impedance state.

When the signal output terminal 11 is stationary at "L" or "H" level (the output from the AC buffer 13 is in the high-impedance state), even if the potential of the signal output terminal 11 temporarily fluctuates to the potential Vcc or the potential Vss, since the p-channel MOS transistor P2 and the n-channel MOS transistor N2 are diode-connected to be reverse-biased, the potential of the signal output terminal 11 will not be affected. Also, the variation in the potential Vcc or potential Vss can hardly be unpreferably transmitted to the signal output terminal 11 through a junction diode formed by a semiconductor body (n type) and a p-type impurity region in which the p-channel MOS transistor P2 is formed or a junction diode formed by a semiconductor body (p type) and an n-type impurity region in which the n-channel MOS transistor N2 is formed. This is because the potential variation is transmitted to the signal output terminal 11 through the DC buffer 12 to slightly change the level of the signal output terminal 11, and thus the junction diodes will not be forward-biased.

Overshooting of the potential Vcc or undershooting of the potential Vss will not be unpreferably transmitted to the signal output terminal 11 unless its amplitude exceeds the absolute value of the threshold voltage of the p- or n-channel MOS transistor P2 or N2 of the AC buffer 13.

If a difference ($V_{OL}$) between the "L"-level potential of the signal output terminal 11 and the potential Vss is equal to or less than the threshold voltage of the n-channel MOS transistor N2 of the AC buffer 13 and if a difference (Vcc-$V_{OH}$) between the potential Vcc and the "H"-level potential of the signal output terminal 11 is equal to or less than the absolute value of the threshold voltage of the p-channel MOS transistor P2 of the AC buffer 13, the output current is determined by only the DC buffer 12. If the difference ($V_{OL}$) between the "L"-level potential of the signal output terminal 11 and the potential Vss exceeds the threshold voltage of the n-channel MOS transistor N2 of the AC buffer 13 and if the difference (Vcc-$V_{OH}$)) between the potential Vcc and the "H"-level potential of the signal output terminal 11 exceeds the absolute value of the threshold voltage of the p-channel MOS transistor P2 of the AC buffer 13, the AC buffer 13 is also operated, and thus the resistance to noise input to the signal output terminal 11 becomes high.

FIGS. 3A to 3F show another change in connection (control) of the gate nodes G1 and G2 of the p- and n-channel MOS transistors P2 and N2, respectively, when the output from the AC buffer 13 is changed from "H" to "L" level and then to "H" level again. Note that the output from the DC buffer 12 is also changed from "H" to "L" level and then to "H" level again.

FIGS. 3A to 3F are different from FIGS. 2A to 2F in the following points. That is, a p-channel MOS transistor P3 having a source and a gate connected to each other is inserted between the gate node G1 and the signal output terminal 11 when the AC buffer is in the state shown in FIG. 3A, and an n-channel MOS transistor N3 having a gate and a source connected to each other is inserted between the signal output terminal 11 and the gate node G2 when the AC buffer is in the state shown in FIG. 3D.

When the AC buffer is controlled as shown in FIGS. 3A to 3F, it is effective for use at a lower power supply voltage. The reason for this will be described below. That is, when the AC buffer is set in the state shown in FIG. 2D, as the potential of the signal output terminal 11 is decreased to "L" level, the drive power of the n-channel MOS transistor N2 is also decreased. In contrast to this, when the AC buffer is set in the state shown in FIG. 3D, as the potential of the signal output terminal 11 is decreased to "L" level, the potential of the gate node G2 is increased at least by the threshold voltage of the n-channel MOS transistor N3, and the drive power of the n-channel MOS transistor N2 is maintained.

When the AC buffer is set in the state shown in FIG. 2A, as the potential of the signal output terminal 11 is increased to "H" level, the drive power of the p-channel MOS transistor P2 is decreased. However, when the AC buffer is set in the state shown in FIG. 3A, as the potential of the signal output terminal 11 is increased to "H" level, the potential of the gate node G1 is decreased at least by the absolute value of the threshold voltage of the p-channel MOS transistor P3, and the drive power of the p-channel MOS transistor P2 is maintained.

As still another control sequence of FIGS. 2A to 2F, only FIG. 2A may be changed as shown in FIG. 3A, or only FIG. 2D may be changed as shown in FIG. 3D.

In the control sequence shown in FIGS. 2A to 2F, the gate node G2 is connected to the potential Vcc when the AC buffer is in the state shown in FIG. 2C. However, at this time, the gate node G2 may be connected to another potential in place of the potential Vcc to set the n-channel MOS transistor N2 in the ON state. Also, the gate node G1 is connected to the potential Vss when the AC buffer is in the state shown in FIG. 2F. However, at this time, the gate node G1 may be connected to another potential in place of the potential Vss to set the p-channel MOS transistor P2 in the ON state. When the potential of the signal output terminal 11 is used as this another potential, the AC buffer is shifted from the state shown in FIG. 2B to the state shown in FIG. 2D, and then from the state shown in FIG. 2E to the state shown in FIG. 2A. The changes in circuit state of this case are shown in FIGS. 4A to 4D.

Similarly, in the control sequence shown in FIGS. 3A to 3F, the gate node G2 is connected to the potential Vcc when the AC buffer is in the state shown in FIG. 3C. However, at this time, the gate node G2 may be connected to another potential in place of the potential Vcc to set the n-channel MOS transistor N2 in the ON state. Also, the gate node G1 is connected to the potential Vss when the AC buffer is in the state shown in FIG. 3F. However, at this time, the gate node G1 may be connected to another potential in place of the potential Vss to set the p-channel MOS transistor P2 in the ON state. When the potential of the signal output terminal 11 is used as this another potential, the AC buffer is shifted from the state shown in FIG. 3B to the state shown in FIG. 3D, and then from the state shown in FIG. 3E to the state shown in FIG. 3A. The change in circuit state of this case is shown in FIGS. 5A to 5F.

In the control sequences described above, when the output is changed from "H" to "L" level or vice versa, the output resistance is decreased. However, if the output resistance need be decreased only when the output is changed from "H" to "L" level, the AC buffer comprising the n-channel MOS transistor N2 connected between the signal output terminal 11 and the potential Vss may be used, and the AC buffer control circuit may be formed to control only the n-channel MOS transistor N2. Also, if the output resistance need be decreased only when the output is changed from "L" to "H" level, the AC buffer comprising the p-channel MOS transistor P2 connected between the potential Vcc and the signal output terminal 11 may be used, and the AC buffer control circuit may be formed to control only the p-channel MOS transistor P2.

Referring to FIG. 3A, since the p-channel MOS transistor P3 has the source and gate connected to each other serves as a diode element, it can be replaced by other arrangements as follows.

In FIG. 3G, a p-n junction diode D1 is provided. In FIG. 3H, an npn transistor Q11 having a base and a collector connected to each other is provided.

In FIG. 3I, a pnp transistor Q12 having a base and a collector connected to each other is provided.

Furthermore, referring to FIG. 3D, since the n-channel MOS transistor N3 having the gate and source connected to each other also serves as a diode element, it can be replaced by other arrangements as follows.

In FIG. 3J, a p-n junction diode D2 is provided.

In FIG. 3K, a pnp transistor Q13 having a base and a collector connected to each other is provided.

In FIG. 3L, an pnp transistor Q14 having a base and a collector connected to each other is provided.

FIGS. 6A to 6C and FIGS. 7A to 7C show control sequences to control the gate node G2 of the n-channel MOS transistor N2 when the n-channel MOS transistor N2 connected between the signal output terminal 11 and the potential Vss is used as the AC buffer 13.

FIGS. 6A, 6B, and 6C correspond to FIGS. 2A, 2C, and 2D, and FIGS. 7A, 7B, and 7C correspond to FIGS. 3A, 3C, and 3D.

FIGS. 8A to 8C and FIGS. 9A to 9C show control sequences to control the gate node G1 of the p-channel MOS transistor P2 when the p-channel MOS transistor P2 connected between the potential Vcc and the signal output terminal 11 is used as the AC buffer 13. FIGS. 8A, 8B, and 8C correspond to FIGS. 2A, 2B, and 2F, and FIGS. 9A, 9B, and 9C correspond to FIGS. 3F, 3A, and 3B.

FIG. 10 is a circuit diagram of an AC buffer control circuit 15 according to the first embodiment of the present invention showing, i.e., the practical arrangement of p- and n-channel AC buffer control circuits 18 and 19, that performs control as shown in FIGS. 2A to 2F, together with a DC buffer 12, an AC buffer 13, and a tristate buffer control circuit 14.

The p-channel AC buffer control circuit 18 comprises four p-channel MOS transistors P11 to P14, one n-channel MOS transistor N11, a signal delay circuit 21, an inverter 22, and a two-input NOR gate 23.

The source-drain path of the n-channel MOS transistor N11 is inserted between the gate node and the ground potential Vss of the p-channel MOS transistor P2. The source-drain paths of the two p-channel MOS transistors P11 and P12 are connected in series between the signal output terminal 11 and the gate node of the p-channel MOS transistor P2. The source-drain paths of the two p-channel MOS transistors P13 and P14 are connected in parallel with each other between the gate node of the p-channel MOS transistor P2 and the power supply potential Vcc.

The output from the NAND gate 16 is supplied to the signal delay circuit 21. The output from the signal delay circuit 21 is supplied to the inverter 22. The output from the inverter 22 is supplied to the NOR gate 23 together with the output from the NAND gate 16. The output from the NOR gate 23 is supplied to the gates of the p-channel MOS transistors P11 and P14 and the gate of the n-channel MOS transistor N11. The output from the NAND gate 16 is also supplied to the gate of the p-channel MOS transistor P12, and the control signal ENABLE is supplied to the gate of the p-channel MOS transistor P13.

The n-channel AC buffer control circuit 19 comprises four n-channel MOS transistors N21 to N24, one p-channel MOS transistor P21, a signal delay circuit 24, an inverter 25, and a two-input NAND gate 26.

The source-drain path of the p-channel MOS transistor P21 is connected between the gate node of the n-channel MOS transistor N2 and the power supply potential Vcc. The source-drain paths of the two n-channel MOS transistors N21 and N22 are connected in series between the signal output terminal 11 and the gate node of the n-channel MOS transistor N2. The source-drain paths of the two n-channel MOS transistors N23 and N24 are connected in parallel with each other between the gate node of the n-channel MOS transistor N2 and the ground potential Vss.

The output from the NOR gate 17 is supplied to the signal delay circuit 24. The output from the signal delay circuit 24 is supplied to the inverter 25. The output from the inverter 25 is supplied to the NAND gate 26 together with the output from the NOR gate 17. The output from the NAND gate 26 is supplied to the gates of the n-channel MOS transistors N21 and N24 and the gate of the p-channel MOS transistor P21. The output from the NOR gate 17 is also supplied to the gate of the n-channel MOS transistor N22, and the control signal ENABLE is supplied to the gate of the n-channel MOS transistor N23.

An operation of the AC buffer control circuit 15 for changing the signal output terminal 11 from "H" to "L" level and then to "H" level again, as shown in FIGS. 2A to 2F, in the circuit shown in FIG. 10 will be described with reference to the timing chart of FIG. 11.

Assume that the control signal ENABLE is set at "H" level (the control signal $\overline{\text{ENABLE}}$ is set at "L" level). When the data signal DATA is stationary at "H" level, the outputs from the NAND gate 16 and NOR gate 17 of the DC buffer control circuit 14 are both at "L" level, and since the p- and n-channel MOS transistors P1 and N1 are set in the ON and OFF states, respectively, in the DC buffer 12, the signal output terminal 11 is stationary at "H" level.

In the AC buffer control circuit 15, the outputs from the NOR and NAND gates 23 and 24 are at "L" and "H" levels, respectively. In this state, the p-channel MOS transistor P11 is set in the ON state by the output from the NOR gate 23, and the DC buffer 12 is also set in the ON state by the output from the NAND gate 16. Thus, the "H" level of the signal output terminal 11 is supplied to the gate node of the p-channel MOS transistor P2 through the MOS transistors P11 and P12, and thus the p-channel MOS transistor P2 is set in the OFF state. At this time, the p-channel MOS transistor P14 is also set in the ON state.

While the n-channel MOS transistor N21 is set in the ON state by the output from the NAND gate 26, the n-channel MOS transistor N22 is set in the OFF state by the output from the NOR gate 17. Since the n- and p-channel MOS transistors N24 and P21 are set in the ON and OFF states, respectively, by the output from the NAND gate 26, the level of the potential Vss is supplied to the gate node of the n-channel MOS transistor N2 through the MOS transistor N24. Accordingly, in this state, a circuit state as shown in FIG. 2A is formed.

When the data signal DATA is changed from "H" to "L" state, the outputs of the NAND and NOR gates 16 and 17 of the DC buffer control circuit 14 are both inverted from "L" to "H" level. Thus, the n-channel MOS transistor N1 is turned on, and the signal output terminal 11 is inverted to "L" level.

Since the output from the NOR gate 23 is stationary at "L" level and does not change in the AC buffer control circuit 15, the p-channel MOS transistor P14 is kept ON, and the gate node G1 of the p-channel MOS transistor P2 is connected to the potential Vcc, as shown in FIG. 2B. Also, the output from the NAND gate 26 is inverted from "H" to "L" level to turn on the p-channel MOS transistor P21. As a result, the gate node G2 of the n-channel MOS transistor N2 is connected to the potential Vcc, as shown in FIG. 2C.

When a delay time set by the signal delay circuit 24 has elapsed, the outputs from the inverter 25 and the NAND gate 26 are inverted to "L" and "H" levels, respectively. Thus, the n- and p-channel MOS transistors N21 and P21 are turned on and off, respectively. At this time, the inverter 22 is set in the ON state in advance by the output from the NOR gate 17. Thus, a circuit state as shown in FIG. 2D is set.

When the data signal DATA is changed from "L" to "H" level, the outputs from the NAND and NOR gates 16 and 17 are set to "L" level again, the p- and n-channel MOS transistors P1 and N1 are turned on and off, respectively, and the signal output terminal 11 is inverted to "L" level.

Meanwhile, the n-channel MOS transistor N22 is turned off by the output from the NOR gate 17, and the gate node of the n-channel MOS transistor N2 is connected to the potential Vss through the MOS transistor N22, as shown in FIG. 2E.

The p- and n-channel MOS transistors P14 and N11 are turned off and on, respectively, by the output from the NOR gate 23, the gate node of the p-channel MOS transistor P2 is connected to the potential Vss, and a circuit state as shown in FIG. 2F is set.

When a delay time set by the signal delay circuit 21 has elapsed, the outputs from the inverter 22 and the NOR gate 23 are inverted to "H" and "L" levels, respectively, and the n-channel MOS transistor N11 is turned off to set a circuit state as shown in FIG. 2A.

FIG. 12 is a circuit diagram showing the configuration of a signal output circuit according to the second embodiment of the present invention. FIG. 12 shows a practical arrangement of an AC buffer control circuit 15 together with a DC buffer 12, an AC buffer 13, and a tristate buffer control circuit 14.

The circuit shown in FIG. 12 is different from that of FIG. 10 in the following respects. That is, the source-drain path of an n-channel MOS transistor N12 is connected between the source of the n-channel MOS transistor N11 and a ground potential Vss, the source-drain path of a p-channel MOS transistor P22 is connected between the source of a p-channel MOS transistor P21 and the power supply potential Vcc, and inverters 27 and 28 are provided in place of the NOR and NAND gates 23 and 26.

The output from the NAND gate 16 is supplied to the inverter 27. The output from the inverter 27 is supplied to the signal delay circuit 21. The output from the signal delay circuit 21 is supplied to the inverter 22. The output from the inverter 27 is also supplied to the gates of the p- and n-channel MOS transistors P14 and N11, and the output from the inverter 22 is supplied to the gates of the p- and n-channel MOS transistors P11 and N12. The output from the NOR gate 17 is supplied to the inverter 28. The output from the inverter 28 is supplied to the signal delay circuit 24. The output from the signal delay circuit 24 is supplied to the inverter 25. The output from the inverter 28 is also supplied to the gates of the n- and p-channel MOS transistors N24 and P21, and the output from the inverter 25 is supplied to the gates of the n- and p-channel MOS transistors N21 and P22.

A schematic operation of the circuit having the arrangement described above obtained when the control signal ENABLE is at "H" level and the data signal DATA is changed from "H" to "L" level will be described with reference to the equivalent circuit diagrams of FIGS. 13A to 13D and the waveform chart of FIG. 14.

When the data signal DATA is stable at "L" level, the output signals from the NAND and NOR gates 16 and 17 are both at "L" level. At this time, the gate of the p-channel MOS transistor P2 is connected to the signal output terminal 11, and the gate of the n-channel MOS transistor N2 is connected to the ground potential Vss. Accordingly, the equivalent circuit of FIG. 12 obtained in this state is as shown in FIG. 13A. At this time, only the p-channel MOS transistor P1 is turned on, and the signal at the signal output terminal 11 is set to "H" level, as shown in a region (a) of FIG. 14.

When the data signal DATA is changed from "H" to "L" level, the output signals from the NAND and NOR gates 16 and 17 are inverted to "H" level. Thus, the p- and n-channel MOS transistors P1 and N1 are inverted from the ON to OFF state and from the OFF to ON state, respectively. At this time, although the gate node of the p-channel MOS transistor P2 is changed to the potential Vcc, the p-channel MOS transistor P2 is kept off and does not change. The n-channel MOS transistor N2 is kept off, and electric discharge is performed at the signal output terminal 11 only by the n-channel MOS transistor N1. Therefore, the equivalent circuit of FIG. 12 obtained in this state is as shown in FIG. 13B, and the signal at the signal output terminal 11 starts to decrease from "H" to "L" level, as shown in a region (b) of FIG. 14.

In the conventional circuit, the output is changed from "H" to "L" level in this region (b) by an n-channel MOS transistor having a large dimension corresponding to the sum of the dimensions of the n-channel MOS transistors N1 and N2. Therefore, in the conventional circuit, the rate of change di/dt in output current is increased in the region (b) to increase the ground bounce. However, in the circuit of this embodiment, since electric discharge is performed at the signal output terminal 11 only by the n-channel MOS transistor N1, the ground bounce can be suppressed.

When a predetermined period of time has elapsed after the data signal DATA is changed to "L" level, the gate of the n-channel MOS transistor N2 which has been connected to the ground potential Vss is switched to the signal output terminal 11. Therefore, electric discharge is performed at the signal output terminal 11 by the n-channel MOS transistors N1 and N2. Accordingly, the equivalent circuit of FIG. 12 obtained in this state is as shown in FIG. 13C, and the level at the signal output terminal 11 is rapidly decreased from "H" to "L" level, as shown in a region (c) of FIG. 14.

As the level at the signal output terminal 11 approaches "L" level, the n-channel MOS transistor N2 is shifted from the ON to OFF state. Accordingly, the equivalent circuit of FIG. 12 obtained in this state is as shown in FIG. 13D, and the level at the signal output terminal 11 gradually approaches "L" level, as shown in a region (d) of FIG. 14.

In the conventional circuit, the output is changed from "H" to "L" level in the region (d) by an n-channel MOS transistor having a large dimension corresponding to a sum of the dimensions of the n-channel MOS transistors N1 and N2. Therefore, in the conventional circuit, the through rate of the output waveform in the region (d) is increased to generate large undershooting. In contrast to this, in the circuit of this embodiment, since electric discharge is performed at the signal output terminal 11 only by the n-channel MOS transistor N1, the through rate of the output waveform becomes small, thereby suppressing undershoot noise.

The explanation for this embodiment applies to a case wherein the data signal DATA is changed from "L" to "H" level. However, a description for this case will be omitted since it largely overlaps with that for this embodiment.

In the circuit of FIG. 12, in the disable state the control signal is ENABLE and $\overline{\text{ENABLE}}$ and are at "L" and "H" levels, respectively, the p-channel MOS transistor P13 is turned on, the gate node of the p-channel MOS transistor P2 is set at the potential Vcc, the n-channel MOS transistor N23 is turned on, the gate node of the n-channel MOS transistor N2 is set at the potential Vss, which is the same as in the circuit of FIG. 10. Therefore, the p- and n-channel MOS transistors P2 and N2 are turned off regardless of the level of the data signal DATA, and the output node of the AC buffer 13 is set at the high-impedance state. In this disable state, the output node of the DC buffer 12 is also set at the high-impedance state, as a matter of course.

FIGS. 15 to 25 show modifications of the circuit shown in FIG. 10. These circuits basically perform the same operation as that of the circuit shown in FIG. 10 described above, and a detailed description thereof will thus be omitted. The circuit of the modification of FIG. 15 is the same as that of the embodiment of FIG. 10 except that in FIG. 15, the p- and n-channel MOS transistors P11 and N21 are omitted. Thus, the same reference numerals are used to denote the same portions as in FIG. 10.

The circuit of the modification of FIG. 16 is the same as that of the embodiment of FIG. 10 except for the following respects: that is, in FIG. 16, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 10.

The circuit of the modification of FIG. 17 is the same as that of the circuit of the embodiment of FIG. 10 except for the following respects: that is, in FIG. 17, the p- and n-channel MOS transistors P11 and N21 are omitted, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 10.

The circuit of the modification of FIG. 18 is the same as that of the embodiment of FIG. 10 except for the following respects: that is, in FIG. 18, the gate of the p-channel MOS transistor P12 is connected to the gate node of the p-channel MOS transistor P2, and the gate of the n-channel MOS transistor N22 is connected to the gate node of the n-channel MOS transistor N2. Thus, the same reference numerals are used to denote the same portions as in FIG. 10.

Figure 19:
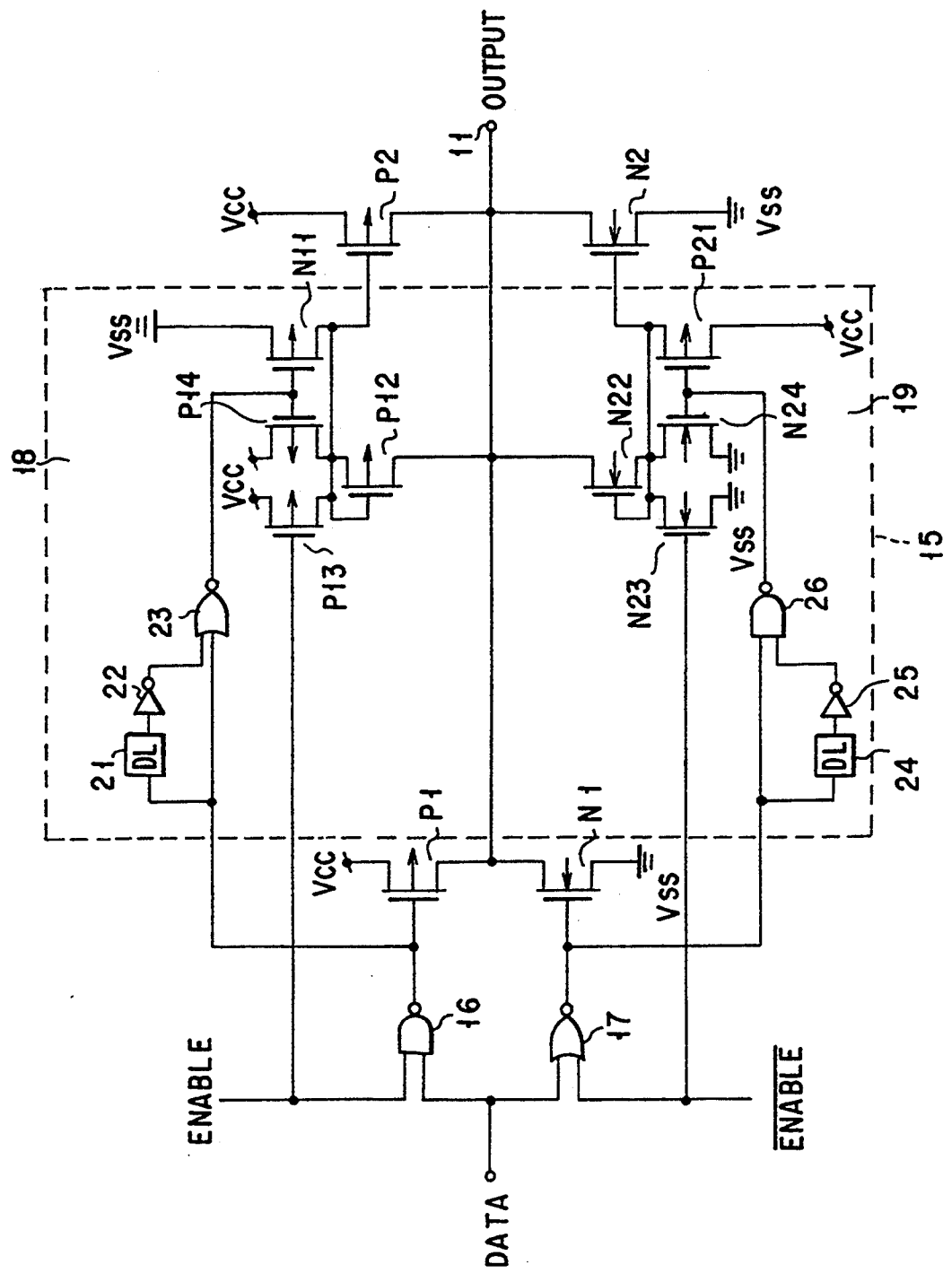
FIG. 19 is a circuit diagram showing still another modification of FIG. 10.

The circuit of the modification of FIG. 19 is the same as that of the embodiment of FIG. 10 except for the following respects: that is, in FIG. 19, the p- and n-channel MOS transistors P11 and N21 are omitted, the gate of the p-channel MOS transistor P12 is connected to the gate node of the p-channel MOS transistor P2, and the gate of the n-channel MOS transistor N22 is connected to the gate node of the n-channel MOS transistor N2. Thus, the same reference numerals are used to denote the same portions as in FIG. 10.

The circuit of the modification of FIG. 20 is the same as that of the embodiment of FIG. 10 except for the following respects: that is, in FIG. 20, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 10.

The circuit of the modification of FIG. 21 is the same as that of the embodiment of FIG. 10 except for the following respects: that is, in FIG. 21, the p- and n-channel MOS transistors P11 and N21 are omitted, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 10.

The circuit of the modification of FIG. 22 is the same as that of the embodiment of FIG. 10 except for the following respects: that is, in FIG. 22, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 10.

Figure 23:
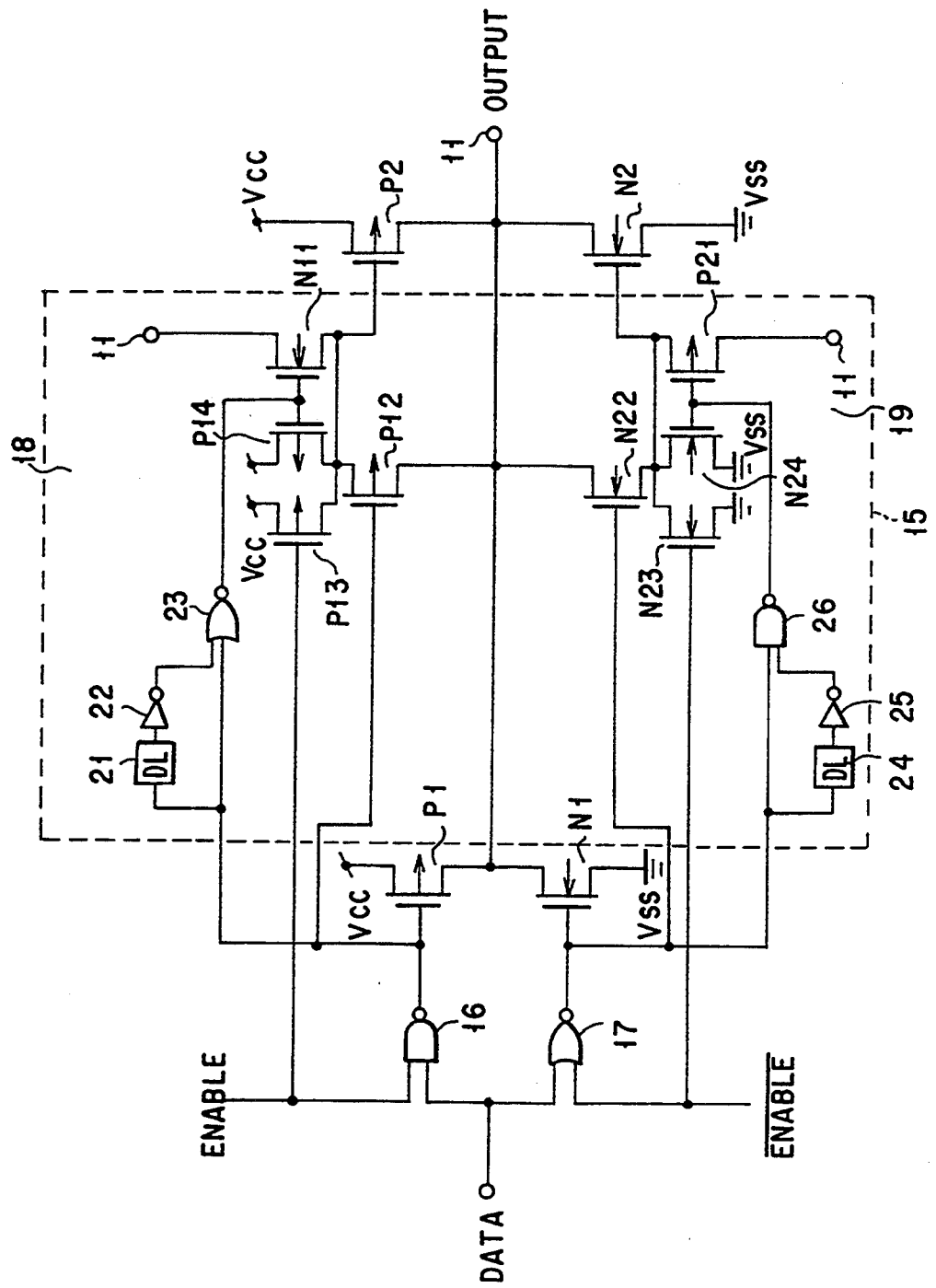
FIG. 23 is a circuit diagram showing still another modification of FIG. 10.

The circuit of the modification of FIG. 23 is the same as that of the embodiment of FIG. 10 except for the following respects: that is, in FIG. 23, the p- and n-channel MOS transistors P11 and N21 are omitted, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 10.

Figure 24:
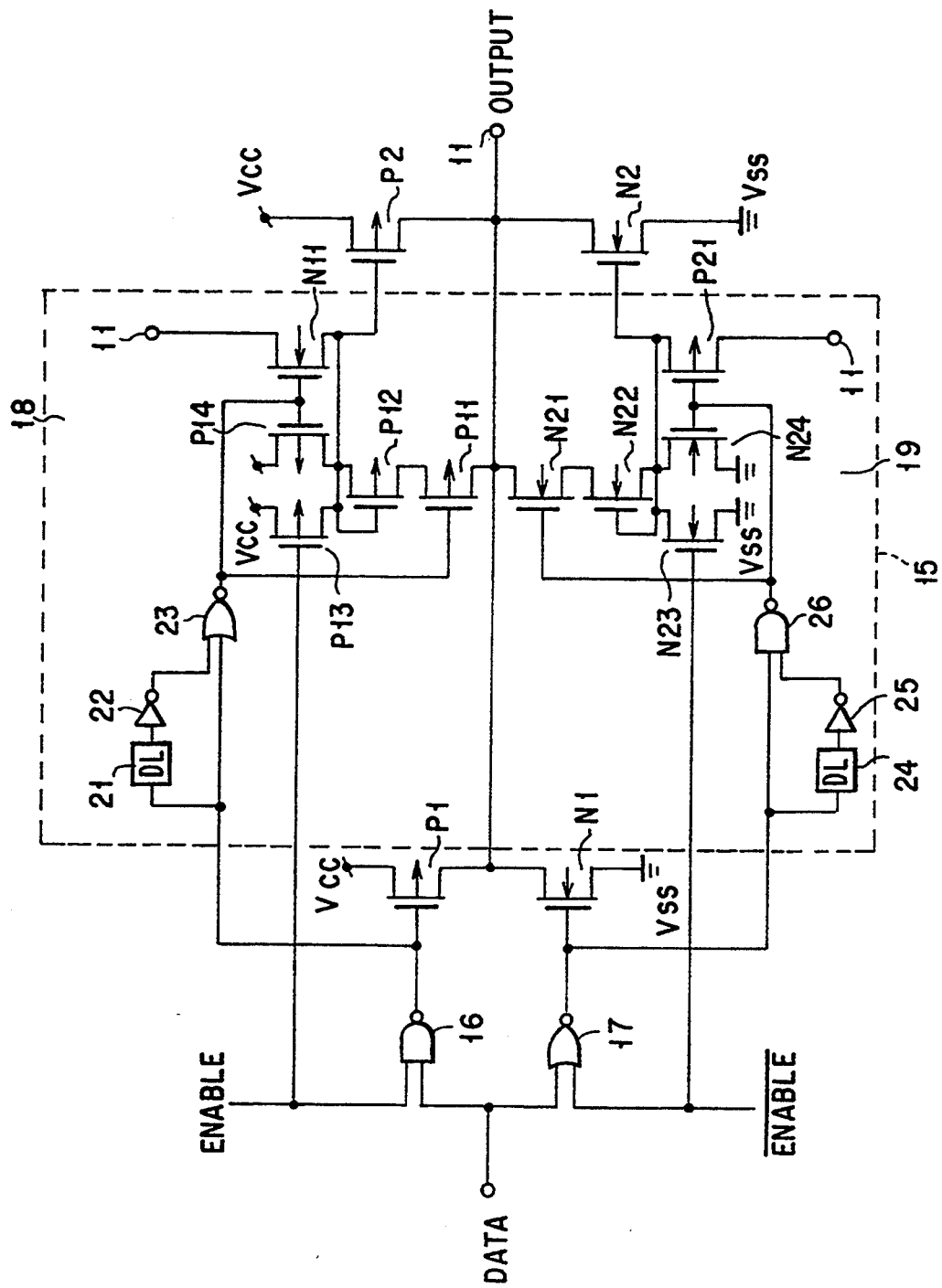
FIG. 24 is a circuit diagram showing still another modification of FIG. 10.

The circuit of the modification of FIG. 24 is the same as that of the embodiment of FIG. 10 except for the following respects: that is, in FIG. 24, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 10.

The circuit of the modification of FIG. 25 is the same as that of the embodiment of FIG. 10 except for the following respects: that is, in FIG. 25, the p- and n-channel MOS transistors P11 and N21 are omitted, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 10.

FIGS. 26 to 36 show modifications of the circuit shown in FIG. 12. These circuits basically perform the same operation as that of the circuit shown in FIG. 12 described above, and a detailed description thereof will thus be omitted.

The circuit of the modification of FIG. 26 is the same as that of the embodiment of FIG. 12 except that in FIG. 26, the p- and n-channel MOS transistors P11 and N21 are omitted. Thus, the same reference numerals are used to denote the same portions as in FIG. 12.

The circuit of the modification of FIG. 27 is the same as that of the embodiment of FIG. 12 except for the following respects: that is, in FIG. 27, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 12.

Figure 28:
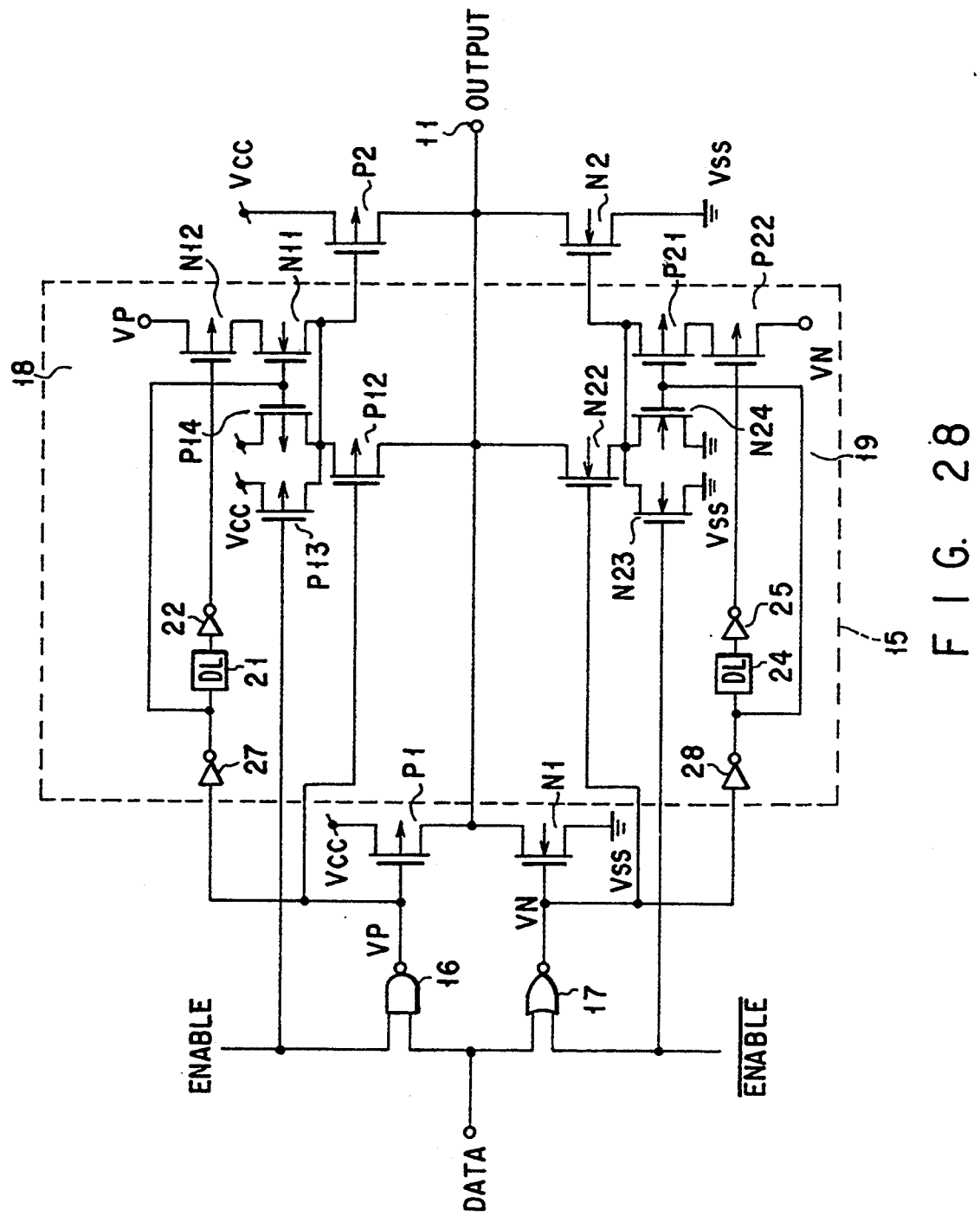
FIG. 28 is a circuit diagram showing still another modification of FIG. 12.

The circuit of the modification of FIG. 28 is the same as that of the embodiment of FIG. 12 except for the following respects: that is, in FIG. 28, the p- and n-channel MOS transistors P11 and N21 are omitted, the source of the n-channel MOS transistor Nil is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 12.

Figure 29:
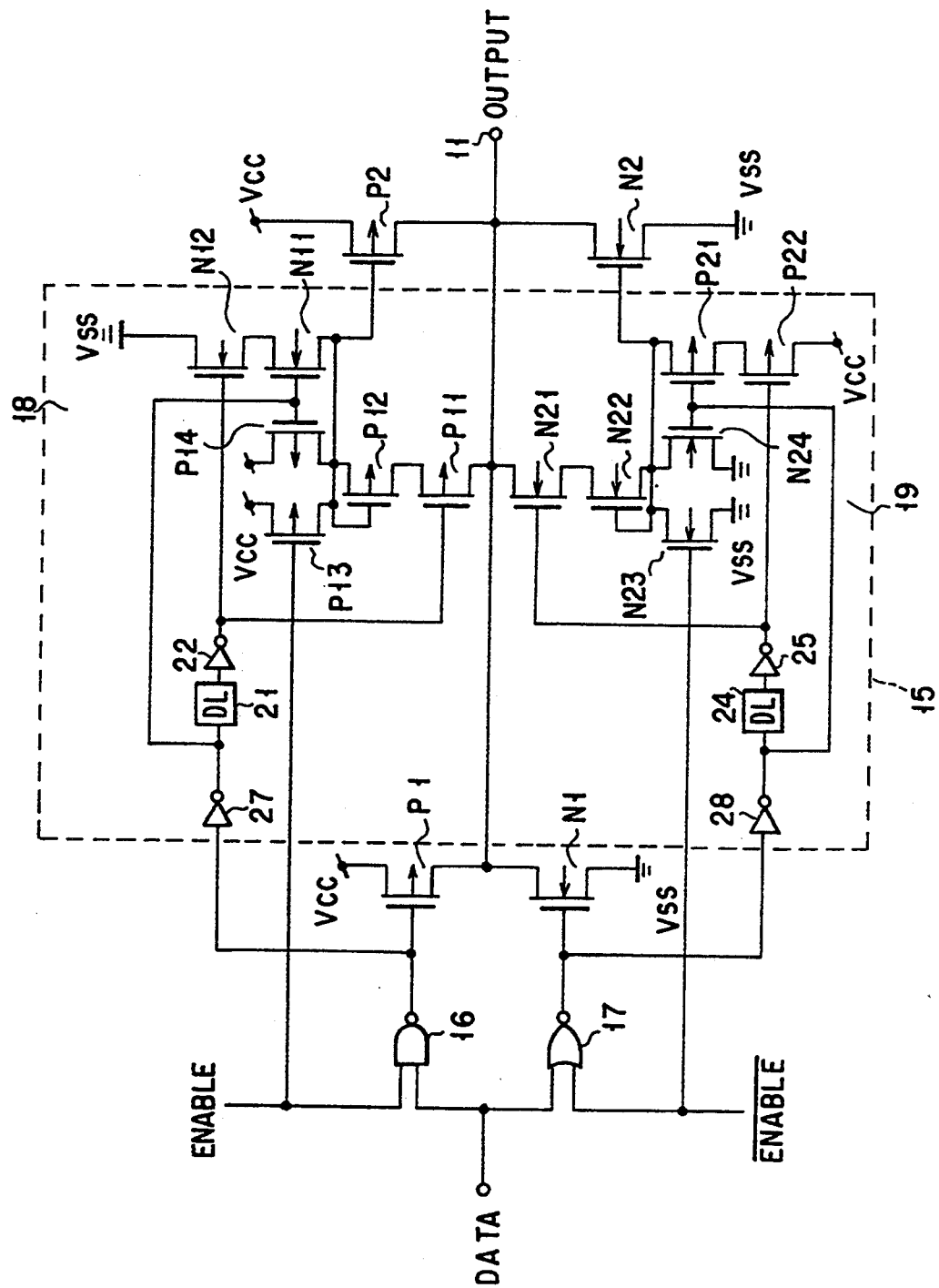
FIG. 29 is a circuit diagram showing still another modification of FIG. 12.

The circuit of the modification of FIG. 29 is the same as that of the embodiment of FIG. 12 except for the following respects: that is, in FIG. 29, the gate of the p-channel MOS transistor P12 is connected to the gate node of the p-channel MOS transistor P2, and the gate of the n-channel MOS transistor N22 is connected to the gate node of the n-channel MOS transistor N2. Thus, the same reference numerals are used to denote the same portions as in FIG. 12.

The circuit of the modification of FIG. 30 is the same as that of the embodiment of FIG. 12 except for the following respects: that is, in FIG. 30, the p- and n-channel MOS transistors P11 and N21 are omitted, the gate of the p-channel MOS transistor P12 is connected to the gate node of the p-channel MOS transistor P2, and the gate of the n-channel MOS transistor N22 is connected to the gate node of the n-channel MOS transistor N2. Thus, the same reference numerals are used to denote the same portions as in FIG. 12.

The circuit of the modification of FIG. 31 is the same as that of the embodiment of FIG. 12 except for the following respects: that is, in FIG. 31, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 17, in place of the power supply potential Vcc. Thus, the same reference numerals are used to denote the same portions as in FIG. 12.

The circuit of the modification of FIG. 32 is the same as that of the embodiment of FIG. 12 except for the following respects: that is, in FIG. 32, the p- and n-channel MOS transistors P11 and N21 are omitted, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to a signal VP as the output from the NAND gate 16, in place of the ground potential Vss, and the source of the p-channel MOS transistor P21 is connected to a signal VN as the output from the NOR gate 1, in place of the power supply potential Vcc. Thus, the same reference numerals are used to denote the same portions as in FIG. 12.

The circuit of the modification of FIG. 33 is the same as that of the embodiment of FIG. 12 except for the following respects: that is, in FIG. 33, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 12.

Figure 34:
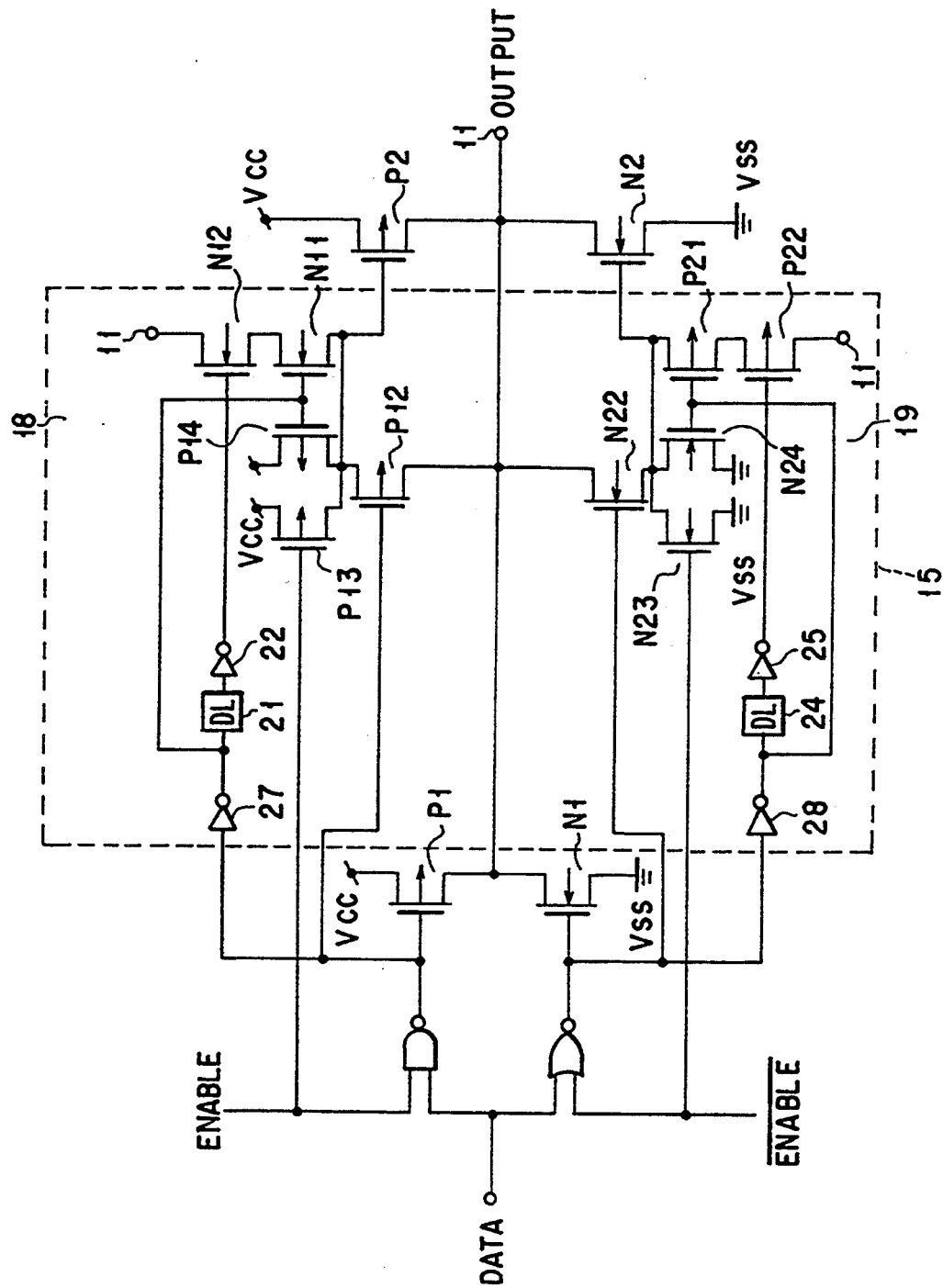
FIG. 34 is a circuit diagram showing still another modification of FIG. 12.

The circuit of the modification of FIG. 34 is the same as that of the embodiment of FIG. 12 except for the following respects: that is, in FIG. 34, the p- and n-channel MOS transistors P11 and N21 are omitted, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 12.

The circuit of the modification of FIG. 35 is the same as that of the embodiment of FIG. 12 except for the following respects: that is, in FIG. 35, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 12.

Figure 36:
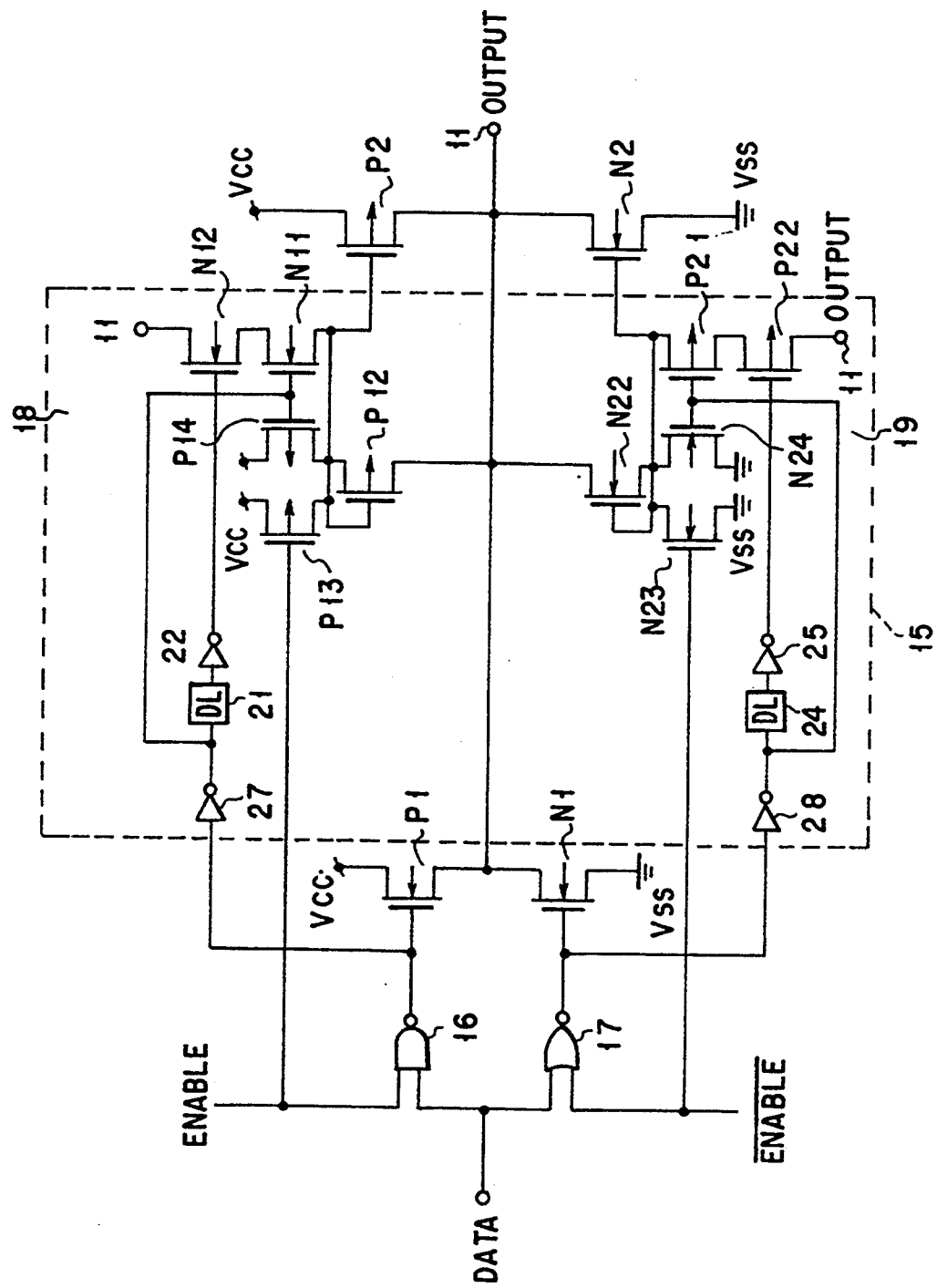
FIG. 36 is a circuit diagram showing still another modification of FIG. 12.

The circuit of the modification of FIG. 36 is the same as that of the embodiment of FIG. 12 except for the following respects: that is, in FIG. 36, the p- and n-channel MOS transistors P11 and N21 are omitted, the gate of the p-channel MOS transistor P12 is connected to the gate node of the p-channel MOS transistor P2, the gate of the n-channel MOS transistor N22 is connected to the gate node of the n-channel MOS transistor N2, the source of the n-channel MOS transistor N11 is connected to the signal output terminal 11, in place of the ground potential Vss, and the source of the p-channel MOS transistor P21 is connected to the signal output terminal 11, in place of the power supply potential Vcc. Thus, the same reference numerals are used to denote the same portions as in FIG. 12.

Figure 37:
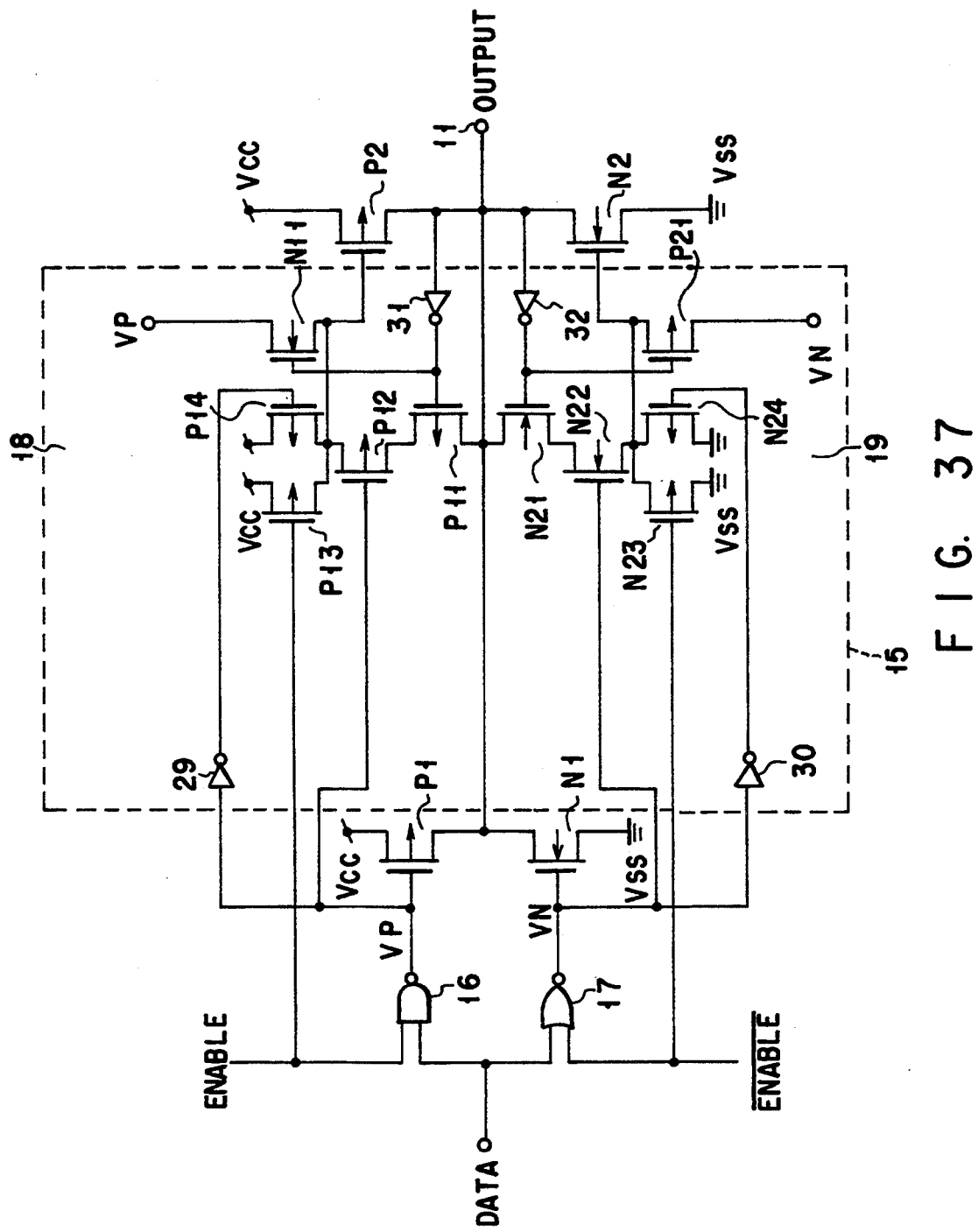
FIG. 37 is a circuit diagram of an output buffer circuit according to the third embodiment of the present invention.

FIG. 37 is a circuit diagram showing the configuration of a signal output circuit according to the third embodiment of the present invention in detail. In the circuit of this embodiment, in an AC buffer control circuit 15, p-channel MOS transistors P11 to P14 and P21 and n-channel MOS transistors N11 and N21 to N24 are provided, and inverters 29 to 32 are provided in place of the signal delay circuits 21 and 24, the inverters 22 and 25, and the NOR gates 23 and 26 of the circuit of the embodiment of FIG. 10. In this case, the source of the n-channel MOS transistor N11 is connected to an output VP from a NAND gate 16, and the source of the p-channel MOS transistor P21 is connected to an output VN from a NOR gate 17, in the same manner as in FIG. 16.

The output from the NAND gate 16 is supplied to the inverter 29, and the output from the inverter 29 is supplied to the gate of the p-channel MOS transistor P14. The output from the NOR gate 17 is supplied to the inverter 30, and the output from the inverter 30 is supplied to the gate of the n-channel MOS transistor N24. A signal OUTPUT at the signal output terminal 11 is supplied to the inverter 31, and the output from the inverter 31 is supplied to the gates of the MOS transistors P11 and N11. The signal OUTPUT from the signal output terminal 11 is also supplied to the inverter 32, and the output from the inverter 32 is supplied to the gates of the MOS transistors N21 and P21. The output from the NAND gate 16 and a control signal ENABLE are supplied to the gates of the MOS transistors P12 and P13, respectively, and the output from the NOR gate 17 and a control signal $\overline{\text{ENABLE}}$ are supplied to the gates of the MOS transistors N22 and N23, respectively, in the same manner as in FIG. 16.

In the circuit of FIG. 10 of the first embodiment, the MOS transistors P11, N11, N21, and P21 are controlled on the basis of the data signal DATA. In contrast to this, in the circuit FIG. 37 of the third embodiment, these MOS transistors are controlled by using the signal at the signal output terminal 11.

FIGS. 38 to 46 show modifications of FIG. 37.

Figure 38:
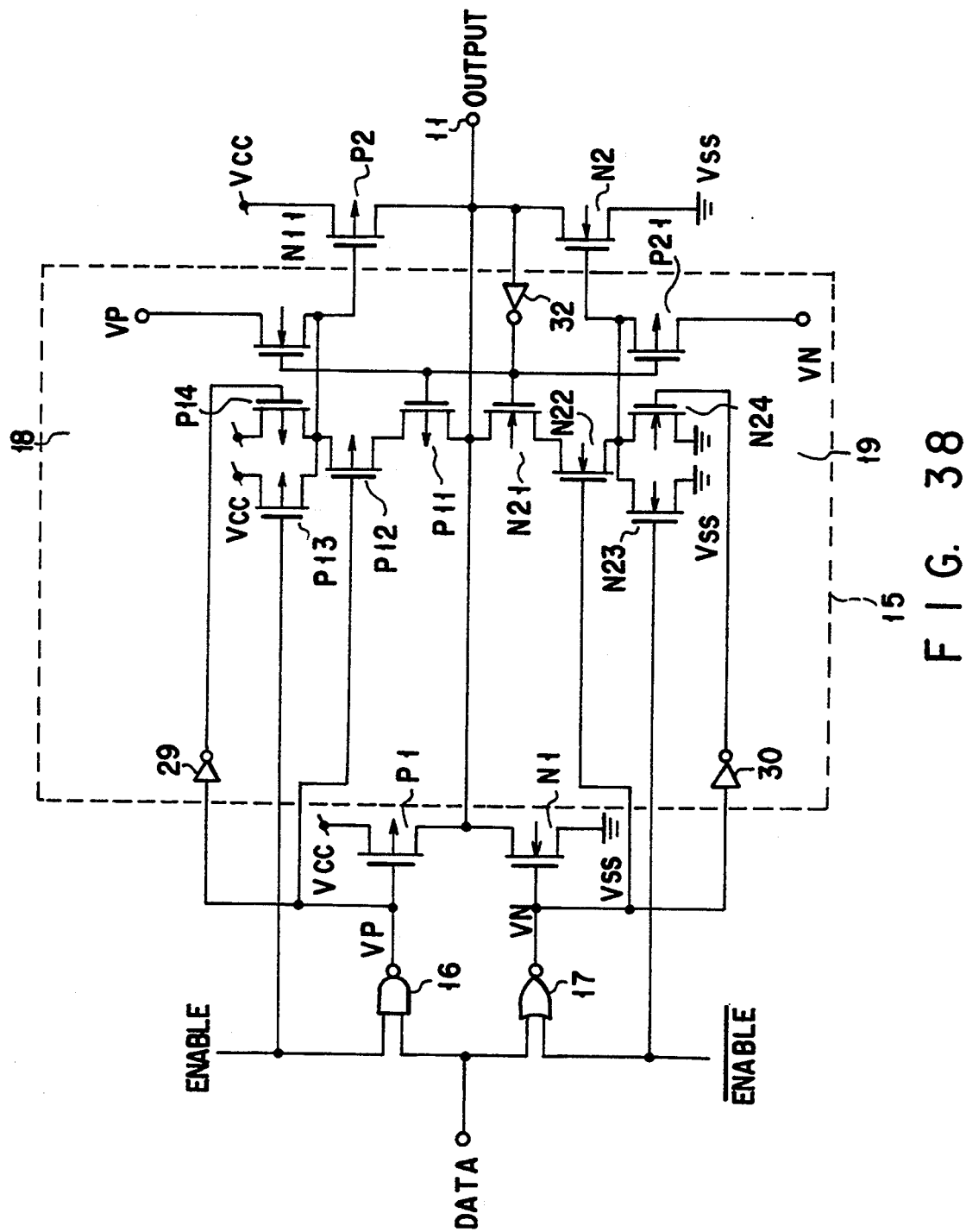
FIG. 38 is a circuit diagram showing a modification of FIG. 37.

In the circuit of the modification of FIG. 38, of the two inverters 31 and 32, only the inverter 32 is provided, and the output from the inverter 32 is also supplied to the gates of the MOS transistors P11 and N11.

In the circuit of the modification of FIG. 39, the source-drain path of an n-channel MOS transistor N12 is connected between the source of the n-channel MOS transistor N11 and the ground potential Vss, the output from the inverter 29 is supplied to the gate of the MOS transistor N12, and the source-drain path of a p-channel MOS transistor P22 is connected between the source of the p-channel MOS transistor P21 and the power supply potential Vcc, and the output from the inverter 30 is supplied to the gate of the MOS transistor P22.

In the circuit of the modification of FIG. 40, of the two inverters 31 an 32, only the inverter 32 is provided, the output from the inverter 32 is supplied to the gates of the MOS transistors P11 and N11, the source-drain path of the n-channel MOS transistor N12 is connected between the source of the n-channel MOS transistor N11 and the ground potential Vss, the output from the inverter 29 is supplied to the gate of the n-channel MOS transistor N12, the source-drain path of the p-channel MOS transistor P22 is connected between the source of the p-channel MOS transistor P21 and the power supply potential Vcc, and the output from the inverter 30 is supplied to the gate of the MOS transistor P22.

Figure 41:
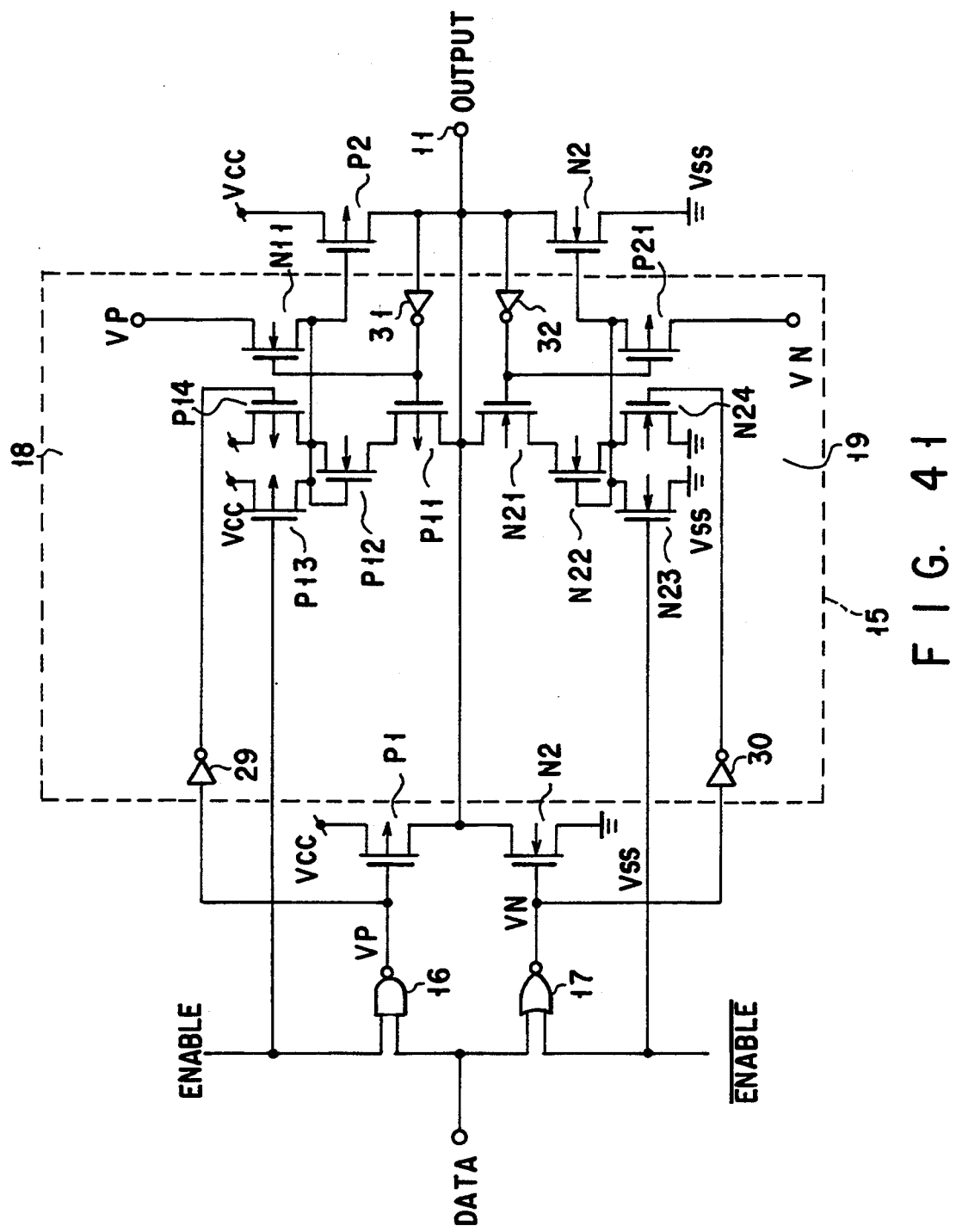
FIG. 41 is a circuit diagram showing still another modification of FIG. 37.

In the circuit of the modification of FIG. 41, the gate of the p-channel MOS transistor P12 is connected to the gate node of a p-channel MOS transistor P2, and the gate of the n-channel MOS transistor N22 is connected to the gate node of the n-channel MOS transistor N2.

In the circuit of the modification of FIG. 42, of the two inverters 31 and 32, only the inverter 32 is provided, the output of the inverter 32 is supplied to the gates of the MOS transistors P11 and N11, the gate of the p-channel MOS transistor P12 is connected to the gate node of the p-channel MOS transistor P2, and the gate of the n-channel MOS transistor N22 is connected to the gate node of the n-channel MOS transistor N2.

In the circuit of the modification of FIG. 43, the source-drain path of the n-channel MOS transistor N12 is connected between the source of the n-channel MOS transistor N11 and the ground potential Vss, the output from the inverter 29 is supplied to the gate of the n-channel MOS transistor N12, the source-drain path of the p-channel MOS transistor P22 is connected between the source of the p-channel MOS transistor P21 and the power supply potential Vcc, the output from the inverter 30 is supplied to the gate of the MOS transistor P22, the gate of the p-channel MOS transistor P12 is connected to the gate node of the p-channel MOS transistor P2, and the gate of the n-channel MOS transistor N22 is connected to the gate node of the n-channel MOS transistor N2.

In the circuit of the modification of FIG. 44, of the two inverters 31 and 32 of FIG. 43, only the inverter 32 is provided, and the output of the inverter 32 is also supplied to the gates of the MOS transistors P11 and N11.

Figure 45:
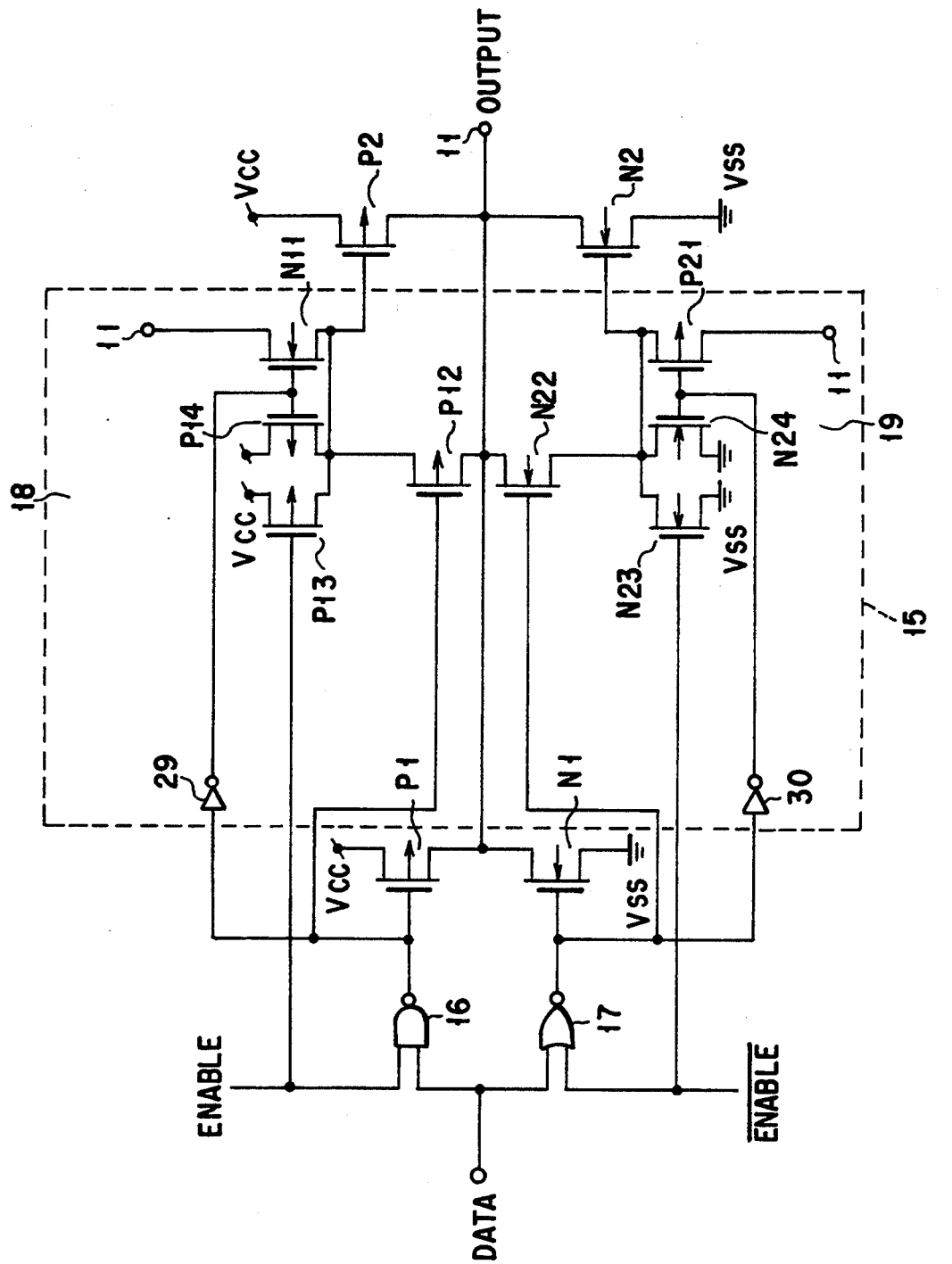
FIG. 45 is a circuit diagram showing still another modification of FIG. 37.

In the circuit of the modification of FIG. 45, the two inverters 31 and 32 and the p- and n-channel MOS transistors P11 and N21 are omitted, the sources of the n- and p-channel MOS transistors N11 and P21 are connected to the signal output terminal 11, and the outputs of the inverters 29 and 30 are supplied to the gates of the n- and p-channel MOS transistors N11 and P21, respectively.

In the circuit of the modification of FIG. 46, the gates of the p- and n-channel MOS transistors P12 and N22 of FIG. 45 are connected to the gate nodes of the p- and n-channel MOS transistors P2 and N2, respectively.

In the embodiments described above, the AC buffer 13 comprises a MOS transistor. However, the AC buffer 13 can comprise a bipolar transistor. That is, in the circuit of the fourth embodiment of FIG. 47, the emitter-collector path of a pnp transistor Q21 is connected between a power supply potential Vcc and a signal output terminal 11, the emitter-collector path of an npn transistor Q22 is connected between the signal output terminal 11 and a ground potential Vss, the output from a p-channel AC buffer control circuit 18 is supplied to the base of the pnp transistor Q21, and the output from an n-channel AC buffer control circuit 19 is supplied to the base of the npn transistor Q22. Alternatively, only a pnp transistor Q21 can be provided, as in the circuit of the fifth embodiment shown in FIG. 48, and only an npn transistor Q22 can be provided, as in the circuit of the sixth embodiment shown in FIG. 49.

As has been described above, according to the present invention, there is provided a signal output circuit which has an output resistance automatically determined from AC specifications when an output is changed and a relatively high output resistance determined only from DC specifications when the output is stationary, in which a variation in a power supply potential or a ground potential when the output is changed does not easily adversely affect an output node, and which can suppress output noise.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output buffer circuit comprising:

an output terminal;

a first output buffer having an output node connected to said output terminal, and an output resistance determined from DC specifications;

a second output buffer having an output node connected to said output terminal, and an output resistance determined from AC specifications when said second output buffer is driven with said first output buffer;

first control means having a first enable input line and a first data input line for controlling an operation of said first output buffer, said first control means driving said first output buffer according to a logic level of said first data input line when said first enable input line has a first logic level, and said first control means setting said first output buffer in a high-impedance state when said first enable input line has a second logic level opposite of said first logic level of said first enable input line; and second control means having a second enable input line for controlling an operation of a second output buffer, said second control means driving said second output buffer when an output at said output node of said first output buffer changes and when said second enable input line has a first logic level, said second control means maintaining said second output buffer in a high-impedance state when said second enable input line has a second logic level opposite of said first logic level of said second enable input line, and said second control means connecting said output node of said first output buffer to said second output buffer only through current paths of transistors.

2. A circuit according to claim 1, wherein said second output buffer comprises a MOS transistor.

3. A circuit according to claim 1, wherein said second output buffer comprises a p-channel MOS current-source transistor connected between a high-potential power supply and said output node of said first output buffer, and said second control means sets said current-source transistor in an ON state when said output at said output node of said first output buffer changes from a first logic level to a second logic level, said second control means connects a control electrode of said current-source transistor to said output node of said first output buffer when said output at said output node of said first output buffer is stationary at said second logic level, and said second control means connects said control electrode of said current-source transistor to said high-potential power supply when said output at said output node of said first output buffer changes from said second logic level to said first logic level.

4. A circuit according to claim 1, wherein said second output buffer comprises an n-channel MOS current-sink transistor connected between said output node of said first output buffer and a low-potential power supply, and said second control means sets said current-sink transistor in an ON state when said output at said output node of said first output buffer changes from a first logic level to a second logic level, said second control means connects a control electrode of said current-sink transistor to said output node of said first output buffer when said output at said output node of said first output buffer is stationary at said second logic level, and said second control means connects said control electrode of said current-sink transistor to said low-potential power supply when said output at said output node of said first output buffer changes from said second logic level to said first logic level.

5. A circuit according to claim 1, wherein said second output buffer comprises a p-channel MOS current-source transistor connected between a high-potential power supply and said output node of said first output buffer and an n-channel MOS current-sink transistor connected between said output node of said first output buffer and a low-potential power supply, and wherein said second control means sets said current-source transistor in an ON state and connects a control electrode of said current-sink transistor to said low-potential power supply when said output at said output node of said first output buffer changes from a first logic level to a second logic level, said second control means connects a control electrode of said current-source transistor to said output node of said first output buffer when said output at said output node of said first output buffer is stationary at said second logic level, and said second control means sets said current-sink transistor in an ON state and connects said control electrode of said current-source transistor to said high-potential power supply when said output at said output node of said first output buffer changes from said second logic level to said first logic level.

6. A circuit according to claim 3, wherein said second control means connects said control electrode of said current-source transistor to said low-potential power supply in order to set said current-source transistor in said ON state.

7. A circuit according to claim 3, wherein said second control means connects said control electrode of said current-source transistor to said output node of said first output buffer in order to set said current-source transistor in said ON state.

8. A circuit according to claim 3, wherein said second control means connects said control electrode of said current-source transistor to said output node of said first output buffer through a diode element when said output at said output node of said first output buffer is stationary at said second logic level.

9. A circuit according to claim 5, wherein said second control means has a first switching element connected between said high-potential power supply and said control electrode of said current-source transistor, a second switching element connected between said control electrode of said current-source transistor and said output node of said first output buffer, and a third switching element connected between said control electrode of said current-source transistor and one of said low potential power supply and said output node of said first output buffer, and said first, second, and third switching elements are controlled in accordance with a predetermined sequence.

10. A circuit according to claim 4, wherein said second control means connects said control electrode of said current-sink transistor to said high-potential power supply in order to set said current-sink transistor in said ON state.

11. A circuit according to claim 4, wherein said second control means connects said control electrode of said current-sink transistor to said output node of said first output buffer in order to set said current-sink transistor in said ON state.

12. A circuit according to claim 4, wherein said second control means connects said control electrode of said current-sink transistor to said output node of said first output buffer through a diode element when said output at said output node of said first output buffer is stationary at said second logic level.

13. A circuit according to claim 9, wherein said second control means has a fourth switching element connected between said control electrode of said current-sink transistor and said low-potential power supply, a fifth switching element connected between said control electrode of said current-sink transistor and said output node of said first output buffer, and a sixth switching element connected between said control electrode of said current-sink transistor and one of said high-potential power supply and said output node of said first output buffer.

14. A circuit according to claim 5, wherein said second control means connects said control electrode of said current-source transistor to said low-potential power supply in order to set said current-source transistor in said ON state.

15. A circuit according to claim 5, wherein said second control means connects said control electrode of said current-source transistor to said output node of said first output buffer in order to set said current-source transistor in said ON state.

16. A circuit according to claim 5, wherein said second control means connects said control electrode of said current-source transistor to said output node of said first output buffer through a diode element when said output at said output node of said first output buffer is stationary at said second logic level.

17. A circuit according to claim 5, wherein said second control means connects said control electrode of said current-sink transistor to said high-potential power supply in order to set said current-sink transistor in said ON state.

18. A circuit according to claim 5, wherein said second control means connects said control electrode of said current-sink transistor to said output node of said first output buffer in order to set said current-sink transistor in said ON state.

19. A circuit according to claim 1, wherein said second output buffer comprises a bipolar transistor.

20. A circuit according to claim 1, wherein said second output buffer comprises a pnp current-source transistor connected between a high-potential power supply and said output node of said first output buffer, and said second control means sets said current-source transistor in an ON state when said output at said output node of said first output buffer changes from a first logic level to a second logic level, said second control means connects a control electrode of said current-source transistor to said output node of said first output buffer when said output at said output node of said first output buffer is stationary at said second logic level, and said second control means connects said control electrode of said current-source transistor to said high-potential power supply when said output at said output node of said first output buffer changes from said second logic level to said first logic level.

21. A circuit according to claim 1, wherein said second output buffer comprises an npn current-sink transistor connected between said output node of said first output buffer and a low-potential power supply, and said second control means sets said current-sink transistor in an ON state when said output at said output node of said first output buffer changes from a first logic level to a second logic level, said second control means connects a control electrode of said current-sink transistor to said output node of said first output buffer when said output at said output node of said first output buffer is stationary at said second logic level, and said second control means connects said control electrode of said current-sink transistor to said low-potential power supply when said output at said output node of said first output buffer changes from said second logic level to said first logic level.

22. A circuit according to claim 1, wherein said second output buffer comprises a pnp current-source transistor connected between a high-potential power supply and said output node of said first output buffer and an npn current-sink transistor connected between said output node of said first output buffer and a low-potential power supply, and wherein said second control means sets said current-source transistor in an ON state and connects a control electrode of said current-sink transistor to said low-potential power supply when said output at said output node of said first output buffer changes from a first logic level to a second logic level, said second control means connects a control electrode of said current-source transistor to said output node of said first output buffer when said output at said output node of said first output buffer is stationary at said second logic level, and said second control means sets said current-sink transistor in an ON state and connects said control electrode of said current-source transistor to said high-potential power supply when said output at said output node of said first output buffer changes from said second logic level to said first logic level.

23. A circuit according to claim 20, wherein said second control means connects said control electrode of said current-source transistor to said low-potential power supply in order to set said current-source transistor in said ON state.

24. A circuit according to claim 20, wherein said second control means connects said control electrode of said current-source transistor to said output node of said first output buffer in order to set said current-source transistor in said ON state.

25. A circuit according to claim 20, wherein said second control means connects said control electrode of said current-source transistor to said output node of said first output buffer through a diode element when said output at said output node of said first output buffer is stationary at said second logic level.

26. A circuit according to claim 22, wherein said second control means has a first switching element connected between said high-potential power supply and said control electrode of said current-source transistor, a second switching element connected between said control electrode of said current-source transistor and said output node of said first output buffer, and a third switching element connected between said control electrode of said current-source transistor and one of said low potential power supply and said output node of said first output buffer, and said first, second, and third switching elements are controlled in accordance with a predetermined sequence.

27. A circuit according to claim 21, wherein said second control means connects said control electrode of said current-sink transistor to said high-potential power supply in order to set said current-sink transistor in said ON state.

28. A circuit according to claim 21, wherein said second control means connects said control electrode of said current-sink transistor to said output node of said first output buffer in order to set said current-sink transistor in said ON state.

29. A circuit according to claim 21, wherein said second control means connects said control electrode of said current-sink transistor to said output node of said first output buffer through a diode element when said output at said output node of said first output buffer is stationary at said second logic level.

30. A circuit according to claim 26, wherein said second control means has a fourth switching element connected between said control electrode of said current-sink transistor and said low-potential power supply, a fifth switching element connected between said control electrode of said current-sink transistor and said output node of said first output buffer, and a sixth switching element connected between said control electrode of said current-sink transistor and one of said high-potential power supply and said output node of said first output buffer.

31. A circuit according to claim 22, wherein said second control means connects said control electrode of said current-source transistor to said low-potential power supply in order to set said current-source transistor in said ON state.

32. A circuit according to claim 22, wherein said second control means connects said control electrode of said current-source transistor to said output node of said first output buffer in order to set said current-source transistor in said ON state.

33. A circuit according to claim 22, wherein said second control means connects said control electrode of said current-source transistor to said output node of said first output buffer through a diode element when said output at said output node of said first output buffer is stationary at said second logic level.

34. A circuit according to claim 22, wherein said second control means connects said control electrode of said current-sink transistor to said high-potential power supply in order to set said current-sink transistor in said ON state.

35. A circuit according to claim 22, wherein said second control means connects said control electrode of said current-sink transistor to said output node of said first output buffer in order to set said current-sink transistor in said ON state.

* * * * *